United States Patent
Kashima et al.

(10) Patent No.: US 10,950,751 B2
(45) Date of Patent: Mar. 16, 2021

(54) DEEP ULTRAVIOLET LED AND METHOD FOR MANUFACTURING THE SAME

(71) Applicants: MARUBUN CORPORATION, Tokyo (JP); TOSHIBA KIKAI KABUSHIKI KAISHA, Tokyo (JP); RIKEN, Saitama (JP); ULVAC, INC., Kanagawa (JP); TOKYO OHKA KOGYO CO., LTD., Kanagawa (JP)

(72) Inventors: Yukio Kashima, Tokyo (JP); Eriko Matsuura, Tokyo (JP); Mitsunori Kokubo, Shizuoka (JP); Takaharu Tashiro, Shizuoka (JP); Hideki Hirayama, Saitama (JP); Ryuichiro Kamimura, Shizuoka (JP); Yamato Osada, Shizuoka (JP); Toshiro Morita, Kanagawa (JP)

(73) Assignees: Marubun Corporation, Tokyo (JP); Toshiba Kikai Kabushiki Kaisha, Tokyo (JP); RIKEN, Saitama (JP); ULVAC, INC., Kanagawa (JP); Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 16/860,875

(22) Filed: Apr. 28, 2020

(65) Prior Publication Data
US 2020/0313041 A1    Oct. 1, 2020

Related U.S. Application Data

(62) Division of application No. 15/768,835, filed as application No. PCT/JP2016/075756 on Sep. 2, 2016, now Pat. No. 10,680,134.

(30) Foreign Application Priority Data

Sep. 3, 2015 (JP) .................. 2015-173834
Nov. 6, 2015 (JP) .................. 2015-218532

(51) Int. Cl.
H01L 29/06 (2006.01)
H01L 33/10 (2010.01)
(Continued)

(52) U.S. Cl.
CPC .......... H01L 33/10 (2013.01); H01L 33/007 (2013.01); H01L 33/06 (2013.01); H01L 33/145 (2013.01);
(Continued)

(58) Field of Classification Search
CPC ....... H01L 33/10; H01L 33/007; H01L 33/06; H01L 33/145
See application file for complete search history.

(56) References Cited

U.S. PATENT DOCUMENTS 5,337,328 A    8/1994 Lang et al.
5,955,749 A    9/1999 Joannopoulos et al.
(Continued)

FOREIGN PATENT DOCUMENTS

CN    103354956    10/2013
DE    102009057780    6/2001
(Continued)

OTHER PUBLICATIONS

International search report and Written Opinion for the International application No. PCT/JP2015/071453, dated Sep. 29, 2015 (9 pages).
(Continued)

Primary Examiner — Samuel A Gebremariam
(74) Attorney, Agent, or Firm — Hamre, Schumann, Mueller & Larson, P.C.

(57) ABSTRACT

Provided is a deep ultraviolet LED with a design wavelength $\lambda$, including a reflecting electrode layer, an ultra-thin metal layer, and a p-type contact layer that are arranged in this order from a side opposite to a substrate; and a hemispherical lens bonded to a rear surface of the substrate on a side
(Continued)

1 Sapphire Substrate
2 AlN Buffer Layer
3 n-AlGaN Layer
4 Barrier Layer
5 Quantum Well Layer
6 Barrier Layer
7 Electron Blocking Layer
8 Transparent p-AlGaN Contact Layer
9 Ultrathin Ni Layer
10 Al Reflecting Electrode Layer
20a Sapphire Lens
100 Photonic Crystal Periodic Structure
101 Photonic Crystals (Holes)

US 10,950,751 B2

Page 2 of the p-type contact layer, the hemispherical lens being transparent to light with the wavelength λ. The refractive index of the hemispherical lens is greater than or equal to the average value of the refractive index of the substrate and the refractive index of air and is less than or equal to the refractive index of the substrate. The hemispherical lens has a radius that is greater than or equal to the radius of an inscribed circle of the substrate and is about equal to the radius of a circumscribed circle of the substrate.

1 Claim, 65 Drawing Sheets

(51) Int. Cl.
  H01L 33/00 (2010.01)
  H01L 33/06 (2010.01)
  H01L 33/14 (2010.01)
  H01L 33/20 (2010.01)
  H01L 33/58 (2010.01)
  H01L 33/32 (2010.01)
  H01L 33/40 (2010.01)

(52) U.S. Cl.
  CPC ............. *H01L 33/20* (2013.01); *H01L 33/58* (2013.01); *H01L 33/32* (2013.01); *H01L 33/405* (2013.01); *H01L 2933/0016* (2013.01); *H01L 2933/0058* (2013.01); *H01L 2933/0083* (2013.01)

(56) References Cited

U.S. PATENT DOCUMENTS

| | | |
|---|---|---|
| 7,520,742 B2 | 4/2009 | Motowaki et al. |
| 7,687,811 B2 | 3/2010 | Jang et al. |
| 7,872,280 B2 | 1/2011 | Nagai et al. |
| 8,405,103 B2 | 3/2013 | Lee et al. |
| 8,419,995 B2 | 4/2013 | Yoneda et al. |
| 8,703,837 B2 | 4/2014 | Kawaguchi |
| 9,005,502 B2 | 4/2015 | Chiba et al. |
| 9,073,102 B2 | 7/2015 | Yoshida |
| 9,263,649 B2 | 2/2016 | Koike et al. |
| 9,349,918 B2 | 5/2016 | Kashima et al. |
| 9,806,229 B2 | 10/2017 | Kashima et al. |
| 9,929,311 B2 | 3/2018 | Kashima et al. |
| 9,929,317 B2 | 3/2018 | Kashima et al. |
| 10,056,526 B2 | 8/2018 | Kashima et al. |
| 2002/0167013 A1 | 11/2002 | Iwasaki et al. |
| 2004/0016936 A1 | 1/2004 | Tanaka et al. |
| 2004/0113166 A1 | 6/2004 | Tadatomo et al. |
| 2004/0114652 A1 | 6/2004 | Yoshikawa |
| 2004/0206962 A1 | 10/2004 | Erchak et al. |
| 2004/0252509 A1 | 12/2004 | Lin |
| 2004/0264903 A1 | 12/2004 | Dridi et al. |
| 2006/0043400 A1 | 3/2006 | Erchak et al. |
| 2006/0255341 A1 | 11/2006 | Pinnington et al. |
| 2006/0284187 A1 | 12/2006 | Wierer et al. |
| 2006/0284190 A1 | 12/2006 | Zimmerman et al. |
| 2007/0081253 A1 | 4/2007 | Yamauchi |
| 2007/0121694 A1 | 5/2007 | Okamoto |
| 2007/0125995 A1 | 6/2007 | Weisbuch et al. |
| 2007/0177644 A1 | 8/2007 | Corzine |
| 2007/0257269 A1 | 11/2007 | Cho et al. |
| 2007/0267646 A1 | 11/2007 | Wierer et al. |
| 2008/0024053 A1 | 1/2008 | Fujimoto et al. |
| 2008/0061304 A1 | 3/2008 | Huang et al. |
| 2008/0080581 A1 | 4/2008 | Wierer et al. |
| 2008/0258160 A1 | 10/2008 | Do |
| 2009/0134425 A1 | 5/2009 | Nagai |
| 2009/0184334 A1 | 7/2009 | Lee et al. |
| 2010/0072501 A1 | 3/2010 | Wakai et al. |
| 2010/0140643 A1 | 6/2010 | Cho et al. |
| 2010/0219395 A1 | 9/2010 | Hirayama et al. |
| 2010/0237372 A1 | 9/2010 | Kim et al. |
| 2011/0062469 A1 | 3/2011 | Camras et al. |
| 2011/0068676 A1 | 3/2011 | Jeon et al. |
| 2011/0309326 A1 | 12/2011 | Gaska et al. |
| 2012/0027038 A1 | 2/2012 | Noda et al. |
| 2012/0112165 A1 | 5/2012 | Charlton et al. |
| 2012/0224147 A1 | 9/2012 | Tomiyama et al. |
| 2012/0228653 A1 | 9/2012 | Ishida et al. |
| 2012/0247950 A1 | 10/2012 | Kaida et al. |
| 2012/0261642 A1 | 10/2012 | Bergenek et al. |
| 2013/0009167 A1 | 1/2013 | Tan et al. |
| 2013/0026531 A1 | 1/2013 | Seo et al. |
| 2013/0037820 A1 | 2/2013 | Tsukihara et al. |
| 2013/0043499 A1 | 2/2013 | Ohta et al. |
| 2013/0043500 A1 | 2/2013 | Orita |
| 2013/0069034 A1 | 3/2013 | Hirayama |
| 2013/0146916 A1 | 6/2013 | Yamamoto et al. |
| 2013/0222770 A1 | 8/2013 | Tomiyama |
| 2013/0320301 A1 | 12/2013 | Seo et al. |
| 2013/0328013 A1 | 12/2013 | Inazu et al. |
| 2014/0057377 A1 | 2/2014 | Kamimura et al. |
| 2014/0084317 A1 | 3/2014 | Lee et al. |
| 2014/0151733 A1 | 6/2014 | Koike et al. |
| 2014/0167066 A1 | 6/2014 | Kashima et al. |
| 2015/0044417 A1 | 2/2015 | Koike |
| 2015/0214448 A1 | 7/2015 | Lee et al. |
| 2015/0280069 A1 | 10/2015 | Zhang et al. |
| 2015/0372190 A1 | 12/2015 | Hirayama |
| 2016/0042102 A1 | 2/2016 | Kashima et al. |
| 2016/0133785 A1 | 5/2016 | Kashima et al. |
| 2017/0358712 A1 | 12/2017 | Kashima et al. |

FOREIGN PATENT DOCUMENTS

| | | |
|---|---|---|
| EP | 1526583 | 4/2005 |
| EP | 2690650 | 1/2014 |
| EP | 2733752 | 5/2014 |
| EP | 2827361 | 1/2015 |
| EP | 2942818 | 11/2015 |
| JP | 2002305328 | 10/2002 |
| JP | 2007109689 | 4/2004 |
| JP | 2004200209 | 7/2004 |
| JP | 2005012160 | 1/2005 |
| JP | 2006196658 | 7/2006 |
| JP | 2006276388 | 10/2006 |
| JP | 2006523953 | 10/2006 |
| JP | 2007036186 | 2/2007 |
| JP | 2007294789 | 11/2007 |
| JP | 2007305998 | 11/2007 |
| JP | 2008030235 | 2/2008 |
| JP | 2008053425 | 3/2008 |
| JP | 2008098526 | 4/2008 |
| JP | 2008117922 | 5/2008 |
| JP | 2008538658 | 10/2008 |
| JP | 2008311317 | 12/2008 |
| JP | 2009033180 | 2/2009 |
| JP | 4329374 | 9/2009 |
| JP | 2009267263 | 11/2009 |
| JP | 2010074008 | 4/2010 |
| JP | 2010074090 | 4/2010 |
| JP | 2010135798 | 6/2010 |
| JP | 200981469 | 10/2010 |
| JP | 4610863 | 1/2011 |
| JP | 2011086853 | 4/2011 |
| JP | 2011228513 | 11/2011 |
| JP | 1839687 B | 12/2011 |
| JP | 2012186414 | 9/2012 |
| JP | 2013009002 | 1/2013 |
| JP | 2013120829 | 6/2013 |
| JP | 2013530537 | 7/2013 |
| JP | 5315513 | 10/2013 |
| JP | 2014068010 | 4/2014 |
| JP | 201541763 | 3/2015 |
| JP | 2015-130386 | 7/2015 |
| JP | 5757512 | 7/2015 |
| JP | 2015195388 | 11/2015 |
| KR | 20090001903 | 1/2009 |
| KR | 20110131212 | 12/2011 |
| KR | 10-2012-0082898 | 7/2012 |

(56) References Cited

FOREIGN PATENT DOCUMENTS

| | | |
|---|---|---|
| KR | 20120117892 | 10/2012 |
| KR | 20130055015 | 5/2013 |
| KR | 20140133607 | 11/2014 |
| KR | 10-2015-0082264 | 7/2015 |
| TW | 201535782 | 9/2015 |
| WO | 2008041161 | 4/2008 |
| WO | 2009148138 | 12/2009 |
| WO | 2011/026033 | 3/2011 |
| WO | 2011049018 | 4/2011 |
| WO | 2011104969 | 9/2011 |
| WO | 2011159993 | 12/2011 |
| WO | 2012067080 | 5/2012 |
| WO | 2012127660 | 9/2012 |
| WO | 2013008556 | 1/2013 |
| WO | 2013132993 | 9/2013 |
| WO | 2013/152231 | 10/2013 |
| WO | 2014154047 | 10/2014 |
| WO | 2015008776 | 1/2015 |
| WO | 2013137176 | 8/2015 |
| WO | 2015133000 | 9/2015 |
| WO | 2016113935 | 7/2016 |

OTHER PUBLICATIONS

Hirayama et al.: "Recent progress and future prospects of ALgaN-based high-efficiency deep-ultraviolet light-emitting diodes"; Japanese Journal of Applied Physics, vol. 53, 2014, pp. 1-10.
Shinji Matsui: "Current Nano-imprint processing technologies"; Monthly Display, 2005, vol. 11, No. 5, pp. 82-89 (partial English translation).
Nakamatsu et al.: "Bilayer Resist Method for Room-Temperature Nanoimprint Lithography"; Japanese Journal of Applied Physics, 2004, vol. 43, No. 6B, pp. 4050-4053.
Korean Office Action for Korean application No. 2015-7005308, dated Oct. 21, 2015 (6 pages).
Extended European Search Report issued in the European Patent Application No. 14841324.8 dated Oct. 23, 2015 (6 pages).
International search report for International application No. PCT/JP2014/068864 dated Sep. 9, 2014 (4 pages).
Office Action dated Jun. 1, 2015 in Korean Application No. 2015-7005308 (6 pages).
T. Nakashima et al.: "Improvment of the light extraction efficiency in 350-nm-emission UV-LED," Proceedings of the [[6]]60th Lecture Presentation in Spring of the Japan Society of Applied Physics, 2013, 29p-G21-10, 2 pages total (English translation provided).
Chinese Office Action dated Dec. 19, 2016 for Chinese Patent Application Serial No. 201480002228.2, 3 pages.
Delbeke et al.: "Rigorous electromagnetic analysis of dipole in periodically corrugated layers: the grating-assisted resonant-cavity light-emitting diode." J. Opt. Soc. AM. A, 2002, vol. 64, No. 19, No. 5, pp. 871-880.
Gourley et al.: "Optical properties of two-dimensional photonic lattices fabricated as honeycomb nanostructures in compound semiconductors," Applied Physics Letters, 1994, vol. 64, No. 6, pp. 687-689.
Xie et al.: "Optimization design and fabrication of photonic crystal waveguides based on SOI using 248nm deep UV lithography," Proceedings of SPIE, 2004, vol. 5280, pp. 798-804.
Japan Society for the Promotion of Science: "Wide-gap semiconductor/electronic device, No. 162 committee"; The 74th Workshop Document: Development of DUVLED by UV Craftory, Co., Ltd., dated Apr. 22, 2011.
Japanese Office Action for Japanese Application No. 2015-559356, dated Apr. 26, 2016. (5 pages).
International Search Report issued in Japanese Application No. PCT/JP2015/084461 dated Jan. 12, 2016 (10 pages).
Choi et al.: "Design of an LED Chip Structure with an Integrated Two-dimensional Photonic Crystal to Enhance the light-extraction Efficiency"; Journal of Korean Physical Society, 2014, vol. 94, No. 10, pp. 1425-1429.
Lai et al.: "Directional light extraction enhancement from GaN-based film-transferred photonic crystal light-emitting diodes"; Applied Physics Letters, 2009, vol. 64, pp. 123106-1 to 123106-3 (4 pages).
Orita et al.: "High-Extraction-Efficiency blue Light-Emitting Diode using Extended-Pitch Photonic Crystal"; 2004, vol. 43, No. 8B, pp. 5809-5813.
Ding et al.: "Improving the Vertical light-Extraction Efficiency of GaN-Based Thin-Film Flip-Chip LED's With p-slide Deep-Hole Photonic Crystals"; Journal of Display Technology, 2014, vol. 10, No. 11, pp. 909-916.
Kashima et al.: "The micro machining process technology of nano imprint and dry etcing to improve the efficiency of notride LED"; IEICE Technical Report, 2014, vol. 114, No. 336, pp. 27-32.
International Search Report issued in corresponding International Application No. PCT/JP2016/082397 (3 pages).
International Search Report issued in corresponding International Application No. PCT/JP2016/075756 (3 pages).
Supplementary European Search Report issued in European Application No. 16861100.2 dated Jul. 17, 2017 (12 pages).
CREST Research Area of the Strategic Basic Research Programs: "Light/Photon Science and Technology toward Creation of New Function," Report of Termination of Research for Research Subject: "Research of 230-350mm Band in AlGaN-based Deep Ultraviolet High-Efficiency Light Emitting Device," Research period: Oct. 2007 to Mar. 2013, 53 pages total (Partial EnglishTranslation provided).
Additional Translation to the Non Patent Literature: CREST: "Light/Photon Science and Technology toward Creation of New Function,", Report of Termination of Research for Research Subject: "Research of 230-350mm Band in AlGaN-based Deep Ultraviolet High-Efficiency Light Emitting Device, " Research period: Oct. 2007 to Mar. 2013, 2 pages.
Ichikawa et al.: "High Output Power Deep Ultraviolet LEDs"; The Japan Society of Applied Physics, English translation provided, 3 pages.
Taiwan Office Action issued in Taiwan Application No. 105128384 dated Apr. 11, 2018 (5 pages).
European Search Report issued in European Application No. 15877887.8 dated Apr. 19, 2018 (4 pages).
Korean Office Action, issued in the Korean patent application No. 10-2018-7005503, dated Jan. 28, 2019, 16 pages including machine translation.
Office Action issued in European Patent Application No. 15877887.8, dated Mar. 8, 2019, 13 pages.
Office Action issued in Japanese Patent Application No. 2017-508579, dated May 9, 2017, 4 pages.
Office Action issued in Chinese Patent Application No. 201680051208.3, dated Nov. 4, 2019, 18 pages.

1 Sapphire Substrate
2 AlN Buffer Layer
3 n-AlGaN Layer
4 Barrier Layer
5 Quantum Well Layer
6 Barrier Layer
7 Electron Blocking Layer
8 Transparent p-AlGaN Contact Layer
9 Ultrathin Ni Layer
10 Al (Highly) Reflecting Electrode Layer 1 Sapphire Substrate
2 AlN Buffer Layer
3 n-AlGaN Layer
4 Barrier Layer
5 Quantum Well Layer
6 Barrier Layer
7 Electron Blocking Layer
8 Transparent p-AlGaN Contact Layer
9 Ultrathin Ni Layer
10 Al Reflecting Electrode Layer
20a Sapphire Lens Fig. 2B
(a)
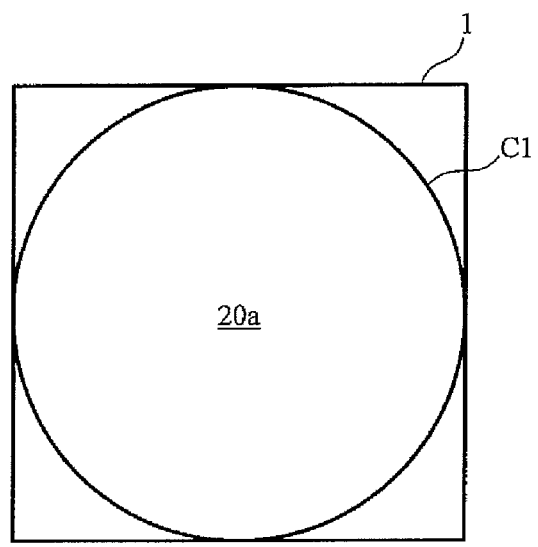
(b)
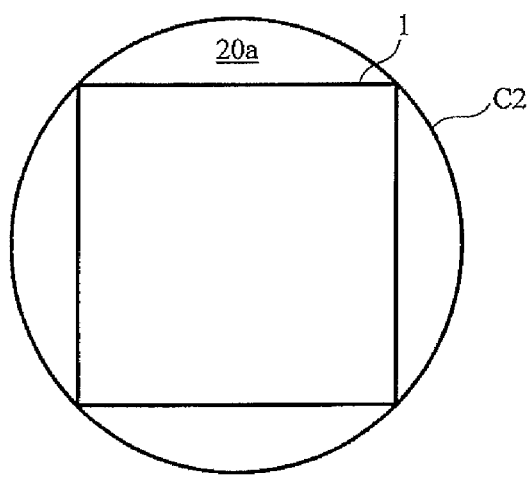

1  Sapphire Substrate
2  AlN Buffer Layer
3  n-AlGaN Layer
4  Barrier Layer
5  Quantum Well Layer
6  Barrier Layer
7  Electron Blocking Layer
8a p-AlGaN Layer
8b p-GaN Contact Layer
9a Ni Layer
10a Au Reflecting Electrode Layer 1 Sapphire Substrate
2 AlN Buffer Layer
3 n-AlGaN Layer
4 Barrier Layer
5 Quantum Well Layer
6 Barrier Layer
7 Electron Blocking Layer
8a p-AlGaN Layer
8b p-GaN Contact Layer
9a Ni Layer
10a Au Reflecting Electrode Layer
20a Sapphire Lens (a)

(b)

| Thickness of Substrate (μm) | 50 | 100 | 200 | 300 |
|---|---|---|---|---|
| pAlGaN_Sapphire Lens | 38.7% | 30.0% | 18.4% | 16.6% |
| pAlGaN | 17.6% | 17.4% | 17.3% | 16.5% |
| pGaN_Sapphire Lens | 17.6% | 13.7% | 6.7% | 6.3% |
| pGaN | 7.2% | 7.3% | 7.4% | 7.1% |

(a)

(b)

| Thickness of Substrate (μm) | 50 | 100 | 200 | 300 |
|---|---|---|---|---|
| pAlGaN_Sapphire Lens | 39.0% | 33.8% | 24.7% | 20.2% |
| pAlGaN | 17.6% | 17.4% | 17.3% | 16.5% |
| pGaN_Sapphire Lens | 17.7% | 15.6% | 10.7% | 8.3% |
| pGaN | 7.2% | 7.3% | 7.4% | 7.1% |

1 Sapphire Substrate
2 AlN Buffer Layer
3 n-AlGaN Layer
4 Barrier Layer
5 Quantum Well Layer
6 Barrier Layer
7 Electron Blocking Layer
8 Transparent p-AlGaN Contact Layer
9 Ultrathin Ni Layer
10 Al Reflecting Electrode Layer
20b Quartz Glass Lens 1 Sapphire Substrate
2 AlN Buffer Layer
3 n-AlGaN Layer
4 Barrier Layer
5 Quantum Well Layer
6 Barrier Layer
7 Electron Blocking Layer
8a p-AlGaN Layer
8b p-GaN Contact Layer
9a Ni Layer
10a Au Reflecting Electrode Layer
20b Quartz Glass Lens (a) Refractive Index Effect of Lens (Inscribed Circle)

(b)

| Thickness of Substrate (μm) | 50 | 100 | 200 | 300 |
|---|---|---|---|---|
| pAlGaN_Sapphire Lens | 38.7% | 30.0% | 18.4% | 16.6% |
| pAlGaN_Quartz Glass Lens | 30.1% | 30.2% | 20.7% | 18.1% |
| pGaN_Sapphire Lens | 17.6% | 13.7% | 6.7% | 6.3% |
| pGaN_Quartz Glass Lens | 13.7% | 13.9% | 9.1% | 7.3% |

(a) Refractive Index Effect of Lens (Circumscribed Circle)

(b)

| Thickness of Substrate (μm) | 50 | 100 | 200 | 300 |
|---|---|---|---|---|
| pAlGaN_Sapphire Lens | 39.0% | 33.8% | 24.7% | 20.2% |
| pAlGaN_Quartz Glass Lens | 29.6% | 29.7% | 24.9% | 21.7% |
| pGaN_Sapphire Lens | 17.7% | 15.6% | 10.7% | 8.3% |
| pGaN_Quartz Glass Lens | 13.6% | 13.7% | 11.4% | 9.8% |

1 Sapphire Substrate
2 AlN Buffer Layer
3 n-AlGaN Layer
4 Barrier Layer
5 Quantum Well Layer
6 Barrier Layer
7 Electron Blocking Layer
8 Transparent p-AlGaN Contact Layer
9 Ultrathin Ni Layer
10 Al Reflecting Electrode Layer
20b Quartz Glass Lens
100 Photonic Crystal Periodic Structure
101 Photonic Crystals (Holes)

1 Sapphire Substrate
2 AlN Buffer Layer
3 n-AlGaN Layer
4 Barrier Layer
5 Quantum Well Layer
6 Barrier Layer
7 Electron Blocking Layer
8 Transparent p-AlGaN Contact Layer
9 Ultrathin Ni Layer
10 Al Reflecting Electrode Layer
20b Quartz Glass Lens
100a Photonic Crystal Periodic Structure
101a Photonic Crystals (Holes)

1 Sapphire Substrate
2 AlN Buffer Layer
3 n-AlGaN Layer
4 Barrier Layer
5 Quantum Well Layer
6 Barrier Layer
7 Electron Blocking Layer
8 Transparent p-AlGaN Contact Layer
9 Ultrathin Ni Layer
10 Al Reflecting Electrode Layer
20a Sapphire Lens
100 Photonic Crystal Periodic Structure
101 Photonic Crystals (Holes)

(a)

Refractive Index Effect of Lens (Inscribed Circle)

(b)

| Thickness of Substrate (μm) | 50 | 60 | 100 | 160 | 200 | 300 |
|---|---|---|---|---|---|---|
| pAlGaN_Sapphire Lens | 38.7% | 37.3% | 30.0% | 20.2% | 18.4% | 16.6% |
| pAlGaN_Quartz Glass Lens | 30.1% | 30.1% | 30.2% | 24.7% | 20.7% | 18.1% |
| pGaN_Sapphire Lens | 17.6% | 17.2% | 13.7% | 7.8% | 6.7% | 6.3% |
| pGaN_Quartz Glass Lens | 13.7% | 13.8% | 13.9% | 11.2% | 9.1% | 7.3% |

(a) Refractive Index Effect of Lens (Circumscribed Circle)

(b)

| Thickness of Substrate (μm) | 50 | 60 | 100 | 160 | 200 | 300 |
|---|---|---|---|---|---|---|
| pAlGaN_Sapphire Lens | 39.0% | 37.8% | 33.8% | 28.3% | 24.7% | 20.2% |
| pAlGaN_Quartz Glass Lens | 29.6% | 29.7% | 29.7% | 27.0% | 24.9% | 21.7% |
| pGaN_Sapphire Lens | 17.7% | 17.3% | 15.6% | 12.8% | 10.7% | 8.3% |
| pGaN_Quartz Glass Lens | 13.6% | 13.5% | 13.7% | 12.5% | 11.4% | 9.8% |

(a)

(b)

| Solid Angle | 4.19 | 3.85 | 2.73 | 1.66 | 1.23 | 0.65 |
|---|---|---|---|---|---|---|
| pAlGaN_Sapphire Lens | 38.7% | 37.3% | 30.0% | 20.2% | 18.4% | 16.6% |
| pAlGaN_Quartz Glass Lens | 30.1% | 30.1% | 30.2% | 24.7% | 20.7% | 18.1% |
| pGaN_Sapphire Lens | 17.6% | 17.2% | 13.7% | 7.8% | 6.7% | 6.3% |
| pGaN_Quartz Glass Lens | 13.7% | 13.8% | 13.9% | 11.2% | 9.1% | 7.3% |

(a)

Refractive Index Effect of Lens (Circumscribed Circle)

(b)

| Solid Angle | 4.19 | 3.85 | 2.73 | 1.66 | 1.23 | 0.65 |
|---|---|---|---|---|---|---|
| pAlGaN_Sapphire Lens | 39.0% | 37.8% | 33.8% | 28.3% | 24.7% | 20.2% |
| pAlGaN_Quartz Glass Lens | 29.6% | 29.7% | 29.7% | 27.0% | 24.9% | 21.7% |
| pGaN_Sapphire Lens | 17.7% | 17.3% | 15.6% | 12.8% | 10.7% | 8.3% |
| pGaN_Quartz Glass Lens | 13.6% | 13.5% | 13.7% | 12.5% | 11.4% | 9.8% |

Fig. 19A (a) Rate of Change of Light Extraction Efficiency of LED Having Sapphire Lens Bonded Thereto (Inscribed Circle) and Having Photonic Crystals in its Transparent p-AlGaN Contact Layer

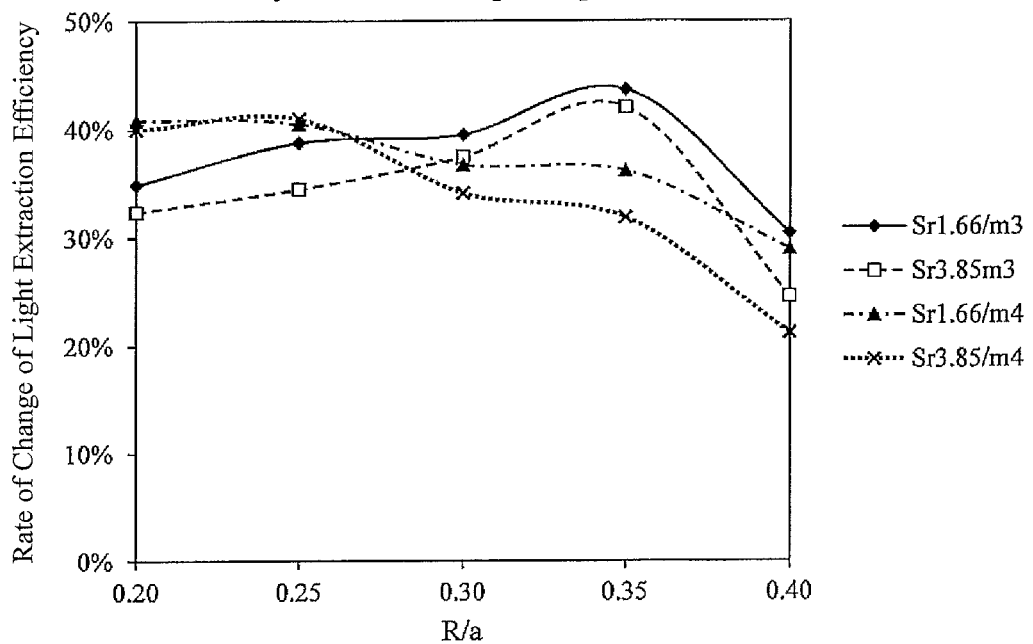

(b)

| Inscribed Circle | m3 | | | | m4 | | | |
|---|---|---|---|---|---|---|---|---|
| Solid Angle (Sr) | Total Output (Sr1.66) | Rate of Change | Total Output (Sr3.85) | Rate of Change | Total Output (Sr1.66) | Rate of Change | Total Output (Sr3.85) | Rate of Change |
| Flat | 1.39E-15 | | 1.57E-15 | | 1.39E-15 | | 1.57E-15 | |
| R/a0.20 | 1.87E-15 | 35% | 2.08E-15 | 32% | 1.96E-15 | 41% | 2.20E-15 | 40% |
| R/a0.25 | 1.93E-15 | 39% | 2.11E-15 | 35% | 1.95E-15 | 41% | 2.22E-15 | 41% |
| R/a0.30 | 1.94E-15 | 40% | 2.16E-15 | 37% | 1.90E-15 | 37% | 2.11E-15 | 34% |
| R/a0.35 | 2.00E-15 | 44% | 2.23E-15 | 42% | 1.89E-15 | 36% | 2.07E-15 | 32% |
| R/a0.40 | 1.81E-15 | 30% | 1.96E-15 | 25% | 1.79E-15 | 29% | 1.90E-15 | 21% |

Fig. 19B (a) Rate of Change of Light Extraction Efficiency of LED Having Sapphire Lens Bonded Thereto (Circumscribed Circle) and Having Photonic Crystals in its Transparent p-AlGaN Contact Layer

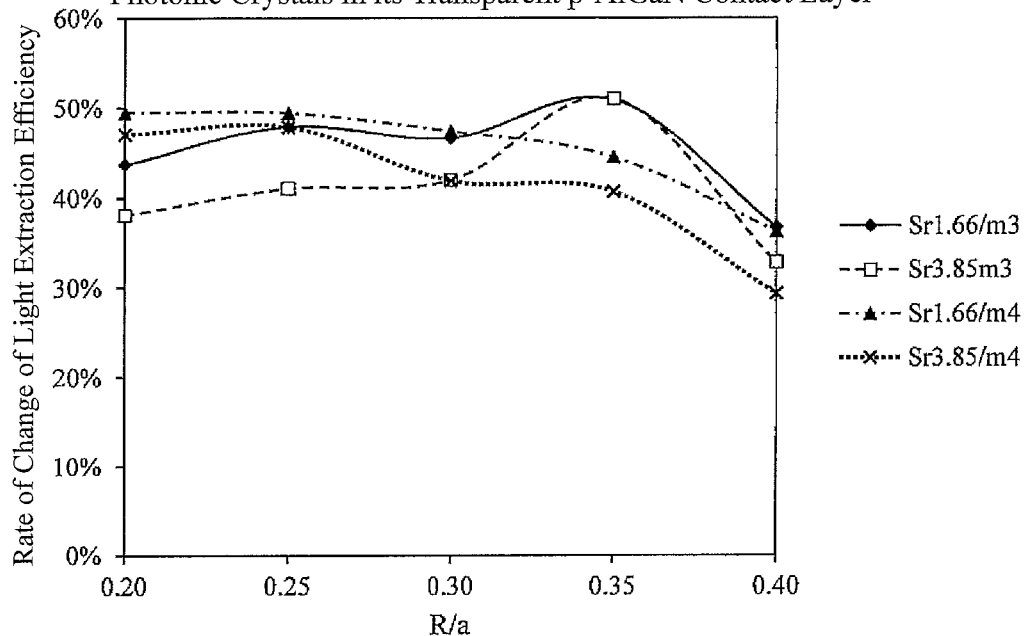

(b)

| Circumscribed Circle | m3 | | | | m4 | | | |
|---|---|---|---|---|---|---|---|---|
| Solid Angle (Sr) | Total Output (Sr1.66) | Rate of Change | Total Output (Sr3.85) | Rate of Change | Total Output (Sr1.66) | Rate of Change | Total Output (Sr3.85) | Rate of Change |
| Flat | 1.07E-15 | | 1.13E-15 | | 1.07E-15 | | 1.13E-15 | |
| R/a0.20 | 1.54E-15 | 44% | 1.56E-15 | 38% | 1.61E-15 | 49% | 1.66E-15 | 47% |
| R/a0.25 | 1.59E-15 | 48% | 1.59E-15 | 41% | 1.60E-15 | 49% | 1.67E-15 | 48% |
| R/a0.30 | 1.57E-15 | 47% | 1.60E-15 | 42% | 1.58E-15 | 47% | 1.60E-15 | 42% |
| R/a0.35 | 1.62E-15 | 51% | 1.70E-15 | 51% | 1.55E-15 | 45% | 1.59E-15 | 41% |
| R/a0.40 | 1.47E-15 | 37% | 1.50E-15 | 33% | 1.46E-15 | 36% | 1.46E-15 | 29% |

Fig. 20A
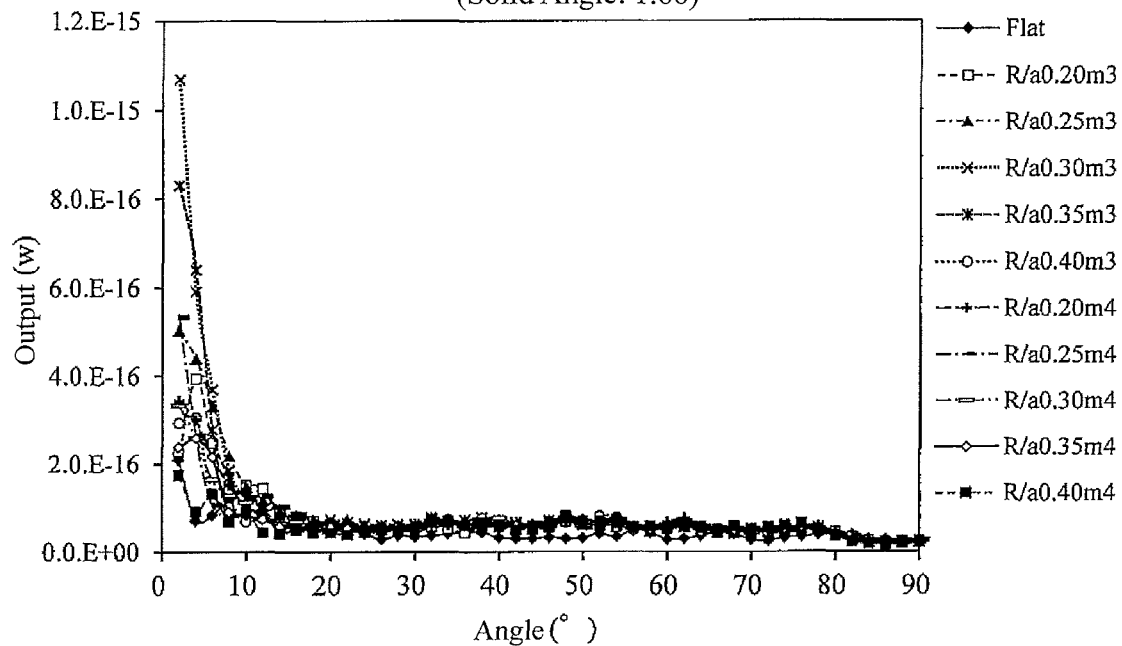
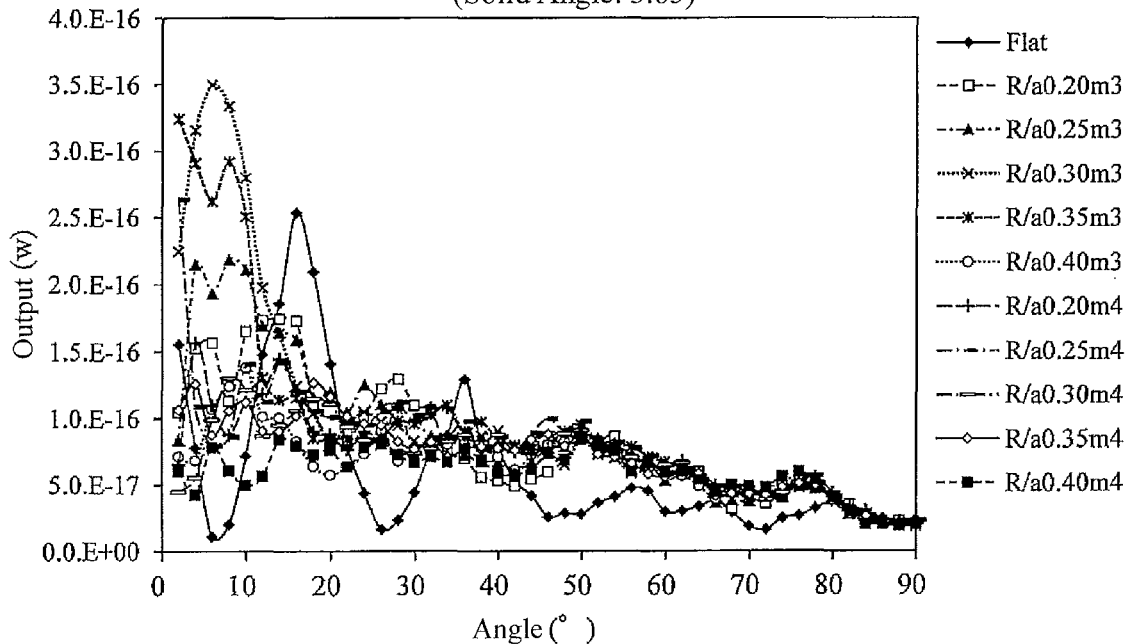

Fig. 20B
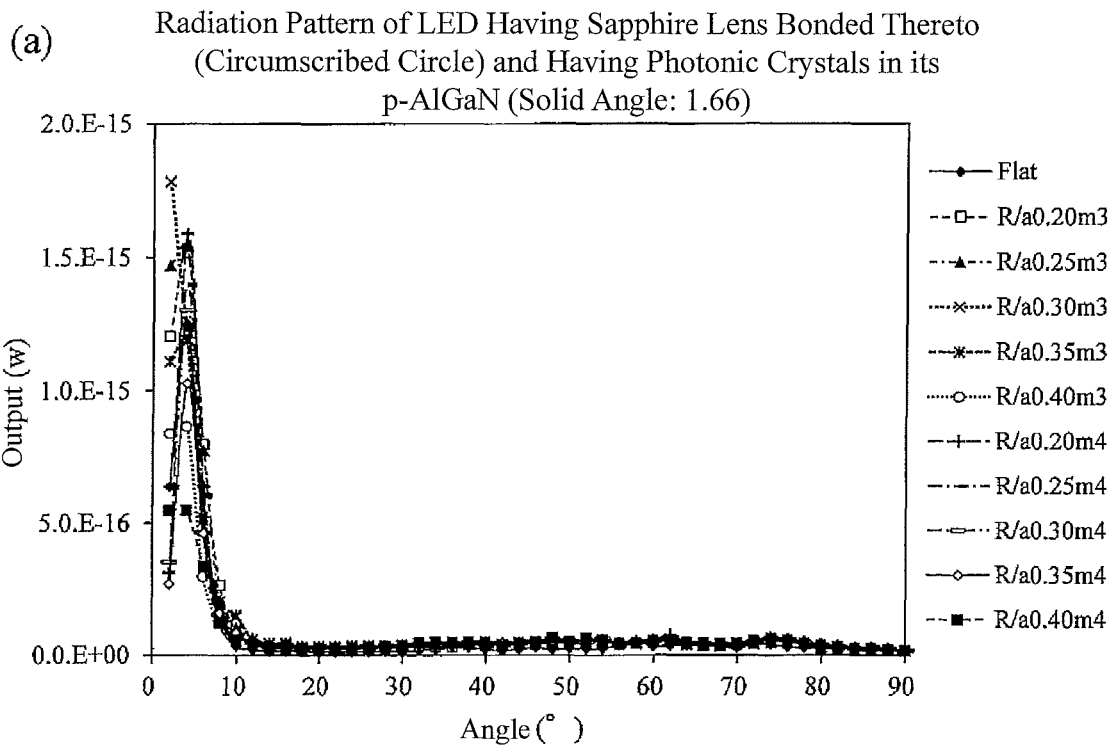
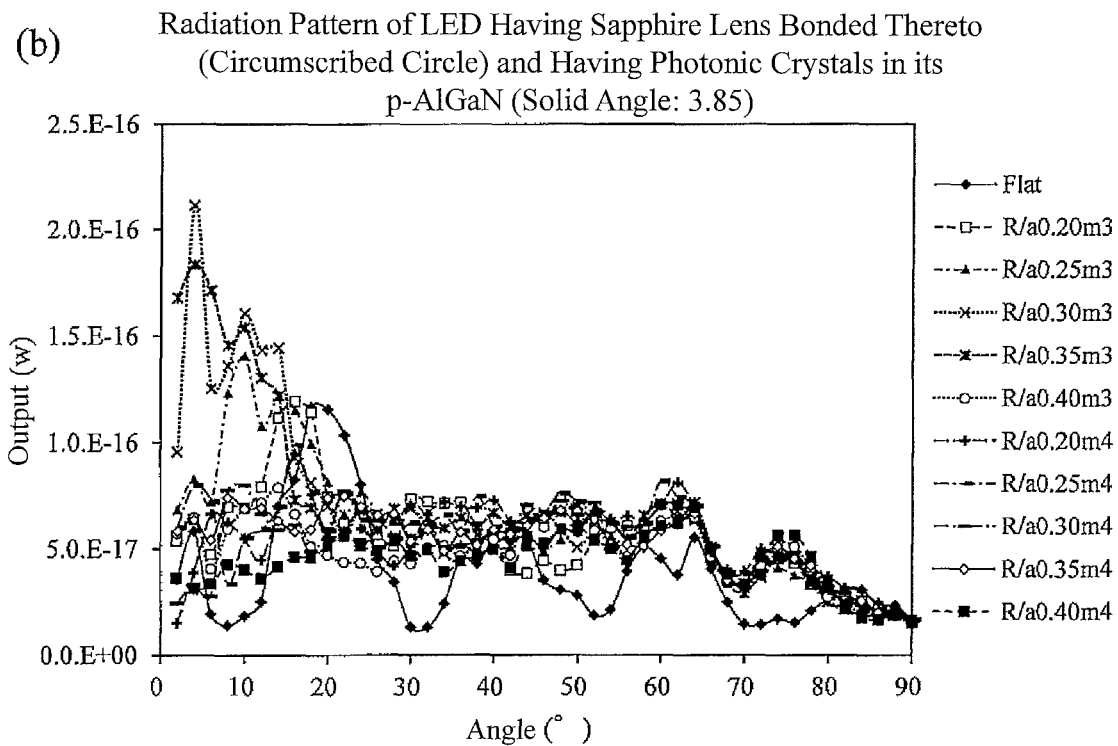

(a)

| Inscribed Circle | pAlGaN | | | | |
|---|---|---|---|---|---|
| | Total Output (Sr1.66) | Rate of Change | | Total Output (Sr3.85) | Rate of Change |
| Sr1.66_Flat | 1.41E-15 | | Sr3.85_Flat | 1.45E-15 | |
| Sr1.66_R/a0.35m3 | 2.14E-15 | 51.6% | Sr3.85_R/a0.35m3 | 2.16E-15 | 49.1% |

(b) Radiation Pattern of LED Having Quartz Glass Lens Bonded Thereto (Inscribed Circle) and Having Photonic Crystals in its p-AlGaN (a)

| Circumscribed Circle | pAlGaN | | | | |
|---|---|---|---|---|---|
| | Total Output (Sr1.66) | Rate of Change | | Total Output (Sr3.85) | Rate of Change |
| Sr1.66_Flat | 1.09E-15 | - | Sr3.85_Flat | 1.04E-15 | - |
| Sr1.66_R/a0.35m3 | 1.71E-15 | 56.1% | Sr3.85_R/a0.35m3 | 1.67E-15 | 60.7% |

(b) Radiation Pattern of LED Having Quartz Glass Lens Bonded Thereto (Circumscribed Circle) and Having Photonic Crystals in its p-AlGaN

| 1 | Sapphire Substrate | 8a | p-AlGaN Layer |
| 2 | AlN Buffer Layer | 8b | p-GaN Contact Layer |
| 3 | n-AlGaN Layer | 9a | Ni Layer |
| 4 | Barrier Layer | 10a | Au Reflecting Electrode Layer |
| 5 | Quantum Well Layer | 20b | Quartz Glass Lens |
| 6 | Barrier Layer | 100 | Photonic Crystal Periodic Structure |
| 7 | Electron Blocking Layer | 101 | Photonic Crystals (Holes) |

1 Sapphire Substrate
2 AlN Buffer Layer
3 n-AlGaN Layer
4 Barrier Layer
5 Quantum Well Layer
6 Barrier Layer
7 Electron Blocking Layer 8a p-AlGaN Layer
8b p-GaN Contact Layer
9a Ni Layer
10a Au Reflecting Electrode Layer
20a Sapphire Lens
100 Photonic Crystal Periodic Structure
101 Photonic Crystals (Holes)

Fig. 24A (a) Rate of Change of Light Extraction Efficiency of LED Having Sapphire Lens Bonded Thereto (Inscribed Circle) and Having Photonic Crystals in its p-GaN Contact Layer

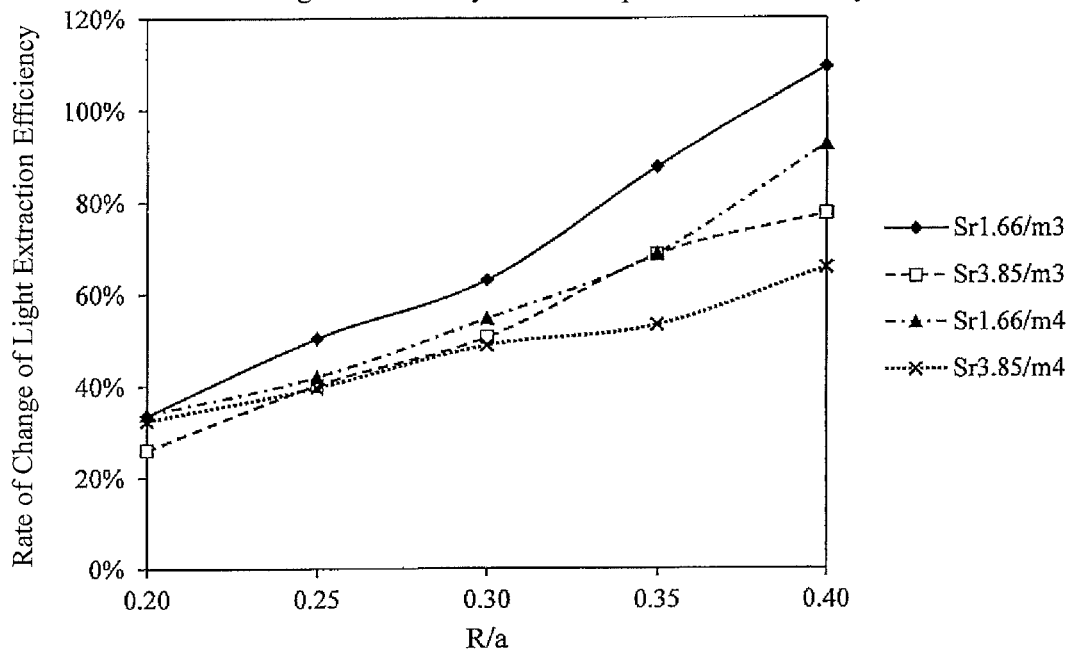

(b)

| Inscribed Circle | m3 | | | | m4 | | | |
|---|---|---|---|---|---|---|---|---|
| | Total Output (Sr1.66) | Rate of Change | Total Output (Sr3.85) | Rate of Change | Total Output (Sr1.66) | Rate of Change | Total Output (Sr3.85) | Rate of Change |
| Flat | 6.03E-16 | - | 8.09E-16 | - | 6.03E-16 | - | 8.09E-16 | - |
| R/a0.20 | 8.05E-16 | 34% | 1.02E-15 | 26% | 8.07E-16 | 34% | 1.07E-15 | 32% |
| R/a0.25 | 9.07E-16 | 50% | 1.13E-15 | 40% | 8.56E-16 | 42% | 1.13E-15 | 40% |
| R/a0.30 | 9.83E-16 | 63% | 1.22E-15 | 51% | 9.33E-16 | 55% | 1.21E-15 | 49% |
| R/a0.35 | 1.13E-15 | 88% | 1.36E-15 | 69% | 1.02E-15 | 69% | 1.24E-15 | 53% |
| R/a0.40 | 1.26E-15 | 109% | 1.44E-15 | 78% | 1.16E-15 | 93% | 1.34E-15 | 66% |

Fig. 24B (a) Rate of Change of Light Extraction Efficiency of LED Having Sapphire Lens Bonded Thereto (Circumscribed Circle) and Having Photonic Crystals in its p-GaN Contact Layer

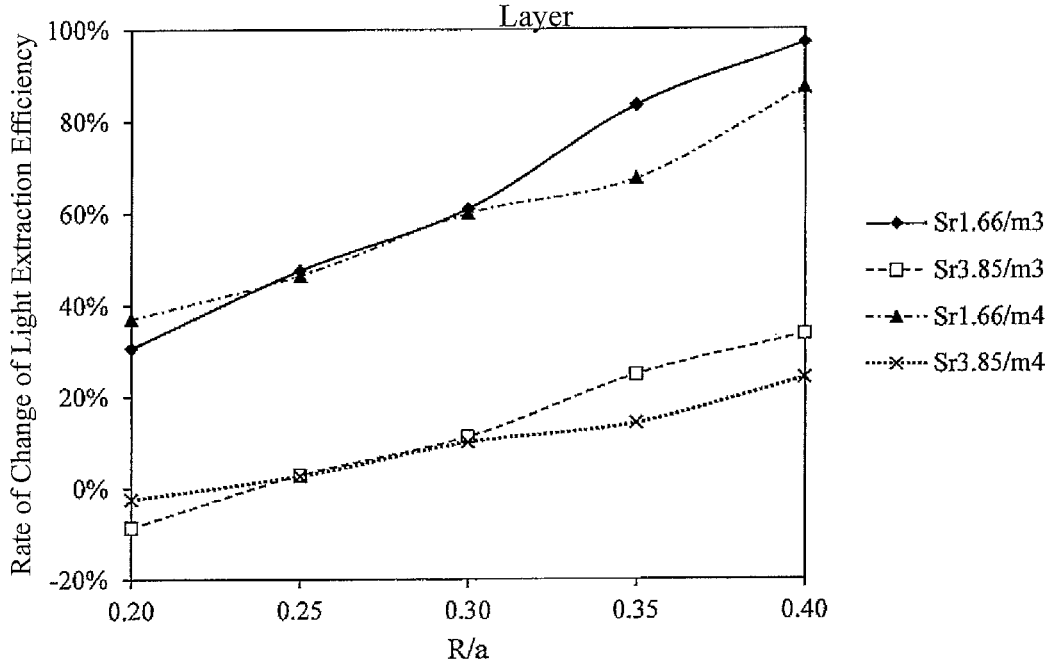

(b)

| Circumscribed Circle | m3 | | | | m4 | | | |
|---|---|---|---|---|---|---|---|---|
| | Total Output (Sr1.66) | Rate of Change | Total Output (Sr3.85) | Rate of Change | Total Output (Sr1.66) | Rate of Change | Total Output (Sr3.85) | Rate of Change |
| Flat | 5.32E-16 | - | 8.03E-16 | - | 5.32E-16 | - | 8.03E-16 | - |
| R/a0.20 | 6.95E-16 | 31% | 7.34E-16 | -9% | 7.29E-16 | 37% | 7.84E-16 | -2% |
| R/a0.25 | 7.85E-16 | 48% | 8.27E-16 | 3% | 7.79E-16 | 47% | 8.25E-16 | 3% |
| R/a0.30 | 8.56E-16 | 61% | 8.94E-16 | 11% | 8.51E-16 | 60% | 8.84E-16 | 10% |
| R/a0.35 | 9.76E-16 | 83% | 1.00E-15 | 25% | 8.91E-16 | 68% | 9.18E-16 | 14% |
| R/a0.40 | 1.05E-15 | 97% | 1.08E-15 | 34% | 9.96E-16 | 87% | 9.98E-16 | 24% |

Fig. 25A
(a) 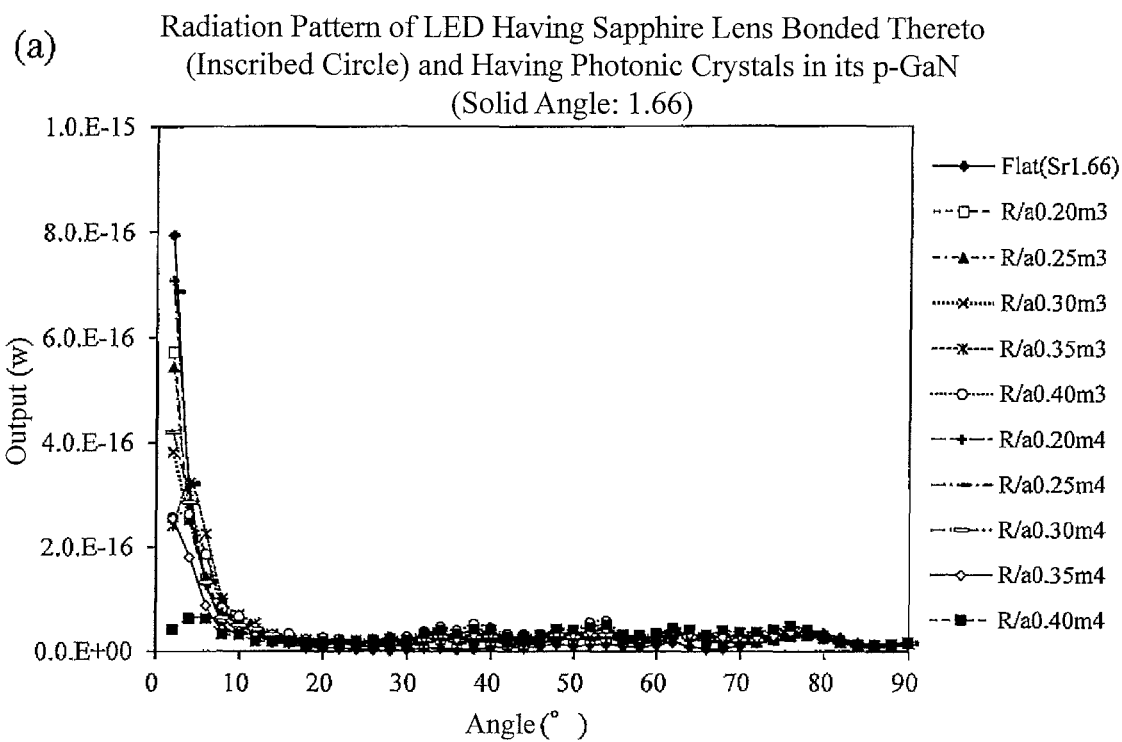
(b) 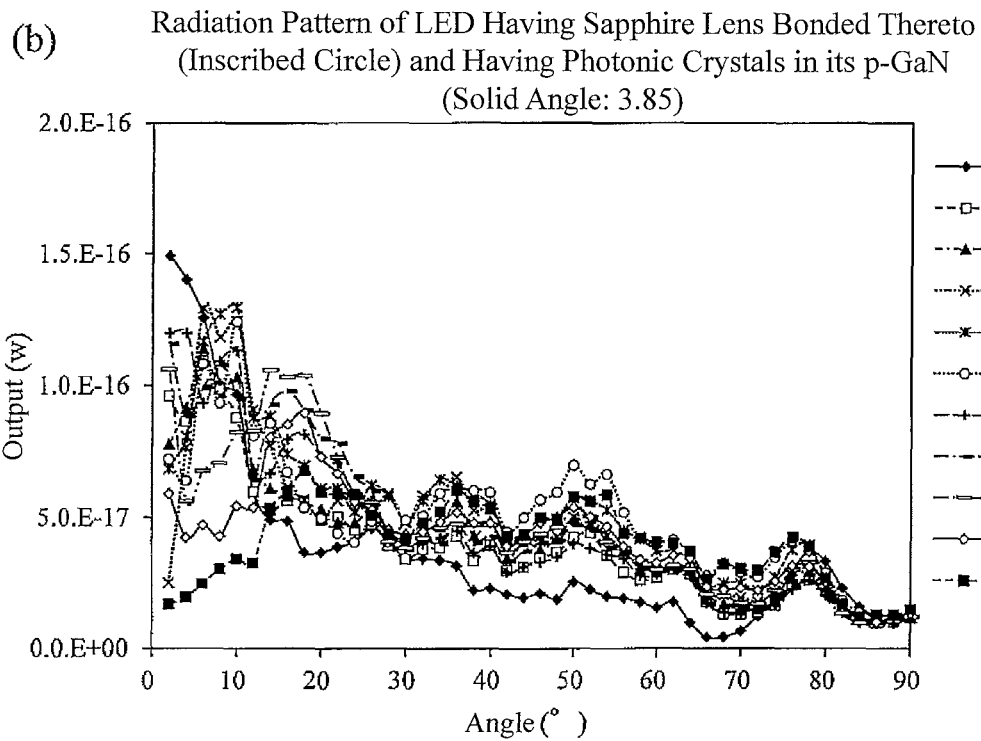

Fig. 25B
(a) 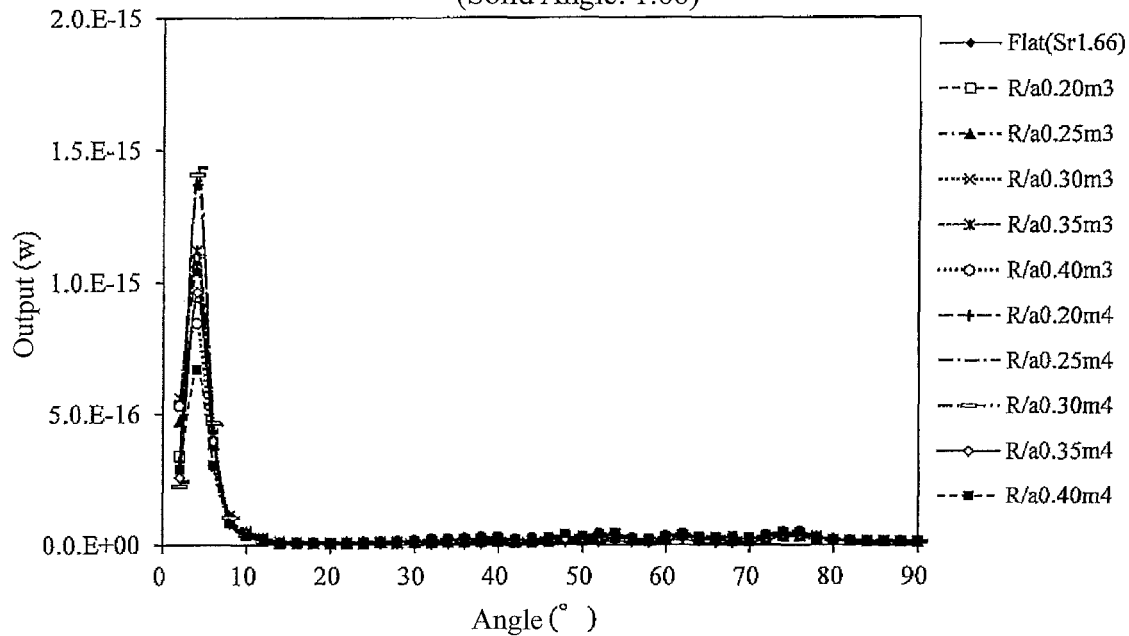
(b) 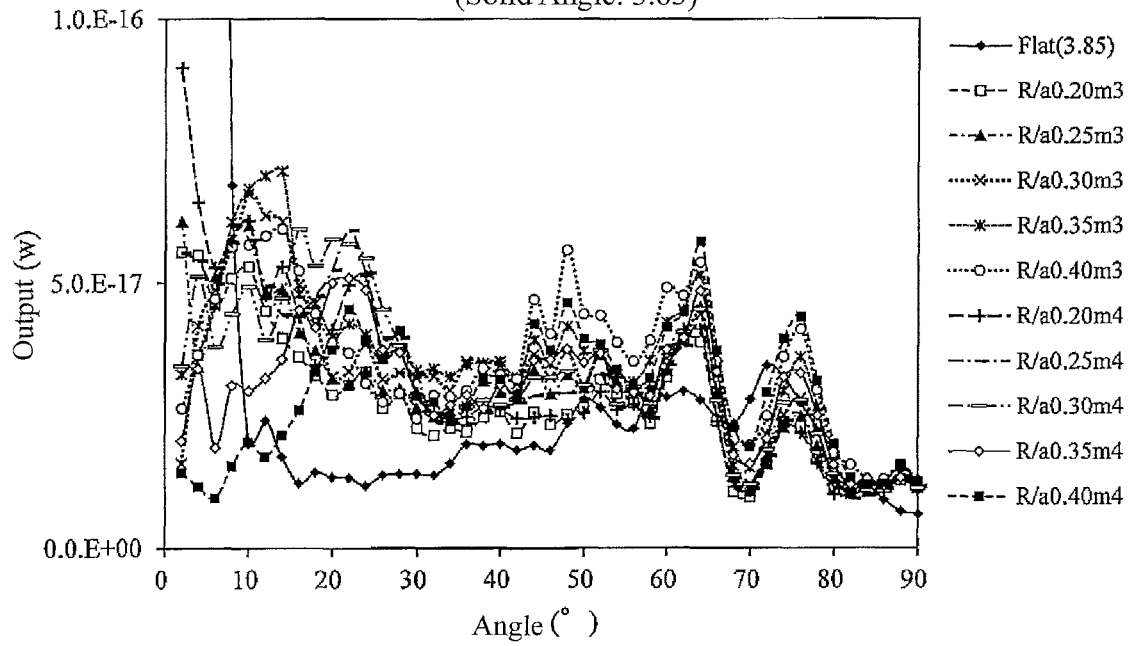

(a)

| Inscribed Circle | pGaN | | | | |
|---|---|---|---|---|---|
| | Total Output (Sr1.66) | Rate of Change | | Total Output (Sr3.85) | Rate of Change |
| Sr1.66_Flat | 6.92E-16 | | Sr3.85_Flat | 7.18E-16 | |
| Sr1.66_R/a0.40m3 | 1.29E-15 | 87% | Sr3.85_R/a0.40m3 | 1.26E-15 | 75% |

(b) Radiation Pattern of LED Having Quartz Glass Lens Bonded Thereto (Inscribed Circle) and Having Photonic Crystals in its p-GaN (a)

| Circumscribed Circle | pGaN | | | | |
|---|---|---|---|---|---|
| | Total Output (Sr1.66) | Rate of Change | | Total Output (Sr3.85) | Rate of Change |
| Sr1.66_Flat | 5.41E-16 | - | Sr3.85_Flat | 5.12E-16 | - |
| Sr1.66_R/a0.40m3 | 1.02E-15 | 89% | Sr3.85_R/a0.40m3 | 9.34E-16 | 83% |

(b) Radiation Pattern of LED Having Quartz Glass Lens Bonded Thereto (Circumscribed Circle) and Having Photonic Crystals in its p-GaN

Fig. 27A

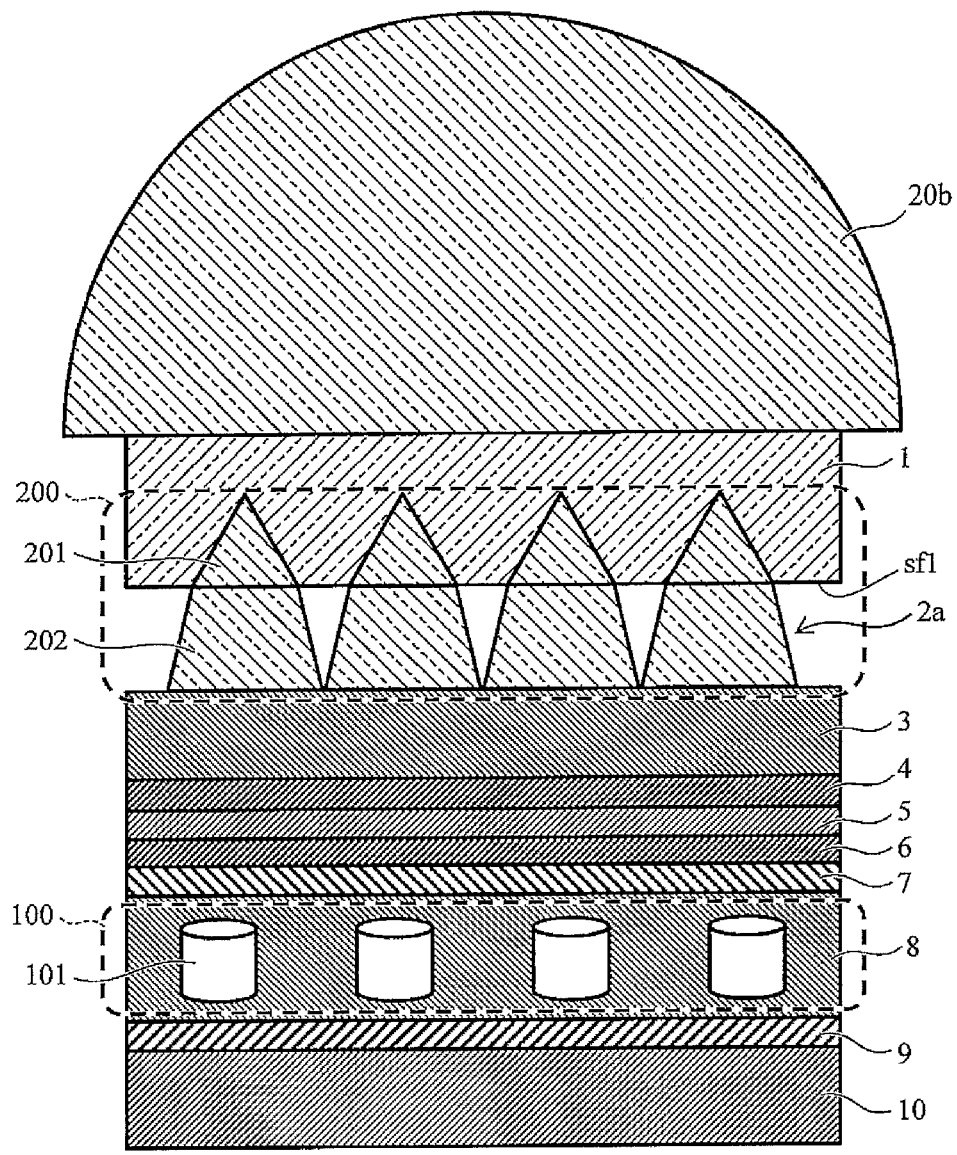

1 Sapphire Substrate
2a AlN Buffer Layer
3 n-AlGaN Layer
4 Barrier Layer
5 Quantum Well Layer
6 Barrier Layer
7 Electron Blocking Layer
8 Transparent p-AlGaN Contact Layer
9 Ultrathin Ni Layer
10 Al Reflecting Electrode Layer
20b Quartz Glass Lens
100 Photonic Crystal Periodic Structure
101 Photonic Crystals (Holes)
200 PSS-Derived AlN Connected-Pillar Periodic Structure
201 PSS
202 AlN Connected Pillars

Fig. 27C

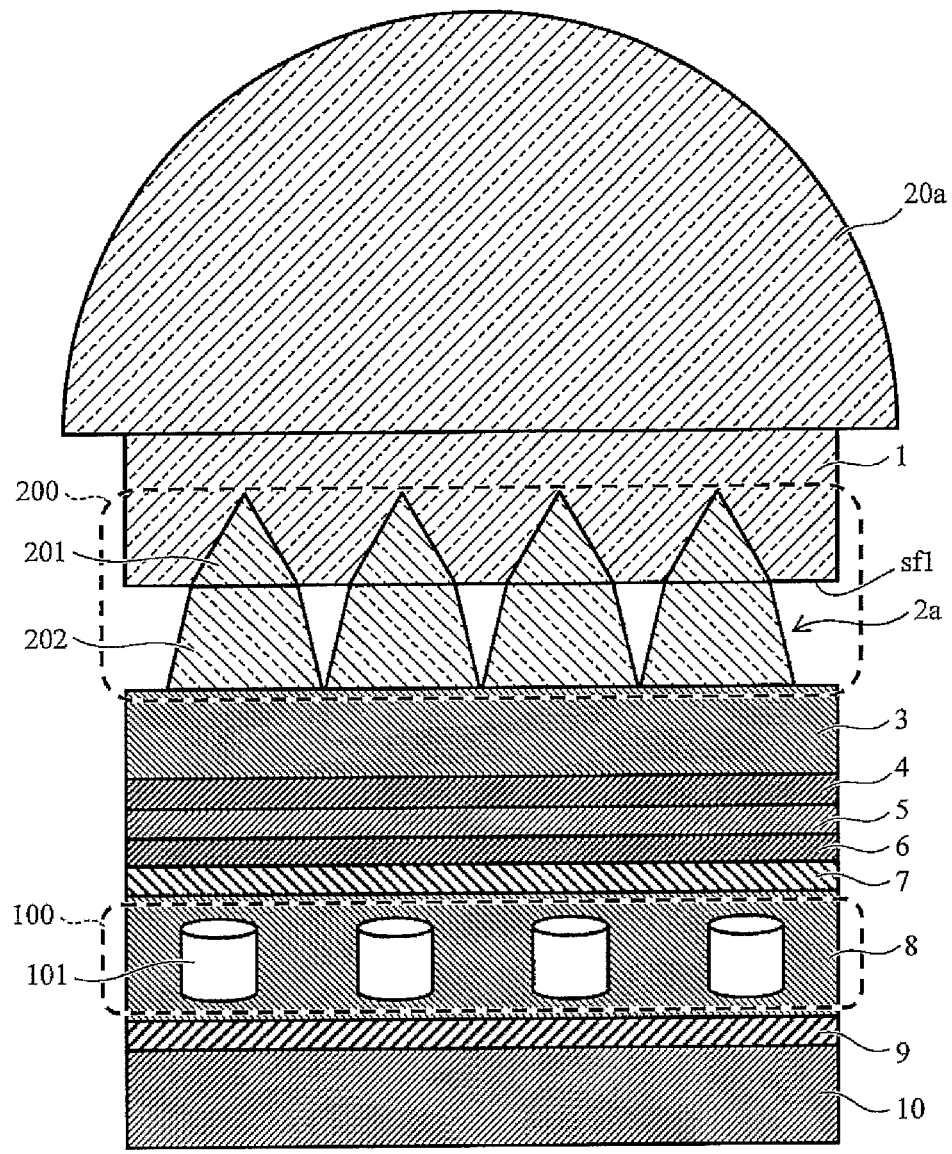

1 Sapphire Substrate
2a AlN Buffer Layer
3 n-AlGaN Layer
4 Barrier Layer
5 Quantum Well Layer
6 Barrier Layer
7 Electron Blocking Layer
8 Transparent p-AlGaN Contact Layer
9 Ultrathin Ni Layer
10 Al Reflecting Electrode Layer
20a Sapphire Lens
100 Photonic Crystal Periodic Structure
101 Photonic Crystals (Holes)
200 PSS-Derived AlN Connected-Pillar Periodic Structure
201 PSS
202 AlN Connected Pillars 1 Sapphire Substrate
2a AlN Buffer Layer
3 n-AlGaN Layer
4 Barrier Layer
5 Quantum Well Layer
6 Barrier Layer
7 Electron Blocking Layer
8 Transparent p-AlGaN Contact Layer
9 Ultrathin Ni Layer
10 Al Reflecting Electrode Layer
20b Quartz Glass Lens
200 PSS-Derived AlN Connected-Pillar Periodic Structure
201 PSS
202 AlN Connected Pillars 1  Sapphire Substrate
2a AlN Buffer Layer
3  n-AlGaN Layer
4  Barrier Layer
5  Quantum Well Layer
6  Barrier Layer
7  Electron Blocking Layer
8  Transparent p-AlGaN Contact Layer
9  Ultrathin Ni Layer
10 Al Reflecting Electrode Layer
20a Sapphire Lens
200 PSS-Derived AlN Connected-Pillar Periodic Structure
201 PSS
202 AlN Connected Pillars

Fig. 27I

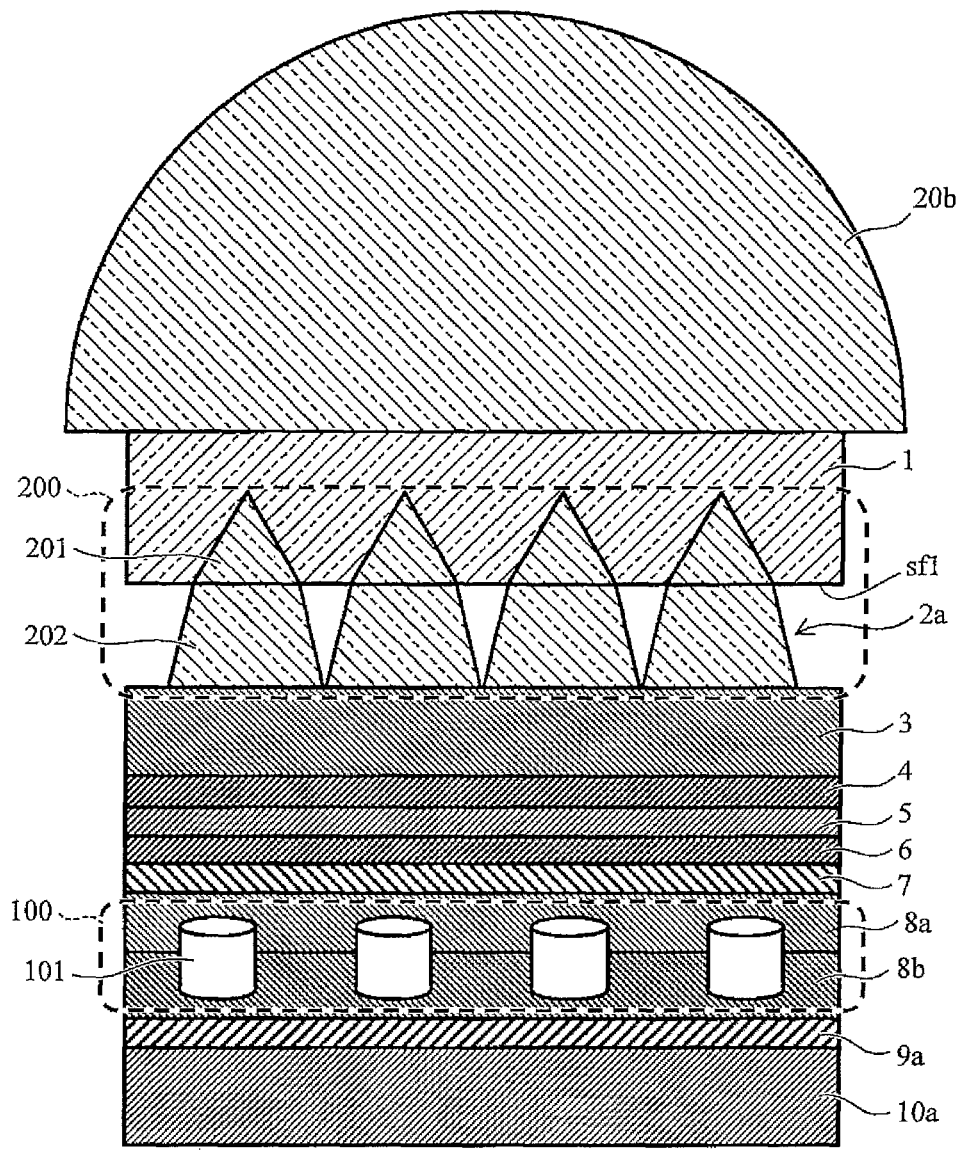

1 Sapphire Substrate
2a AlN Buffer Layer
3 n-AlGaN Layer
4 Barrier Layer
5 Quantum Well Layer
6 Barrier Layer
7 Electron Blocking Layer
8a p-AlGaN Layer
8b p-GaN Contact Layer
9a Ni Layer
10a Au Reflecting Electrode Layer
20b Quartz Glass Lens
100 Photonic Crystal Periodic Structure
101 Photonic Crystals (Holes)
200 PSS-Derived AlN Connected-Pillar Periodic Structure
201 PSS
202 AlN Connected Pillars

Fig. 27K

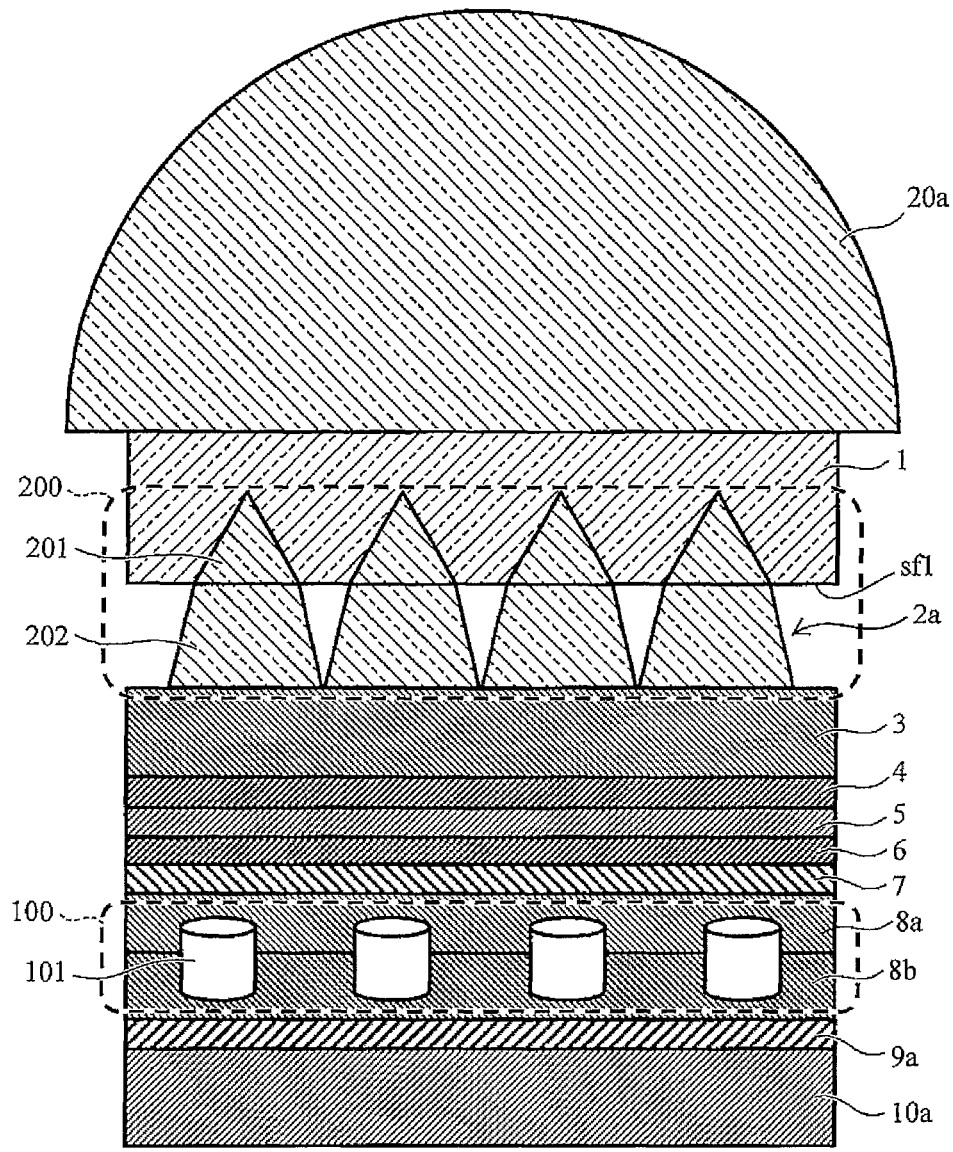

1 Sapphire Substrate
2a AlN Buffer Layer
3 n-AlGaN Layer
4 Barrier Layer
5 Quantum Well Layer
6 Barrier Layer
7 Electron Blocking Layer
8a p-AlGaN Layer
8b p-GaN Contact Layer
9a Ni Layer
10a Au Reflecting Electrode Layer
20a Sapphire Lens
100 Photonic Crystal Periodic Structure
101 Photonic Crystals (Holes)
200 PSS-Derived AlN Connected-Pillar Periodic Structure
201 PSS
202 AlN Connected Pillars 1 Sapphire Substrate
2a AlN Buffer Layer
3 n-AlGaN Layer
4 Barrier Layer
5 Quantum Well Layer
6 Barrier Layer
7 Electron Blocking Layer
8a p-AlGaN Layer
8b p-GaN Contact Layer
9a Ni Layer
10a Au Reflecting Electrode Layer
20b Quartz Glass Lens
200 PSS-Derived AlN Connected-Pillar Periodic Structure
201 PSS
202 AlN Connected Pillars 1 Sapphire Substrate
2a AlN Buffer Layer
3 n-AlGaN Layer
4 Barrier Layer
5 Quantum Well Layer
6 Barrier Layer
7 Electron Blocking Layer
8a p-AlGaN Layer
8b p-GaN Contact Layer
9a Ni Layer
10a Au Reflecting Electrode Layer
20a Sapphire Lens
200 PSS-Derived AlN Connected-Pillar Periodic Structure
201 PSS
202 AlN Connected Pillars

Fig. 28A (a)

| Inscribed Circle | Sapphire Lens | | Quartz Glass Lens | |
|---|---|---|---|---|
| Sr3.85 | Total Output | Rate of Change | Total Output | Rate of Change |
| pAlGaN_Ra0.35m3_Sapphire Lens | 2.23E-15 | - | - | - |
| pAlGaN_Ra0.35m3_AlNCP_Sapphire Lens | 2.03E-15 | -9% | - | - |
| pAlGaN_Ra0.35m3_Quartz Glass Lens | - | - | 2.16E-15 | - |
| pAlGaN_Ra0.35m3_AlNCP_Quartz Glass Lens | - | - | 2.07E-15 | -4.0% |

(b) Radiation Pattern of LED Having Photonic Crystals in its p-AlGaN, Having AlN-Connected-Pillar(AlNCP), and Having Lens Bonded Thereto (Inscribed Circle)

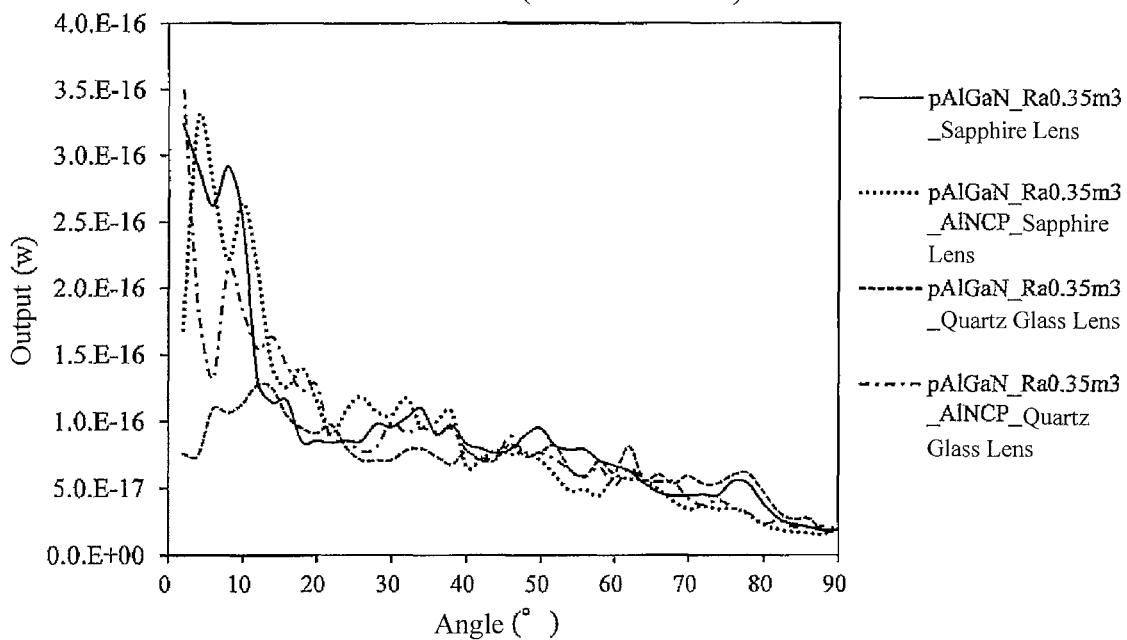

Fig. 28B (a)

| Circumscribed Circle | Sapphire Lens | | Quartz Glass Lens | |
|---|---|---|---|---|
| Sr3.85 | Total Output | Rate of Change | Total Output | Rate of Change |
| pAlGaN_Ra0.35m3_Sapphire Lens | 1.70E-15 | - | - | - |
| pAlGaN_Ra0.35m3_AlNCP_Sapphire Lens | 1.54E-15 | -10% | - | - |
| pAlGaN_Ra0.35m3_Quartz Glass Lens | - | - | 1.67E-15 | - |
| pAlGaN_Ra0.35m3_AlNCP_Quartz Glass Lens | - | - | 1.57E-15 | -5.9% |

(b)

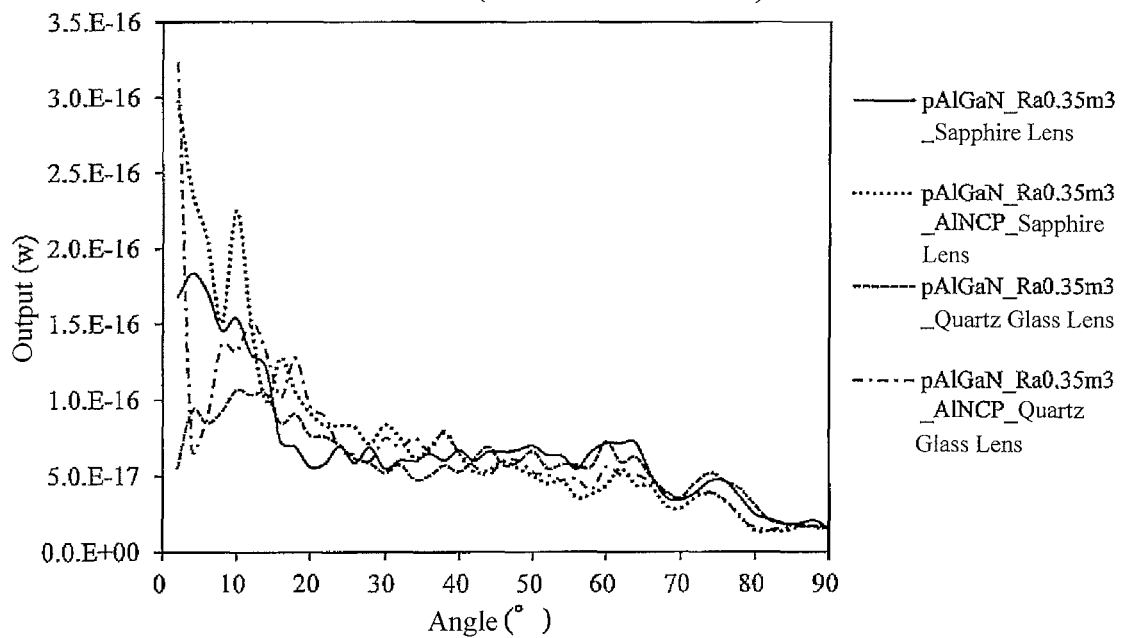

Radiation Pattern of LED Having Photonic Crystals in its p-AlGaN, Having AlN-Connected-Pillar(AlNCP), and Having Lens Bonded Thereto (Circumscribed Circle)

(a)

| Inscribed Circle | Sapphire Lens | | Quartz Glass Lens | |
|---|---|---|---|---|
| Sr3.85 | Total Output | Rate of Change | Total Output | Rate of Change |
| pAlGaN_Flat_Sapphire Lens | 1.57E-15 | - | - | - |
| pAlGaN_Flat_AlNCP_Sapphire Lens | 1.50E-15 | -4% | - | - |
| pAlGaN_Flat_Quartz Glass Lens | - | - | 1.45E-15 | - |
| pAlGaN_Flat_AlNCP_Quartz Glass Lens | - | - | 1.54E-15 | 6.4% |

(b) Radiation Pattern of Flat LED Having p-AlGaN, AlN-Connected-Pillar(AlNCP), and Lens Bonded Thereto (Inscribed Circle)

Fig. 29B (a)

| Circumscribed Circle | Sapphire Lens | | Quartz Glass Lens | |
|---|---|---|---|---|
| Sr3.85 | Total Output | Rate of Change | Total Output | Rate of Change |
| pAlGaN_Flat_Sapphire Lens | 1.13E-15 | - | - | - |
| pAlGaN_Flat_AlNCP_Sapphire Lens | 1.12E-15 | -1% | - | - |
| pAlGaN_Flat_Quartz Glass Lens | - | - | 1.04E-15 | - |
| pAlGaN_Flat_AlNCP_Quartz Glass Lens | - | - | 1.15E-15 | 10.7% |

(b) Radiation Pattern of Flat LED Having p-AlGaN, AlN-Connected-Pillar(AlNCP), and Lens Bonded Thereto (Circumscribed Circle)

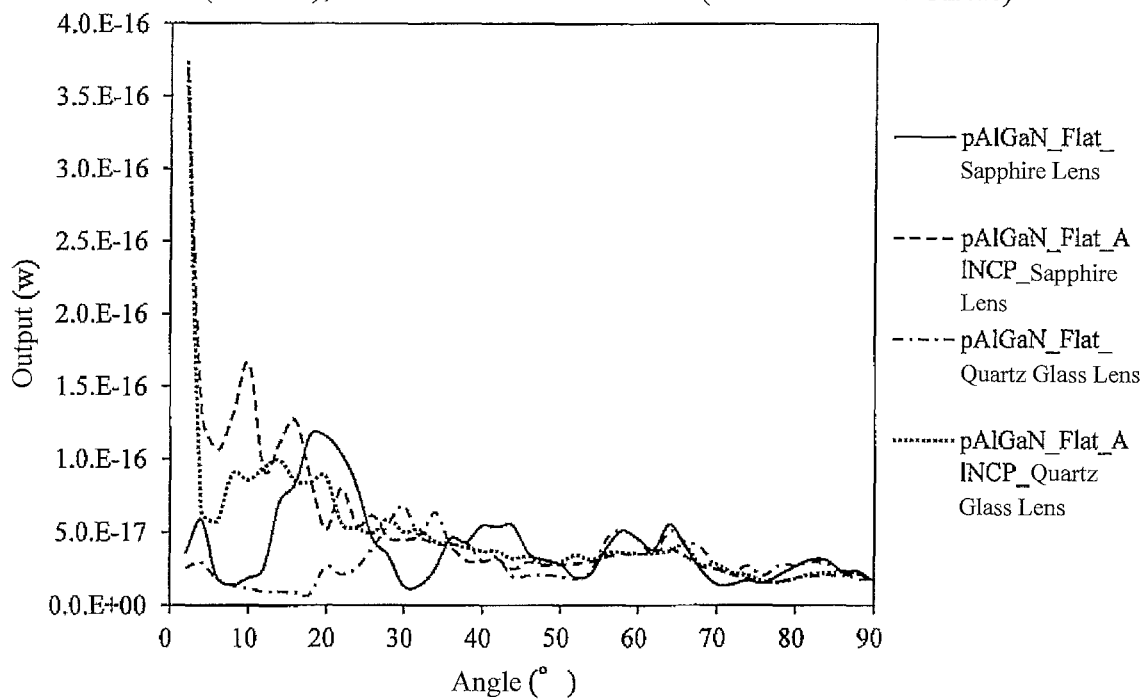

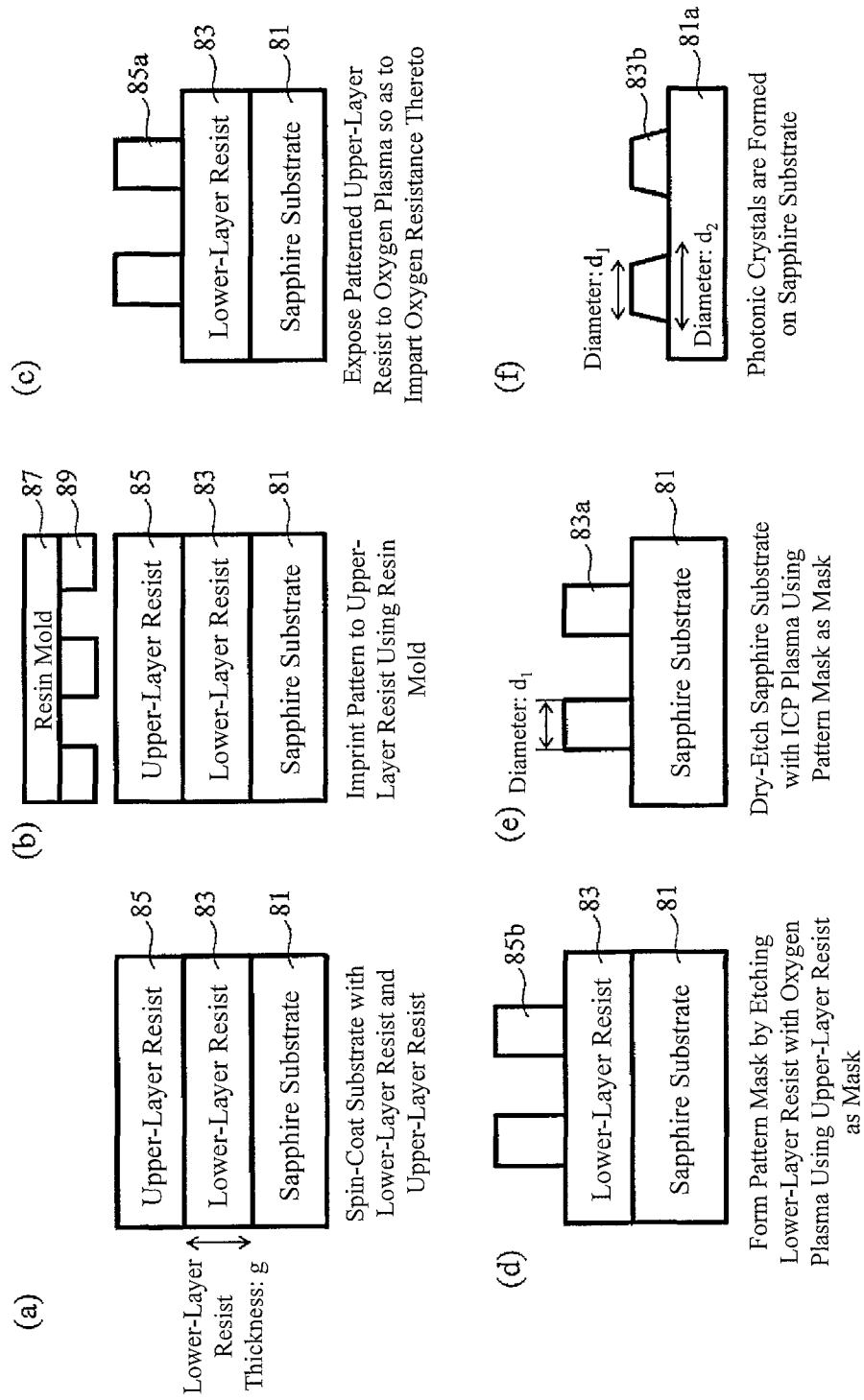

1 Sapphire Substrate
2 AlN Buffer Layer
3 n-AlGaN Layer
4 Barrier Layer
5 Quantum Well Layer
6 Barrier Layer
7 Multi-Quantum Barrier Layer
  (Electron Blocking Layer)
8a p-AlGaN Layer 8b p-GaN Contact Layer
9a Ni Layer
10a Au Reflecting Electrode Layer
20a Sapphire Lens
30 Al Reflecting Plate
100 Photonic Crystal Periodic Structure
101 Photonic Crystals (Holes)

DEEP ULTRAVIOLET LED AND METHOD FOR MANUFACTURING THE SAME

TECHNICAL FIELD

The present invention relates to a technology of a deep ultraviolet LED.

BACKGROUND ART

Deep ultraviolet LEDs with a light emission wavelength of around 265 to 280 nm are expected to be used for a wide variety of applications, such as food, water purification, medical treatment, and sterilization of household electrical appliances. However, the WPE (wall-plug power conversion efficiency) of currently available products is as low as 2 to 3%. In order for deep ultraviolet LEDs to be practically used for the aforementioned applications, the WPE needs to be at least greater than or equal to 10%. This is mainly because 50% or more of deep ultraviolet light that is emitted from a quantum well is absorbed by and disappears in a p-GaN contact layer, and the light may be confined within the LED due to total internal reflection, which can then be converted into heat, and thus that the light extraction efficiency (LEE) is as low as less than 10%. Therefore, in Patent Literature 1, a photonic crystal periodic structure is formed to enhance the light extraction efficiency. Herein, it has been reported that with the method described in Non Patent Literature 1 or 2, the LEE has been improved by about 1.7 to 3 times that of a structure based on a p-GaN contact layer.

CITATION LIST

Patent Literature

Patent Literature 1: WO 2013/008556 A

Non Patent Literature

Non Patent Literature 1: JST Strategic Basic Research Programs, CREST search area: "Light/photon science technology aimed at creation of innovative functions," Project: "Research of InAlGaN-based deep ultraviolet high-efficiency light-emitting devices with a band of 230 to 350 nm," Report about the completion of the research (research period: October, 2007 to March, 2013)
Non Patent Literature 2: The 65th JSAP (The Japan Society of Applied Physics) Spring Meeting, Extended abstracts (Shonan Campus, Tokai University, 2015) 14p-B1-5

SUMMARY OF INVENTION

Technical Problem

According to Non Patent Literature 1, a p-AlGaN contact layer that is transparent to light with the light emission wavelength is adopted to enhance the LEE by about 1.7 times. Further, according to Non Patent Literature 2, a lens that is transparent to light with the light emission wavelength is bonded to the rear surface of a sapphire substrate to enhance the LEE by about 3 times.

However, with the aforementioned methods, it has been only possible to attain an LEE of 15% at maximum and a WPE of less than 9% and therefore, a WPE of greater than 10% has not been attained.

It is an object of the present invention to further enhance the LEE of a deep ultraviolet LED and thus achieve higher WPE.

Solution to Problem

According to the first aspect of the present invention, there is provided a deep ultraviolet LED with a design wavelength $\lambda$, including a reflecting electrode layer (for example, Al), an ultra-thin metal layer (for example, an Ni layer (about 1 nm)), and a p-type contact layer that are arranged in this order from a side opposite to a substrate (for example, a sapphire substrate); and a hemispherical lens bonded to the rear surface of the substrate on the side of the p-type contact layer, the hemispherical lens being transparent to light with the wavelength $\lambda$, in which the refractive index of the hemispherical lens is greater than or equal to the average value of the refractive index of the substrate and the refractive index of the air and is less than or equal to the refractive index of the substrate, and the hemispherical lens has a radius that is greater than or equal to the radius of an inscribed circle of the substrate and is about equal to the radius of a circumscribed circle of the substrate.

For example, the p-type contact layer is a transparent p-AlGaN contact layer. That is, since the p-AlGaN contact layer is transparent to light with the wavelength $\lambda$, the amount of absorption of light by the ultrathin Ni layer is small, and the Al reflecting electrode layer has reflectivity as high as 90% with respect to light, it is possible to obtain the LEE enhancement effect that is 1.7 times that when the p-GaN contact layer is used. Further, the most part of light reflected by the highly reflective electrode structure becomes incident on the front surface of the sapphire substrate, and is emitted to the air from the transparent lens bonded to the rear surface of the sapphire substrate. Since the lens is a hemispherical lens, the light is emitted in the direction of the normal to the lens surface even when there is a distribution in the angle of incidence of light on the sapphire substrate. Therefore, total internal reflection can be minimized and high LEE can be obtained.

In addition, as the thickness of the sapphire substrate is reduced and the element size is increased, the LEE enhancement effect can be increased with the synergistic effect of the hemispherical lens and the highly reflective electrode structure.

Further, the transparent p-AlGaN contact layer includes a photonic crystal periodic structure provided in the range of the thickness direction thereof; the photonic crystal periodic structure is a periodic structure including the air and the transparent p-AlGaN contact layer; the photonic crystal periodic structure has a photonic band gap; the photonic band gap opens for TE polarized components; the wavelength $\lambda$, the period a of the structure, and the average refractive index nay of two materials forming the structure satisfy the Bragg condition; the order m of the Bragg condition is in the range of 2<m<5; and the depth h of the structure is greater than or equal to ⅔ the length of the period a.

With the photonic crystal periodic structure (reflecting photonic crystal periodic structure) having the photonic band gap, light with the wavelength $\lambda$ can be efficiently reflected through multiple reflections. Even when a slight amount of light has passed through the transparent p-AlGaN contact layer, since the amount of light absorbed by the ultrathin Ni layer is small and the Al reflecting electrode layer has reflectivity as high as 90% with respect to light, higher LEE can be achieved in comparison with when an Al reflecting electrode layer is used alone without the photonic crystal periodic structure provided.

Further, the most part of light reflected by the reflecting photonic crystal periodic structure becomes incident on the front surface of the sapphire substrate and is then emitted to the air from the transparent hemispherical lens bonded to the rear surface of the sapphire substrate. Since the lens is a hemispherical lens, the light is emitted in the direction of the normal to the lens surface even when there is a distribution in the angle of incidence of light on the sapphire substrate. Therefore, total internal reflection can be minimized and high LEE can be obtained.

The LEE enhancement effect can be increased with the synergistic effect of the hemispherical lens, and the reflecting photonic crystal periodic structure, the transparent p-AlGaN contact layer, the ultrathin Ni layer, and the Al reflecting electrode layer.

In addition, for example, the p-type contact layer includes a p-GaN contact layer and a p-AlGaN layer that are arranged in this order from a side opposite to a substrate; a photonic crystal periodic structure is provided in the range of the thickness direction including at least the interface between the p-GaN contact layer and the p-AlGaN layer such that the photonic crystal periodic structure does not extend beyond the p-AlGaN layer in the direction of the substrate; the photonic crystal periodic structure is a periodic structure including the air and the p-GaN contact layer and the p-AlGaN contact layer; the photonic crystal periodic structure has a photonic band gap; the photonic band gap opens for TE polarized components; the wavelength $\lambda$, a period a of the structure, and the average refractive index $n_{av}$ of two materials forming the structure satisfy the Bragg condition; the order m of the Bragg condition is in the range of $2<m<5$; and the depth h of the structure is greater than or equal to $\frac{2}{3}$ the length of the period a.

Further, a hemispherical lens that is transparent to light with the wavelength $\lambda$ is bonded to the rear substrate of the substrate on the side of the p-AlGaN layer, and the refractive index of the hemispherical lens is greater than or equal to the average value of the refractive index of the substrate and the refractive index of the air and is less than or equal to the refractive index of the substrate.

The hemispherical lens preferably has a radius that is greater than or equal to the radius of an inscribed circle of the substrate and is about equal to the radius of a circumscribed circle thereof.

According to such a structure, low contact resistance can be maintained with the p-GaN contact layer. In addition, with the reflecting photonic crystal periodic structure having the photonic band gap, light with the wavelength $\lambda$ can be efficiently reflected through multiple reflections. Therefore, absorption of light by the metal layer and the p-GaN contact layer can be suppressed.

Further, the most part of light reflected by the photonic crystal periodic structure becomes incident on the front surface of the substrate and is then emitted to the air from the transparent hemispherical lens bonded to the rear surface of the substrate. Since the lens is a hemispherical lens, the light is emitted in the direction of the normal to the lens surface even when there is a distribution in the angle of incidence of light on the sapphire substrate. Therefore, total internal reflection can be minimized and high LEE can be obtained.

In addition, the LEE enhancement effect can be increased with the synergistic effect of the hemispherical lens and the reflecting photonic crystal periodic structure.

The photonic crystal periodic structure is provided in an extended manner in the thickness direction up to a range of the reflecting electrode layer.

The photonic crystal periodic structure is formed using an imprinting technique based on a nanoimprint lithography method.

Further, the photonic crystal periodic structure is formed using dry etching based on a bi-layer resist method that uses resist with high fluidity and resist with high etch selectivity.

Parameters of the photonic crystal periodic structure are determined using a parameter computation method including a step of tentatively determining a ratio (R/a) between the period a and a radius R of the structure that are periodic structure parameters; a step of computing refractive indices $n_1$ and $n_2$ of the structure, computing the average refractive index nav from the refractive indices $n_1$ and $n_2$ and the R/a, and substituting the average refractive index nav into a formula of the Bragg condition, thereby obtaining the period a and the radius R for each order m; a step of analyzing a photonic band structure for TE polarization using a plane wave expansion method that uses the R/a, the wavelength $\lambda$, and dielectric constants ci and $\varepsilon_2$ of the structure obtained from the refractive indices $n_1$ and $n_2$; a step of repeating the analysis until a PBG between a first photonic band and a second photonic band for TE polarization appears by changing the value of the tentatively determined R/a; a step of determining, for R/a at which the PBG appears, the rate of change of the light extraction efficiency for light with the wavelength $\lambda$ through a simulation analysis using a finite-difference time-domain method (FDTD method) that is performed by using as variables the individual period a and radius R corresponding to each order m of the Bragg condition and a given depth h of the periodic structure; and a step of determining the order m of the Bragg condition at which the rate of change of the light extraction efficiency for light with the wavelength $\lambda$ becomes maximum, and the period a, the radius R, and the depth h that are the periodic structure parameters corresponding to the order m by repeatedly performing simulation using the FDTD method.

The deep ultraviolet LED further includes a waveguide structure provided between the p-type contact layer and the hemispherical lens.

The waveguide structure includes a PSS periodic structure with a triangular conical shape formed on the front surface of the substrate, and an AlN connected-pillar periodic structure formed continuously with the PSS periodic structure in the thickness direction, the AlN connected-pillar periodic structure including pillars each having one of a truncated hexagonal pyramid shape or a truncated square pyramid shape.

The waveguide structure is formed through epitaxial growth of an AlN film on the PSS periodic structure formed using wet etching with a mask pattern (for example, a $SiO_2$ mask) that has been formed using an imprinting technique based on a nanoimprint lithography method.

For example, there is provided a deep ultraviolet LED with a design wavelength $\lambda$, including an Al highly reflecting electrode layer, an ultrathin Ni layer (about 1 nm), and a transparent p-AlGaN contact layer that are arranged in this order from a side opposite to a substrate, the transparent p-AlGaN contact layer being transparent to light with the wavelength $\lambda$; a photonic crystal periodic structure with a photonic band gap (PBG) provided at least in the thickness direction of the transparent p-AlGaN contact layer or in the range of the thickness direction in a region of from the transparent p-AlGaN contact layer and including the interface between the ultrathin Ni layer and the Al reflecting electrode layer; PSS formed on the front surface of the sapphire substrate through wet etching and AlN connected pillars formed continuously with the PSS through epitaxial growth; and a hemispherical lens bonded to the rear surface of the sapphire substrate on the side of the transparent p-AlGaN contact layer, the hemispherical lens being transparent to light with the wavelength $\lambda$, in which the refractive index of the hemispherical lens is greater than or equal to the average value of the refractive index of the sapphire substrate and the refractive index of the air and is less than or equal to the refractive index of the sapphire substrate.

It should be noted that the hemispherical lens preferably has a radius that is greater than or equal to the radius of an inscribed circle of the sapphire substrate and is about equal to the radius of a circumscribed circle thereof.

In addition, with the reflecting photonic crystal periodic structure having the photonic band gap, light with the wavelength $\lambda$ can be efficiently reflected through multiple reflections. Further, light that has become incident on the AlN connected pillars can propagate due to the waveguide effect and becomes incident on the front surface of the sapphire substrate without being wasted. Even when a slight amount of light has passed through the transparent p-AlGaN contact layer, since the amount of light absorbed by the ultrathin Ni layer is small and the Al reflecting electrode layer has reflectivity as high as 90% with respect to light, higher LEE can be achieved in comparison with when an Al reflecting electrode layer is used alone without the photonic crystal periodic structure provided.

Further, the most part of light reflected by the reflecting photonic crystal periodic structure becomes incident on the front surface of the sapphire substrate and is emitted to the air from the transparent lens bonded to the rear surface of the sapphire substrate. Since the lens is a hemispherical lens, the light is emitted in the direction of the normal to the lens surface even when there is a distribution in the angle of incidence of light on the sapphire substrate. Therefore, total internal reflection can be minimized and high LEE can be obtained.

In addition, the LEE enhancement effect can be increased with the synergistic effect of the hemispherical lens, and the photonic crystal periodic structure, the transparent p-AlGaN contact layer, the ultrathin Ni layer, and the Al reflecting electrode layer, and further with the waveguide effect of the PSS-derived AlN connected pillars formed through wet etching.

In addition, according to the present invention, there is provided a deep ultraviolet LED with a design wavelength $\lambda$, including a reflecting electrode layer, an ultra-thin metal layer, and a transparent p-AlGaN contact layer that are arranged in this order from a side opposite to a substrate; a hemispherical lens bonded to the rear surface of the substrate on the side of the transparent p-AlGaN contact layer, the hemispherical lens being transparent to light with the wavelength $\lambda$, in which the refractive index of the hemispherical lens is greater than or equal to the average value of the refractive index of the substrate and the refractive index of the air and is less than or equal to the refractive index of the substrate; and a waveguide structure provided between the photonic crystal periodic structure and the hemispherical lens.

According to the second aspect of the present invention, there is provided a deep ultraviolet LED with a design wavelength $\lambda$, including a reflecting electrode layer, an ultra-thin metal layer, and a transparent p-AlGaN contact layer that are arranged in this order from a side opposite to a substrate, the transparent p-AlGaN contact layer including a photonic crystal periodic structure provided in the range of the thickness direction thereof; and a hemispherical lens bonded to the rear surface of the substrate, the hemispherical lens being transparent to light with the wavelength $\lambda$, in which the refractive index of the hemispherical lens is greater than or equal to the average value of the refractive index of the substrate and the refractive index of the air and is less than or equal to the refractive index of the substrate, and a waveguide structure is further provided between the photonic crystal periodic structure and the hemispherical lens.

The waveguide structure includes a PSS periodic structure with a triangular conical shape formed on the front surface of the substrate, and an AlN connected-pillar periodic structure formed continuously with the PSS periodic structure in the thickness direction, the AlN connected-pillar periodic structure including pillars each having one of a truncated hexagonal pyramid shape or a truncated square pyramid shape.

According to the third aspect of the present invention, there is provided a deep ultraviolet LED with a design wavelength $\lambda$, including a reflecting electrode layer, a metal layer, a p-GaN contact layer, and a p-AlGaN layer that are arranged in this order from a side opposite to a substrate; a photonic crystal periodic structure provided in the range of the thickness direction including at least the interface between the p-GaN contact layer and the p-AlGaN layer; and a hemispherical lens bonded to the rear surface of the substrate, the hemispherical lens being transparent to light with the wavelength $\lambda$, in which the refractive index of the hemispherical lens is greater than or equal to the average value of the refractive index of the substrate and the refractive index of the air and is less than or equal to the refractive index of the substrate, and a waveguide structure is further provided between the photonic crystal periodic structure and the hemispherical lens.

The waveguide structure includes a PSS periodic structure with a triangular conical shape formed on the front surface of the substrate, and an AlN connected-pillar periodic structure formed continuously with the PSS periodic structure in the thickness direction, the AlN connected-pillar periodic structure including pillars each having one of a truncated hexagonal pyramid shape or a truncated square pyramid shape.

According to the fourth aspect of the present invention, there is provided a method for manufacturing a deep ultraviolet LED with a design wavelength $\lambda$, the LED including a reflecting electrode layer, an ultra-thin metal layer, and a transparent p-AlGaN contact layer that are arranged in this order from a side opposite to a substrate, the method including a step of bonding a hemispherical lens to the rear surface of the substrate, the hemispherical lens being transparent to light with the wavelength $\lambda$ and having a refractive index that is greater than or equal to the average value of the refractive index of the substrate and the refractive index of the air and is less than or equal to the refractive index of the substrate.

In addition, there is also provided a method for manufacturing a deep ultraviolet LED with a design wavelength $\lambda$, the LED including a reflecting electrode layer, an ultra-thin metal layer, and a transparent p-AlGaN contact layer that are arranged in this order from a side opposite to a substrate, the method including a step of forming a photonic crystal periodic structure in the transparent p-AlGaN contact layer in the range of the thickness direction thereof, the photonic crystal periodic structure being a periodic structure including the air and the transparent p-AlGaN contact layer, and the photonic crystal periodic structure having a photonic band gap; and a step of bonding a hemispherical lens to the rear surface of the substrate, the hemispherical lens being transparent to light with the wavelength λ and having a refractive index that is greater than or equal to the average value of the refractive index of the substrate and the refractive index of the air and is less than or equal to the refractive index of the substrate.

Further, there is also provided a method for manufacturing a deep ultraviolet LED with a design wavelength λ, the LED including a reflecting electrode layer, an ultra-thin metal layer, and a transparent p-AlGaN contact layer that are arranged in this order from a side opposite to a substrate, the method including a step of forming a photonic crystal periodic structure in the transparent p-AlGaN contact layer in the range of the thickness direction thereof, the photonic crystal periodic structure being a periodic structure including the air and the transparent p-AlGaN contact layer, and the photonic crystal periodic structure having a photonic band gap; a step of forming a waveguide structure on the front surface of the substrate; and a step of bonding a hemispherical lens to the rear surface of the substrate, the hemispherical lens being transparent to light with the wavelength λ and having a refractive index that is greater than or equal to the average value of the refractive index of the substrate and the refractive index of the air and is less than or equal to the refractive index of the substrate.

For example, there is provided a method for manufacturing a deep ultraviolet LED with a design wavelength λ, the method including a step of preparing a stacked structure including an Al reflecting electrode layer, an ultrathin Ni layer, and a transparent p-AlGaN contact layer that are arranged in this order from a side opposite to a substrate; a step of preparing a mold for forming a photonic crystal periodic structure to be provided at least in the thickness direction of the transparent p-AlGaN contact layer or in the range of the thickness direction in a region of from the transparent p-AlGaN contact layer and including the interface between the ultrathin Ni layer and the Al reflecting electrode layer; a step of forming a resist layer on the stacked structure and imprinting the structure of the mold thereto; a step of sequentially etching the stacked structure using the resist layer as a mask so as to form the photonic crystal periodic structure; a step of forming a PSS periodic structure on the front surface of the sapphire substrate; a step of forming AlN connected pillars through epitaxial growth of AlN; and a step of bonding a hemispherical lens to the rear surface of the sapphire substrate on the side of the transparent p-AlGaN contact layer, the hemispherical lens being transparent to light with the wavelength λ.

In addition, there is also provided a method for manufacturing a deep ultraviolet LED with a design wavelength λ, the LED including a reflecting electrode layer, a metal layer, a p-GaN contact layer, and a p-AlGaN layer that are arranged in this order from a side opposite to a substrate, the method including a step of forming a photonic crystal periodic structure in the range of the thickness direction including at least the interface between the p-GaN contact layer and the p-AlGaN layer such that the photonic crystal periodic structure does not extend beyond the p-AlGaN layer in the direction of the substrate, the photonic crystal periodic structure having a photonic band gap; and a step of bonding a hemispherical lens to the rear surface of the substrate, the hemispherical lens being transparent to light with the wavelength λ and having a refractive index that is greater than or equal to the average value of the refractive index of the substrate and the refractive index of the air and is less than or equal to the refractive index of the substrate.

Further, there is also provided a method for manufacturing a deep ultraviolet LED with a design wavelength λ, the LED including a reflecting electrode layer, a metal layer, a p-GaN contact layer, and a p-AlGaN layer that are arranged in this order from a side opposite to a substrate, the method including a step of forming a photonic crystal periodic structure in the range of the thickness direction including at least the interface between the p-GaN contact layer and the p-AlGaN layer such that the photonic crystal periodic structure does not extend beyond the p-AlGaN layer in the direction of the substrate, the photonic crystal periodic structure having a photonic band gap; a step of forming a waveguide structure on the front surface of the substrate; and a step of bonding a hemispherical lens to the rear surface of the substrate, the hemispherical lens being transparent to light with the wavelength λ and having a refractive index that is greater than or equal to the average value of the refractive index of the substrate and the refractive index of the air and is less than or equal to the refractive index of the substrate.

For example, there is provided a method for manufacturing a deep ultraviolet LED with a design wavelength λ, the method including a step of preparing a stacked structure including an Au reflecting electrode, an Ni layer, a p-GaN contact layer, and a p-AlGaN layer that are arranged in this order from a side opposite to a substrate, the p-AlGaN layer being transparent to light with the wavelength λ; a step of preparing a mold for forming a photonic crystal periodic structure to be provided in the range of the thickness direction including at least the interface between the p-GaN contact layer and the p-AlGaN layer; a step of forming a resist layer on the stacked structure and imprinting the structure of the mold thereto; a step of sequentially etching the stacked structure using the resist layer as a mask so as to form the photonic crystal periodic structure; a step of forming a PSS periodic structure on the front surface of the sapphire substrate; and a step of forming AlN connected pillars continuously with the PSS periodic structure through epitaxial growth of AlN; and a step of bonding a hemispherical lens to the rear surface of the sapphire substrate on the side of the transparent p-AlGaN contact layer, the hemispherical lens being transparent to light with the wavelength λ.

Further, the material of the hemispherical lens may be any material with a refractive index that is greater than the average value of the refractive index of the substrate and the refractive index of the air, such as sapphire, spinel, quartz glass, AlN, or sealing resin, as long as such material satisfies the aforementioned conditions. In addition, the method for bonding the hemispherical lens to the substrate is performed using a bonding method selected from surface activated bonding (SAB), atomic diffusion bonding (ADB), bonding performed after modifying a surface with atmospheric-pressure plasma or ozone gas, bonding performed with an adhesive that is transparent to light with the design wavelength %, or bonding that suppresses scattering and absorption of light at a bonded interface.

It should be noted that the radius of the lens is set greater than or equal to the radius of an inscribed circle of the substrate and about equal to the radius of a circumscribed circle thereof as it depends on the relationship between the manufacturing process and the light collection efficiency.

That is, when the radius of the hemispherical lens is set approximately equal to the radius of a circumscribed circle, light that is emitted from the substrate can be collected to the lens without being leaked. It should be noted that in order to increase the integration degree of elements arranged on the substrate from which light is emitted, the radius of the hemispherical lens is preferably set about equal to the radius of an inscribed circle.

In the aforementioned method for manufacturing a deep ultraviolet LED, as a method for optimizing the light extraction efficiency, a computation method may be used that analyzes a dynamic range region of subnanometers to several millimeters by multiplying the light extraction efficiency at a given solid angle obtained using the ray-tracing method by the magnification of the rate of change of the light extraction efficiency at the same solid angle obtained using the FDTD method, and performing interpolation on a result.

According to the present invention, there is provided a deep ultraviolet LED with a design wavelength $\lambda$, including a reflecting electrode layer, a metal layer, a p-GaN contact layer, and a p-AlGaN layer that are arranged in this order from a side opposite to a substrate, the p-AlGaN layer being transparent to light with the wavelength $\lambda$; a photonic crystal periodic structure provided in the range of the thickness direction including at least the interface between the p-GaN contact layer and the p-AlGaN layer, the photonic crystal periodic structure having a photonic band gap; and a hemispherical lens bonded to the rear surface of the substrate on the side of the p-GaN contact layer, the hemispherical lens being transparent to light with the wavelength $\lambda$.

According to the present invention, there is also provided a deep ultraviolet LED with a design wavelength $\lambda$, including a reflecting electrode layer (for example, Al), an ultrathin metal layer (for example, an Ni layer (about 1 nm)), and a p-type contact layer that are arranged in this order from a side opposite to a substrate (for example, a sapphire substrate); and a hemispherical lens bonded to the rear surface of the substrate on the side of the p-type contact layer, the hemispherical lens being transparent to light with the wavelength $\lambda$, in which the refractive index of the hemispherical lens is greater than or equal to the average value of the refractive index of the substrate and refractive index of the air and is less than or equal to the refractive index of the substrate; the hemispherical lens has a radius that is greater than or equal to the radius of an inscribed circle of the substrate and is about equal to the radius of a circumscribed circle of the substrate; and in a state in which the hemispherical lens is bonded to the rear surface of the substrate, provided that the angle of a portion surrounded by the normal that passes through the center of a quantum well layer and the tangent to an inscribed circle of the rear surface of the sapphire lens drawn from the center of the quantum well layer is defined as $\theta$, the solid angle Sr represented by $Sr=2\pi(1-\cos\theta)$ is greater than or equal to the solid angle corresponding to the point of inflection at which the light extraction efficiency dependent on the solid angle increases.

According to the fifth aspect of the present invention, there is provided a deep ultraviolet LED with a design wavelength $\lambda$, including a reflecting electrode layer, a metal layer, a p-GaN contact layer, a p-AlGaN layer that is transparent to light with the wavelength $\lambda$, a multi-quantum barrier layer, a barrier layer, and a quantum well layer that are arranged in this order from a side opposite to a substrate, in which the thickness of the p-AlGaN layer is less than or equal to 30 nm; a reflecting photonic crystal periodic structure including a plurality of voids is provided in the range of the thickness direction including at least the interface between the p-GaN contact layer and the p-AlGaN layer such that the reflecting photonic crystal periodic structure does not extend beyond the p-AlGaN layer in the direction of the substrate; the maximum value of the light extraction efficiency is obtained with the distance of from an end face of each void in the direction of the substrate to the quantum well layer being in the range of 50 to 70 nm and with the depth h of the void being in the range of 40 to 60 nm; the reflecting photonic crystal periodic structure has a photonic band gap that opens for TE polarized components; the period a of the photonic crystal periodic structure satisfies the Bragg condition with respect to light with the design wavelength $\lambda$; the order m of a formula of the Bragg condition is in the range of $1\leq m\leq 5$; and provided that the radius of each void is R, R/a with which a maximum photonic band gap is obtained is satisfied. Further, a hemispherical lens is bonded to the rear surface of the substrate on the side of the p-AlGaN layer, the hemispherical lens being transparent to light with the wavelength $\lambda$, in which the refractive index of the hemispherical lens is equal to the refractive index of the substrate.

The present specification contains the content disclosed in the Japanese patent applications JP 2015-173834 and 2015-218532 that serve as bases for priority claim of the present application.

Advantageous Effects of Invention

According to the present invention, the LEE and WPE of a deep ultraviolet LED can be enhanced.

BRIEF DESCRIPTION OF DRAWINGS

FIG. 2B are plan views each illustrating the relationship between a bonded lens and a substrate; specifically, (a) illustrates the relationship in which the bonded lens is an inscribed circle of the substrate, and (b) illustrates the relationship in which the bonded lens is a circumscribed circle of the substrate.

FIG. 19A are views illustrating the rate of change of the light extraction efficiency of an LED having a sapphire lens bonded thereto (an inscribed circle) and having photonic crystals in its transparent p-AlGaN contact layer.

FIG. 19B are views illustrating the rate of change of the light extraction efficiency of an LED having a sapphire lens a bonded thereto (a circumscribed circle) and having a photonic crystals in its transparent p-AlGaN contact layer.

FIG. 20A are views illustrating radiation patterns of FIG. 19A.

FIG. 20B are views illustrating radiation patterns of FIG. 19B.

FIG. 24A are views illustrating the rate of change of the light extraction efficiency of an LED having a sapphire lens boned thereto (an inscribed circle) and having photonic crystals in its p-GaN contact layer.

FIG. 24B are views illustrating the rate of change of the light extraction efficiency of an LED having a sapphire lens bonded thereto (a circumscribed circle) and having photonic crystals in its p-GaN contact layer.

FIG. 25A are views illustrating radiation patterns of FIG. 24A.

FIG. 25B are views illustrating radiation patterns of FIG. 24B.

FIG. 27A is a view illustrating the structure of a deep ultraviolet LED obtained by bonding a quartz glass lens to an LED having a reflecting photonic crystal periodic structure in its transparent p-AlGaN contact layer and having AlN connected pillars.

FIG. 27C is a view illustrating the structure of a deep ultraviolet LED obtained by replacing the quartz glass lens of FIG. 27A with a sapphire lens.

FIG. 27I is a view illustrating the structure of a deep ultraviolet LED obtained by replacing the transparent p-AlGaN contact layer, the ultrathin Ni layer, and the Al reflecting electrode layer of FIG. 27A with a p-AlGaN layer, a p-GaN contact layer, a Ni layer, and Au reflecting electrode.

FIG. 27K is a view illustrating the structure of a deep ultraviolet LED obtained by replacing the transparent p-AlGaN contact layer, the ultrathin Ni layer, and the Al reflecting electrode layer of FIG. 27C with a p-AlGaN layer, a p-GaN contact layer, a Ni layer, and an Au reflecting electrode.

FIG. 28A are views illustrating the rate of change of the light extraction efficiency of an LED having a reflecting photonic crystal periodic structure in its transparent p-AlGaN contact layer, having AlN connected pillars, and having a lens bonded thereto (an inscribed circle) as determined using the FDTD method, and a radiation pattern.

FIG. 28B are views illustrating the rate of change of the light extraction efficiency of an LED having a reflecting photonic crystal periodic structure in its transparent p-AlGaN contact layer, having AlN connected pillars, and having a lens bonded thereto (a circumscribed circle) as determined using the FDTD method, and a radiation pattern.

FIG. 29B are views illustrating the rate of change of the light extraction efficiency of an LED having a transparent p-AlGaN contact layer, AlN connected pillars, and a lens bonded thereto (a circumscribed circle) as determined using FDTD method, and a radiation pattern.

FIG. 30 is a view illustrating that a photonic crystal periodic structure, a PSS periodic structure, and the like can be formed using an imprinting technique based on a nanoimprint lithography method.

DESCRIPTION OF EMBODIMENTS

The following embodiments will each describe a technique capable of further enhancing the properties of a deep ultraviolet LED with reference to the accompanying drawings.

First Embodiment

Figure 1:
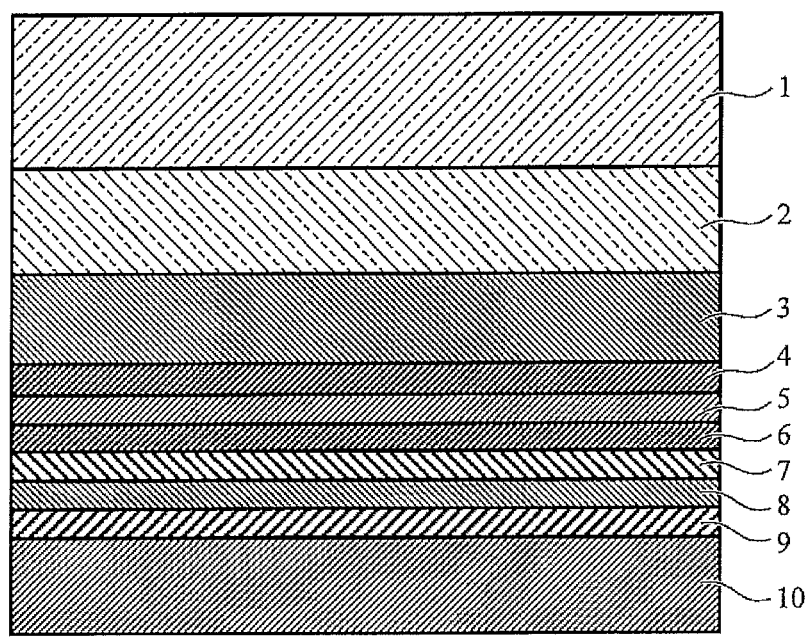
FIG. 1 is a view illustrating the structure of a deep ultraviolet LED including a transparent p-AlGaN contact layer.

FIG. 1 illustrates the structure of an AlGaN-based deep ultraviolet LED with a design wavelength $\lambda$ of 280 nm as an example of a deep ultraviolet LED in accordance with the first embodiment of the present invention. As illustrated in FIG. 1, the deep ultraviolet LED including a transparent p-AlGaN contact layer in accordance with this embodiment includes a sapphire substrate 1, an AlN buffer layer 2, an n-AlGaN layer 3, a barrier layer 4, a quantum well layer (active layer) 5, a barrier layer 6, an electron blocking layer 7, a transparent p-AlGaN contact layer 8, an ultrathin Ni layer 9, and an Al reflecting electrode layer 10 that are arranged in this order from the top of FIG. 1. Although the following example illustrates a case where a quantum well layer is used as the active layer, the active layer is not limited to the quantum well structure.

Figure 2A:
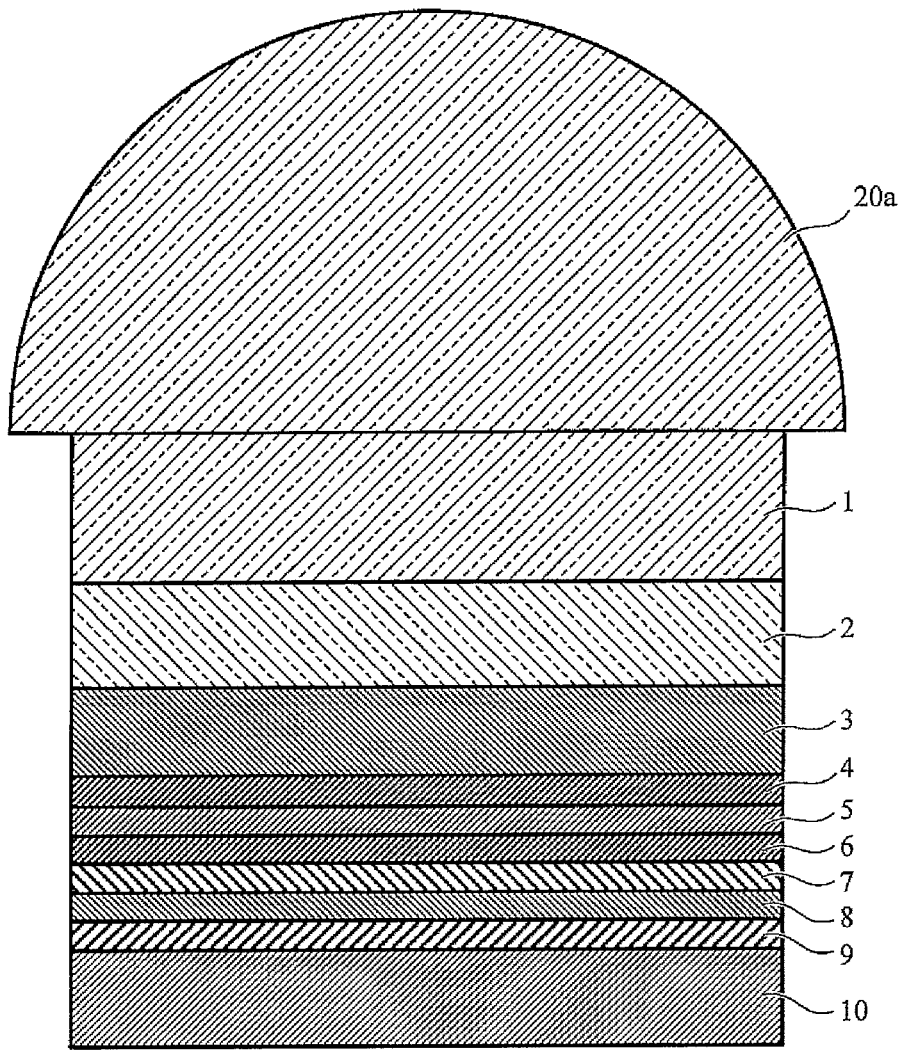
FIG. 2A is a view illustrating the structure of a deep ultraviolet LED obtained by bonding a sapphire lens to the LED in FIG. 1.

In addition, as illustrated in FIG. 2A, a hemispherical sapphire lens 20a, for example, was bonded to the sapphire substrate 1.

FIG. 2B are plan views each illustrating the relationship between the bonded lens and the substrate 1; specifically, FIG. 2 B(a) illustrates the positional relationship in which the bonded lens 20a is an inscribed circle (a circle that is contained in a polygon and touches all the sides of the polygon) C1 of the rectangular substrate 1, and FIG. 2B(b) illustrates a view illustrating the positional relationship in which the bonded lens 20a is a circumscribed circle (a circle that passes through all the vertices of the polygon) of the rectangular substrate 1. The bonded lens (an inscribed circle) refers to the former positional relationship, and the bonded lens (a circumscribed circle) refers to the latter positional relationship.

Figure 3:
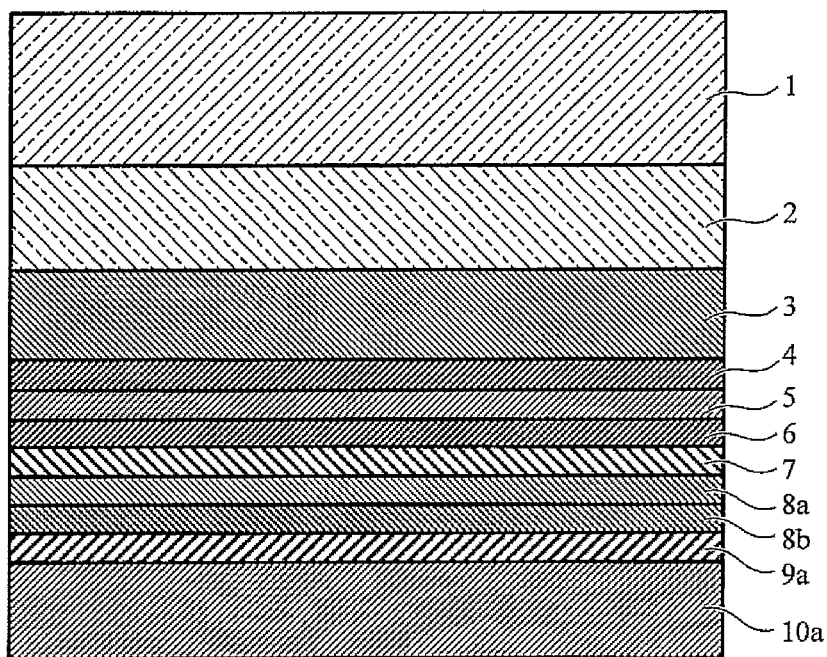
FIG. 3 is a view illustrating the structure of the conventional deep ultraviolet LED including a p-GaN contact layer.
Figure 4:
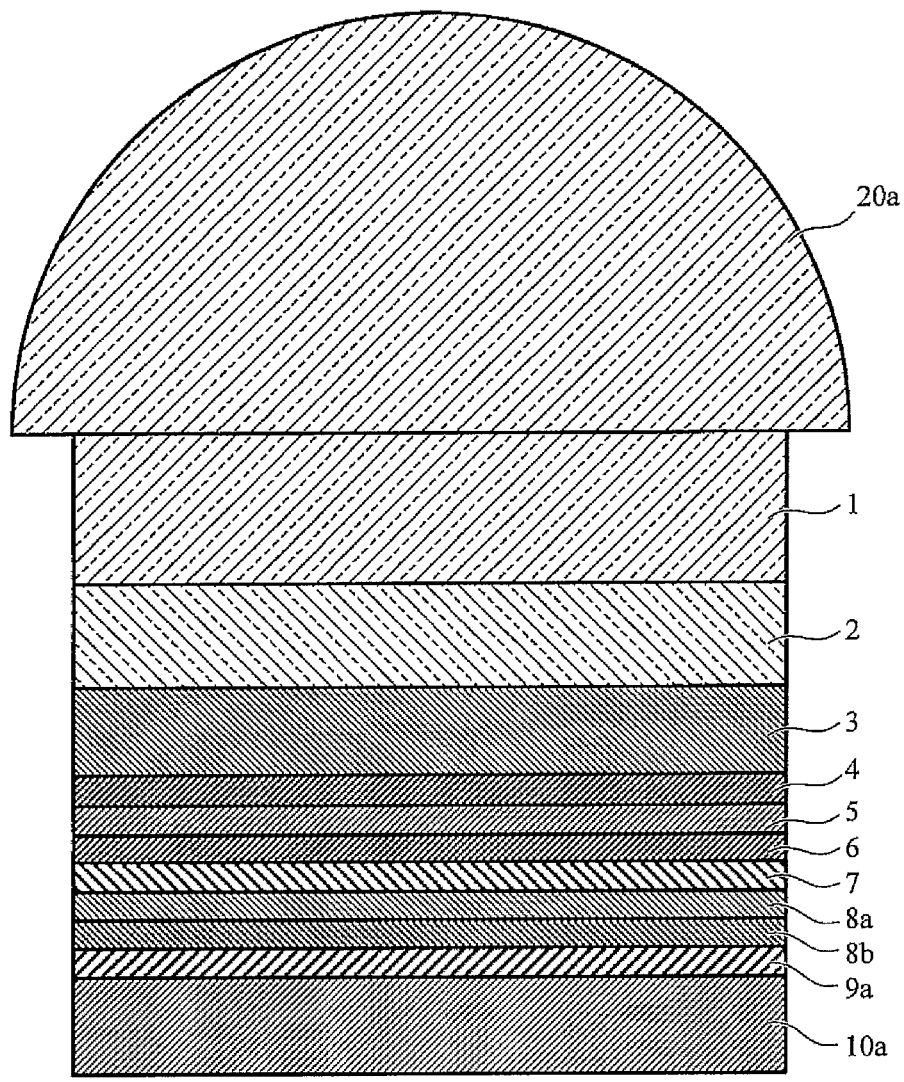
FIG. 4 is a view illustrating the structure of a deep ultraviolet LED obtained by bonding a sapphire lens to the LED in FIG. 3.

FIGS. 3 and 4 are views each illustrating an exemplary structure including a p-GaN contact layer that is provided in a typical deep ultraviolet LED. FIGS. 3 and 4 are shown for purposes of comparison with FIGS. 1 and 2A, respectively.

In FIG. 3, the LED includes a sapphire substrate 1, an AlN buffer layer 2, an n-AlGaN layer 3, a barrier layer 4, a quantum well layer 5, a barrier layer 6, an electron blocking layer 7, a p-AlGaN layer 8a, a p-GaN contact layer 8b, a Ni layer 9a, and an Au reflecting electrode 10a that are arranged in this order from the top of the view.

The structure illustrated in FIG. 4 includes a sapphire lens 20a that is arranged on the sapphire substrate 1 of the structure illustrated in FIG. 3 from the top of the view.

The transparent p-AlGaN contact layer 8 illustrated in FIG. 1 is transparent to light with the design wavelength $\lambda$, and the amount of light absorbed by the ultrathin Ni layer 9 is small, and further, Al has reflectivity as high as greater than or equal to 90% with respect to light. Therefore, in FIG. 1, LEE that is about 1.7 times higher than when the p-GaN contact layer 8b of FIG. 3 is used can be obtained. Further, the most part of light reflected by the highly reflective electrode structure including the ultrathin Ni layer 9 and the Al reflecting electrode layer 10 becomes incident on the front surface of the sapphire substrate 1, and is emitted to the air from the transparent sapphire lens 20a of FIG. 2A bonded to the rear surface of the sapphire substrate 1.

Since the sapphire lens 20a herein is a hemispherical lens with a radius that is about greater than or equal to the radius of an inscribed circle of the sapphire substrate 1 and is about equal to the radius of a circumscribed circle thereof, for example, light is emitted in the direction of the normal to the lens surface even when there is a distribution in the angle of incidence of light on the sapphire substrate 1. Therefore, total internal reflection can be minimized and high LEE can be obtained.

For more specific explanation of such an effect, a computation model was created and the light extraction efficiency of the LED was analyzed using the ray-tracing method (computation model in Table 1).

TABLE 1

Computation model for ray-tracing method

| Element Size: 300 μm□ | p-AlGaN Sapphire Lens | p-AlGaN | p-GaN Sapphire Lens | p-GaN |
|---|---|---|---|---|
| Radius of Sapphire Lens (Inscribed Circle) | 150 μm | 150 μm | 150 μm | 150 μm |
| Radius of Sapphire Lens (Circumscribed Circle) | 220 μm | 220 μm | 220 μm | 220 μm |
| Thickness of Sapphire Substrate | 50 to 300 μm | 50 to 300 μm | 50 to 300 μm | 50 to 300 μm |
| Thickness of AlN Buffer Layer | 4 μm | 4 μm | 4 μm | 4 μm |
| Thickness of p-GaN Contact Layer | — | — | 1 μm | 1 μm |
| Thickness of Transparent p-AlGaN Contact Layer | 1 μm | 1 μm | — | — |

Figure 5:
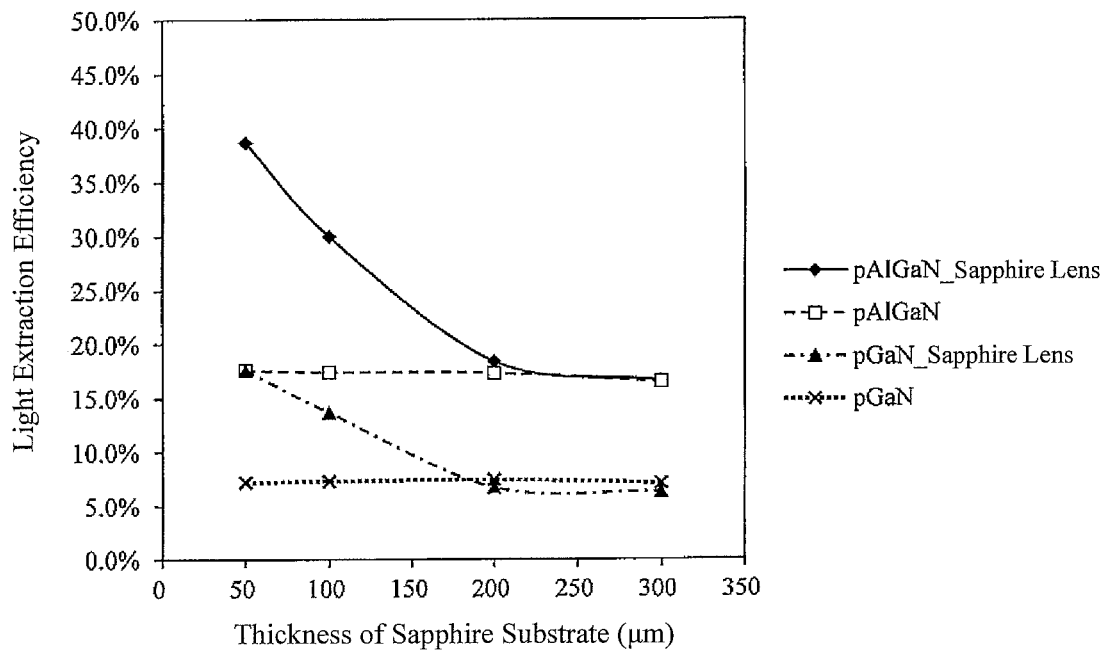
FIG. 5 are views illustrating the relationship between the presence or absence of the bonding of a lens (an inscribed circle) to an LED element and the LEE as determined using the ray-tracing method.
Figure 6:
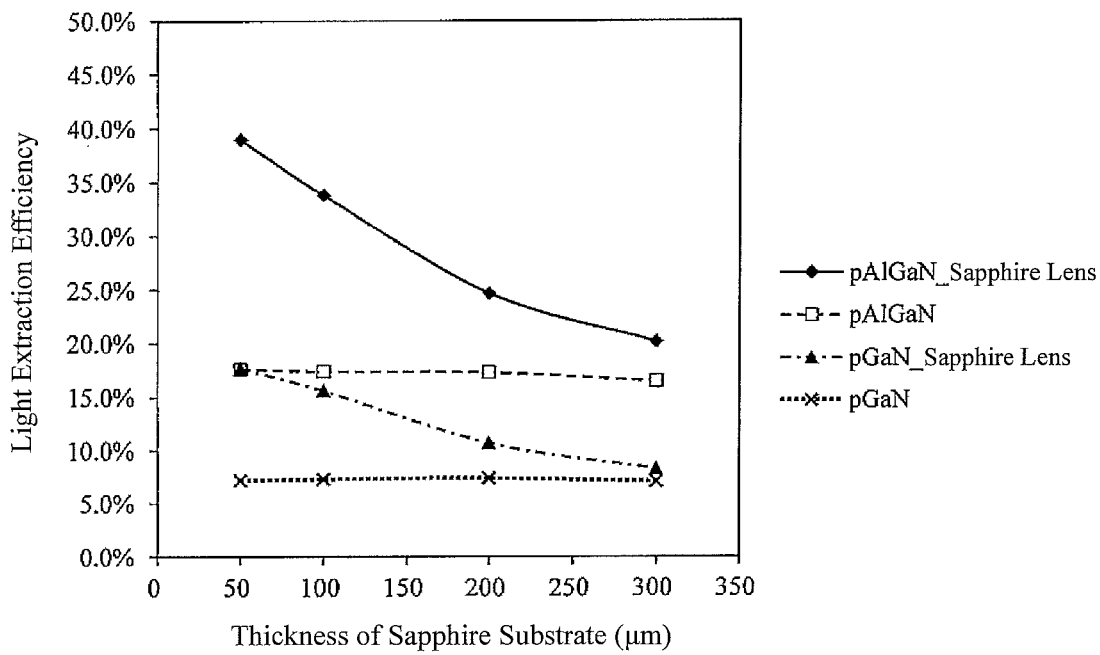
FIG. 6 are views illustrating the relationship between the presence or absence of the bonding of a lens (a circumscribed circle) to an LED element and the LEE as determined using the ray-tracing method.

The results of the analysis conducted using the ray-tracing method illustrated in FIG. 5 (the radius of the lens corresponds to the radius of an inscribed circle) and FIG. 6 (the radius of the lens corresponds to the radius of a circumscribed circle) are as follows.

A: When a sapphire lens is bonded

1) The light extraction efficiency of each of the LED having the sapphire lens bonded thereto and having the p-GaN contact layer and the LED having the sapphire lens bonded thereto and having the transparent p-AlGaN contact layer is higher than that of the LED having no lens bonded thereto by two times or more.

2) The light extraction efficiency of the LED having the transparent p-AlGaN contact layer is higher than that of the LED having the p-GaN contact layer by two times or more.

3) The light extraction efficiency increases in inverse proportion to the substrate thickness.

B: When a sapphire lens is not bonded

1) The light extraction efficiency of the LED having the transparent p-AlGaN contact layer is higher than that of the LED having the p-GaN contact layer by two times or more.

2) The light extraction efficiency does not depend on the substrate thickness.

Second Embodiment

Figure 7:
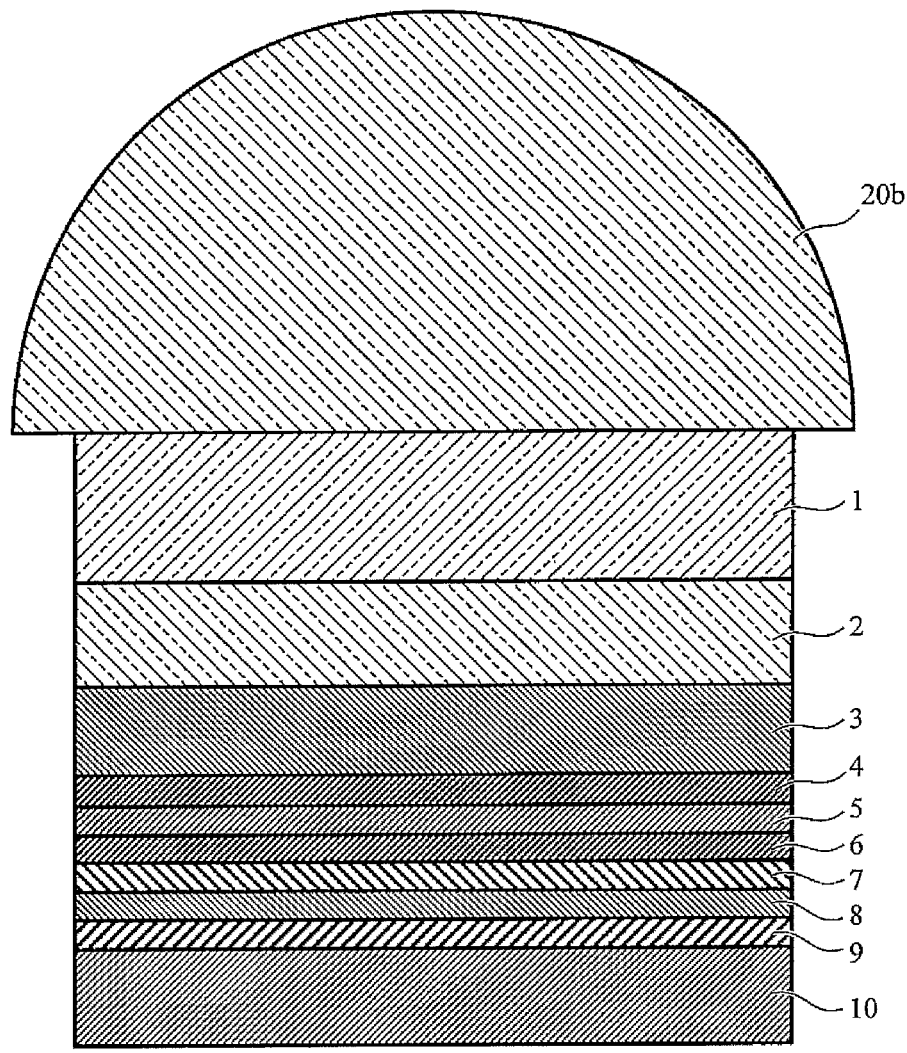
FIG. 7 is a view illustrating the structure of a deep ultraviolet LED obtained by bonding a quartz glass lens to an LED having a transparent p-AlGaN contact layer.

FIG. 7 illustrates the structure of an AlGaN-based deep ultraviolet LED with a design wavelength λ of 280 nm as an example of a deep ultraviolet LED in accordance with the second embodiment of the present invention. As illustrated in FIG. 7, the AlGaN-based deep ultraviolet LED in accordance with this embodiment has, instead of a sapphire lens, a quartz glass lens 20b on the sapphire substrate 1 in the structure of FIG. 2A.

Figure 8:
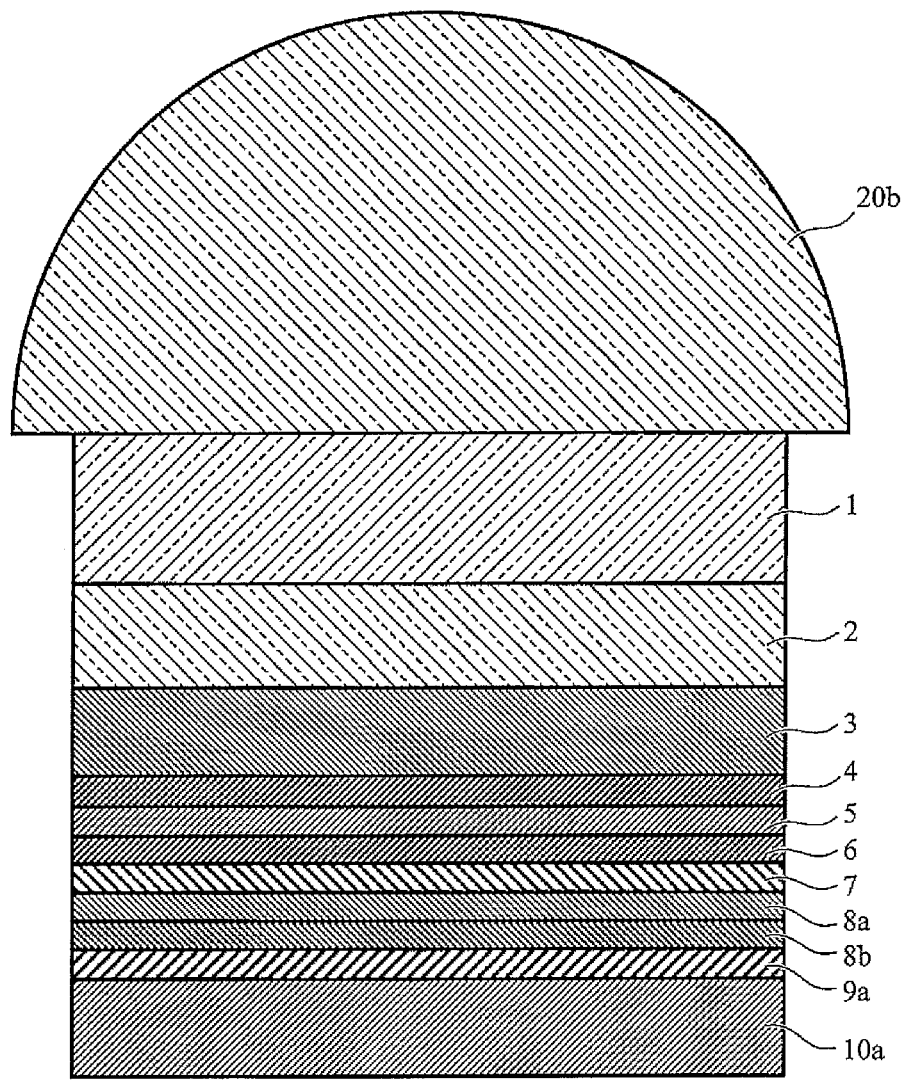
FIG. 8 is a view illustrating the structure of a deep ultraviolet LED obtained by bonding a quartz glass lens to the conventional LED having a p-GaN contact layer.

FIG. 8 is a view illustrating an exemplary structure including a p-GaN contact layer in the conventional deep ultraviolet LED. The structure in FIG. 8 is a structure obtained by providing the quartz glass lens 20b instead of a sapphire lens on the sapphire substrate 1 in the structure of FIG. 4.

Figure 9:
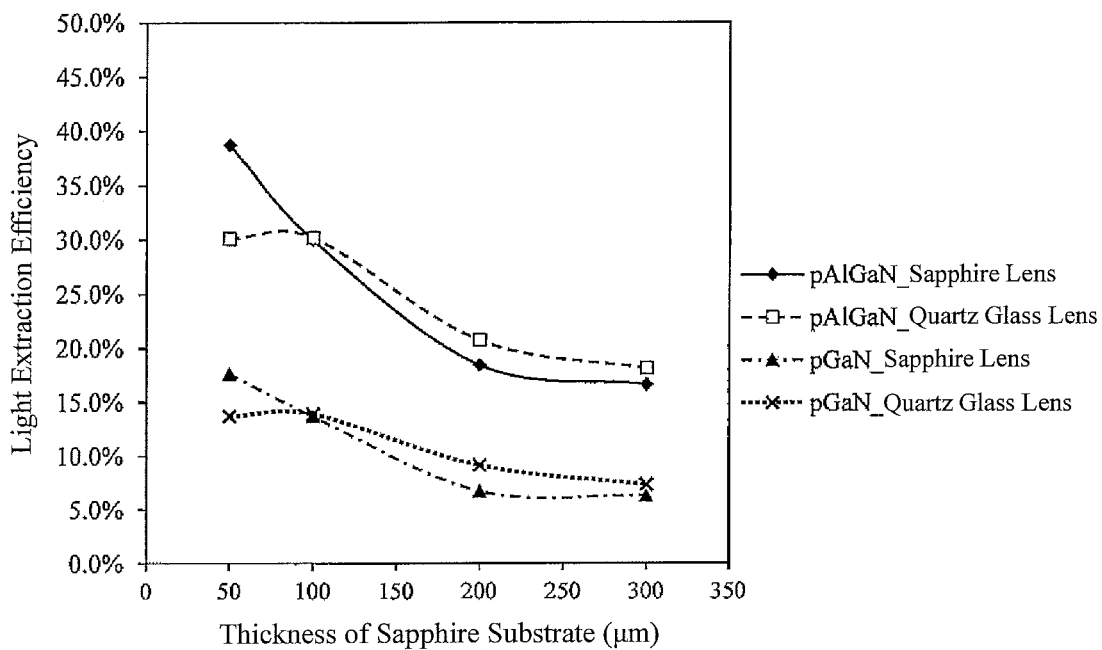
FIG. 9 are views illustrating the relationship between the refractive index of a bonded lens (an inscribed circle) and the LEE as determined using the ray-tracing method.

Herein, the relationship between the difference in the refractive index of the lenses resulting from the difference in the material used (sapphire and quartz) and the light extraction efficiency is verified. As in the first embodiment, a computation model was created and analysis was conducted using the ray-tracing method (see Table 2). The results are shown in FIG. 9 (when the radius of the lens corresponds to the radius of an inscribed circle) and FIG. 10 (when the radius of the lens corresponds to the radius of a circumscribed circle).

TABLE 2

Computation model for ray-tracing method

| Element Size: 300 μm□ | p-AlGaN Quartz Glass Lens | p-GaN Quartz Glass Lens |
|---|---|---|
| Radius of Quartz Glass Lens (Inscribed Circle) | 150 μm | 150 μm |
| Radius of Quartz Glass Lens (Circumscribed Circle) | 220 μm | 220 μm |
| Thickness of Sapphire Substrate | 50 to 300 μm | 50 to 300 μm |
| Thickness of AlN Buffer Layer | 4 μm | 4 μm |
| Thickness of p-GaN Contact Layer | — | 1 μm |
| Thickness of Transparent p-AlGaN Contact Layer | 1 μm | — |

The results of the analysis conducted using the ray-tracing method shown in FIG. 9 (when the radius of the lens corresponds to the radius of an inscribed circle) and FIG. 10 (when the radius of the lens corresponds to the radius of a circumscribed circle) are as follows.

1) The light extraction efficiency of each of the LED having the quartz glass lens bonded thereto and having the p-GaN contact layer and the LED having the quartz glass lens bonded thereto and having the transparent p-AlGaN contact layer increases in inverse proportion to the substrate thickness up to a substrate thickness of 100 μm.

2) The light extraction efficiency of the LED including the transparent p-AlGaN contact layer is higher than that of the LED including the p-GaN contact layer by two times or more.

The results of the first embodiment to the second embodiment are summarized as follows. The following results are obtained when the radius of the lens is greater than or equal to the radius of an inscribed circle of the rear surface of the substrate to which the lens is bonded and is about equal to the radius of a circumscribed circle thereof.

1) When a lens is bonded to the substrate, the light extraction efficiency of each of the LED including the transparent p-AlGaN contact layer and the LED including the p-GaN contact layer increases in inverse proportion to the substrate thickness.

2) The above effect is more prominent as the refractive index of the lens is closer to that of the substrate.

3) The light extraction efficiency of the LED including the transparent p-AlGaN contact layer is double or more that of the LED including the p-GaN contact layer.

4) When the substrate has no lens bonded thereto, the light extraction efficiency of each of the LED including the transparent p-AlGaN contact layer and the LED including the p-GaN contact layer does not depend on the substrate thickness.

Third Embodiment

Figure 11A:
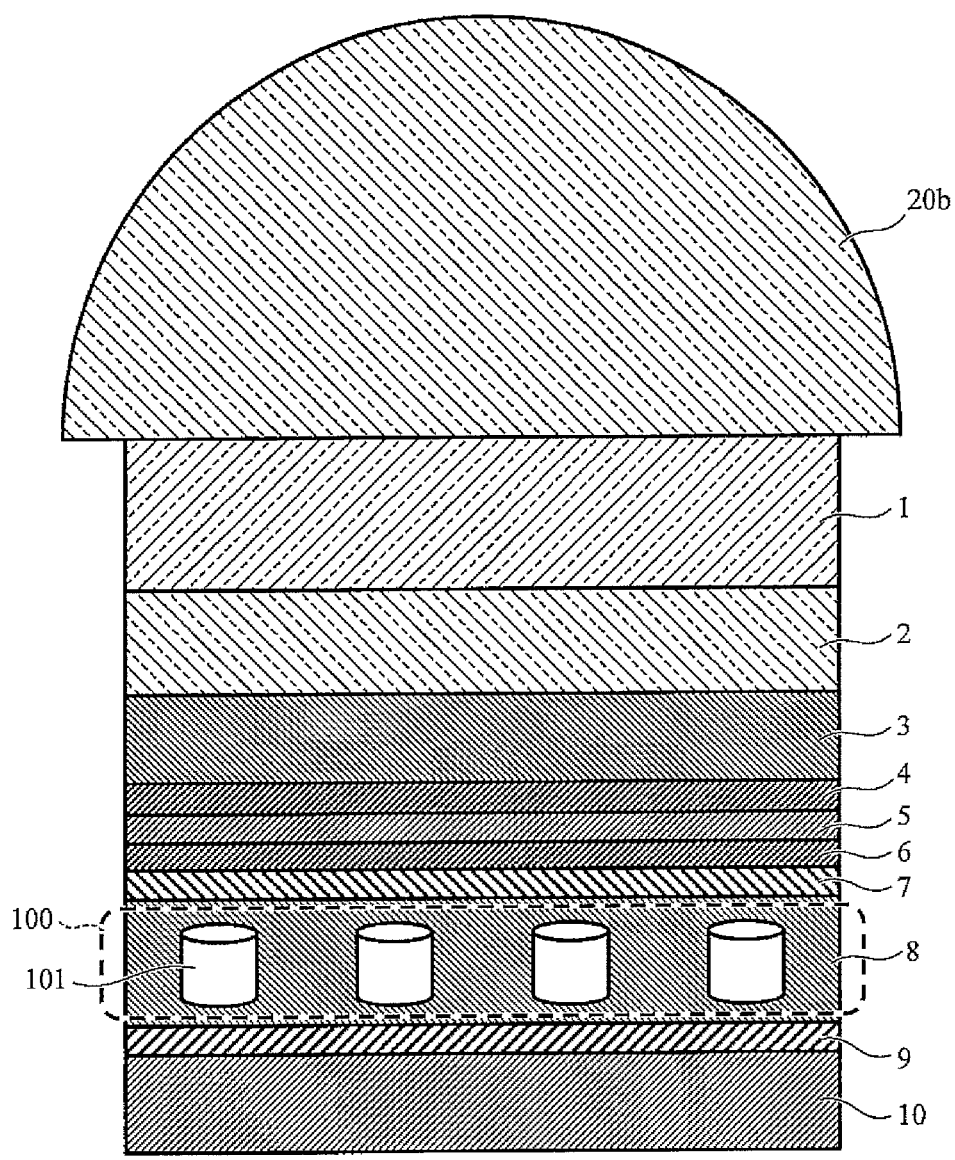
FIG. 11A is a view illustrating the structure of a deep ultraviolet LED having a transparent p-AlGaN contact layer, reflecting photonic crystals, and a quartz glass lens bonded to the LED.
Figure 11B:
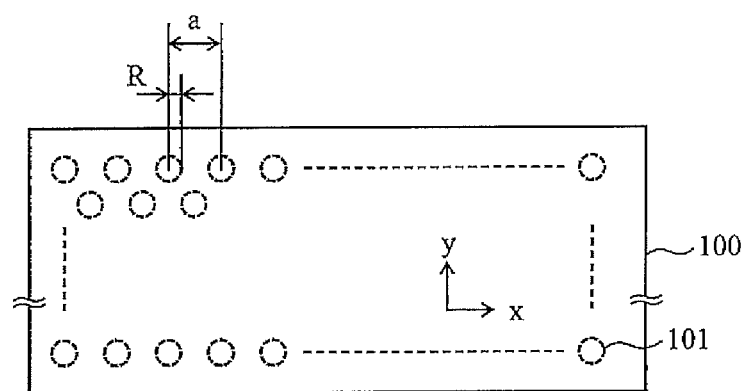
FIG. 11B is a plan view illustrating an exemplary configuration of the reflecting photonic crystals in FIG. 11A.
Figure 11C:
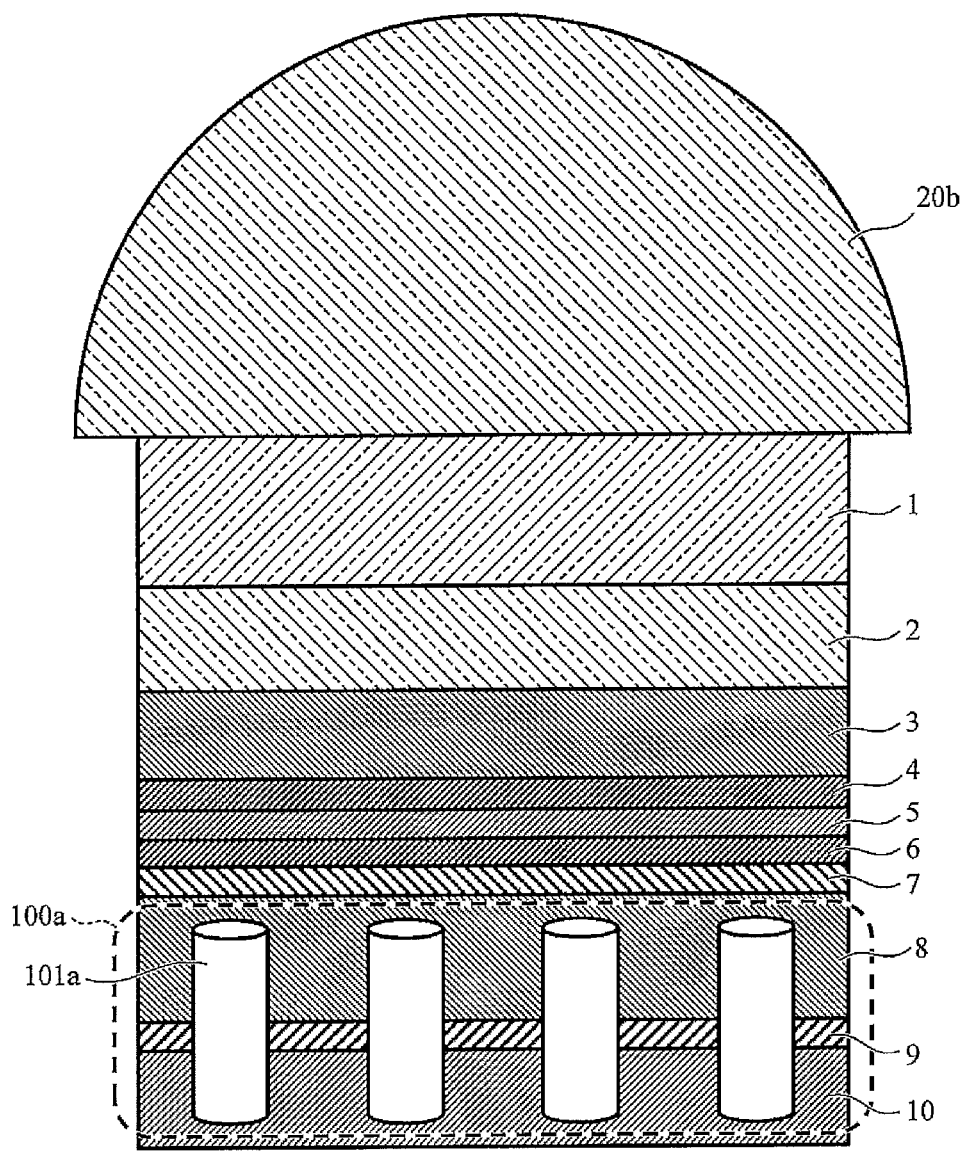
FIG. 11C is a view illustrating the structure of a modified example of the deep ultraviolet LED in FIG. 11A.

FIGS. 11A, 11B, and 11C each illustrate the structure of an AlGaN-based deep ultraviolet LED with a design wavelength λ of 280 nm as an example of a deep ultraviolet LED in accordance with the third embodiment of the present invention. As illustrated in FIG. 11A, the AlGaN-based deep ultraviolet LED in accordance with this embodiment includes a photonic crystal periodic structure 100 and photonic crystals (holes) 101 in addition to a quartz glass lens 20b, a sapphire substrate 1, an AlN buffer layer 2, an n-AlGaN layer 3, a barrier layer 4, a quantum well layer 5, a barrier layer 6, an electron blocking layer 7, a transparent p-AlGaN contact layer 8, an ultrathin Ni layer 9, and an Al reflecting electrode layer 10. In FIG. 11A, the photonic crystal periodic structure 100 is formed in the range of the thickness direction of the transparent p-AlGaN contact layer 8.

The photonic crystal periodic structure 100 is, for example, a first structure obtained by forming a structure with a low refractive index in a medium with a high refractive index, and is, for example, a structure having holes 101 formed therein. As exemplarily illustrated in FIG. 11B, the holes 101 are defined by the radius R, the period a, and the depth h (not illustrated) on the two-dimensional plane.

Figure 12:
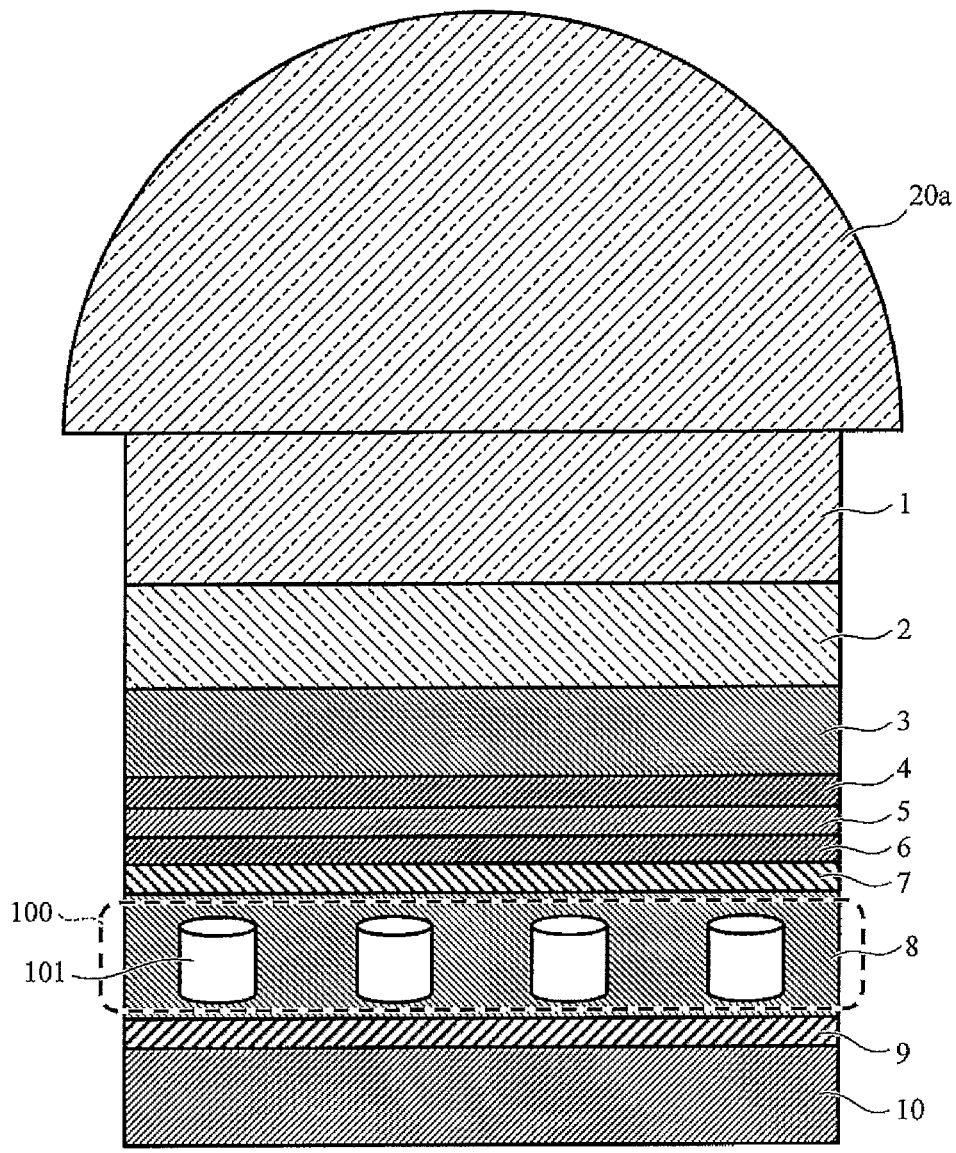
FIG. 12 is a view illustrating the structure of a deep ultraviolet LED obtained by replacing the quartz glass lens in the LED of FIG. 11 with a sapphire lens.

A deep ultraviolet LED illustrated in FIG. 12 includes a photonic crystal periodic structure 100 and photonic crystals (holes) 101 in addition to a sapphire lens 20a, a sapphire substrate 1, an AlN buffer layer 2, an n-AlGaN layer 3, a barrier layer 4, a quantum well layer 5, a barrier layer 6, an electron blocking layer 7, a transparent p-AlGaN contact layer 8, an ultrathin Ni layer 9, and an Al reflecting electrode layer 10. In FIG. 12, the photonic crystal periodic structure 100 is formed in the range of the thickness direction of the transparent p-AlGaN contact layer 8.

The deep ultraviolet LED is characterized by having the Al reflecting electrode layer 10, the ultrathin Ni layer (with a thickness of about 1 nm) 9, and the transparent p-AlGaN contact layer 8, which is transparent to light with the wavelength λ, that are arranged in this order from a side opposite to the sapphire substrate 1, and having the photonic crystal periodic structure 100 with a photonic band gap (PBG) provided at least in the thickness direction of the transparent p-AlGaN contact layer 8 or in the range of the thickness direction in a region of from the transparent p-AlGaN contact layer 8 and including the interface between the ultrathin Ni layer 9 and the Al reflecting electrode layer 10, and also having bonded to the rear surface of the sapphire substrate 1 the hemispherical quartz glass lens 20b (FIG. 11A) or sapphire lens 20a (FIG. 12) that is transparent to light with the wavelength λ and has a radius of greater than or equal to the radius of an inscribed circle of the sapphire substrate 1 and about equal to the radius of a circumscribed circle thereof.

The photonic crystal periodic structure does not reach the interface between the transparent p-AlGaN contact layer 8 and the electron blocking layer 7. This is because unless a portion with a thickness of about 30 to 50 nm is left for the photonic crystal periodic structure 100, the electron blocking layer 7 may become damaged due to dry etching for forming the photonic crystal periodic structure 100.

As a modified example of this embodiment seen from a perspective of the actual device production process, it is also possible to provide a structure in which the photonic crystal periodic structure reaches the inside of the Al reflecting electrode layer 10 by penetrating the ultrathin Ni layer 9 but does not reach the interface between the Al reflecting electrode layer 10 and the air, as illustrated in FIG. 11C.

With the reflecting photonic crystal periodic structure 100 having the PBG, light with the wavelength λ can be efficiently reflected through multiple reflections.

Even when a slight amount of light has passed through the transparent p-AlGaN contact layer 8, since the amount of light absorbed by the ultrathin Ni layer 9 is small and the Al reflecting electrode layer 10 has reflectivity as high as 90% with respect to the light, higher LEE can be achieved in comparison with when an Al reflecting electrode layer is used alone without the photonic crystal periodic structure 100 provided.

Further, the most part of light reflected by the reflecting photonic crystal periodic structure 100 becomes incident on the front surface of the sapphire substrate 1 and is then emitted to the air from the transparent lens 20a or 20b bonded to the rear surface of the sapphire substrate 1. Since the lens 20a or 20b is a hemispherical lens, the light is emitted in the direction of the normal to the lens surface even when there is a distribution in the angle of incidence of light on the sapphire substrate 1. Therefore, total internal reflection can be minimized and high LEE can be obtained.

In addition, the LEE enhancement effect can be increased with the synergistic effect of the hemispherical lens 20a or 20b, and the photonic crystal periodic structure 100, the transparent p-AlGaN contact layer 8, the ultrathin Ni layer 9, and the Al reflecting electrode layer 10.

In the aforementioned structure with the photonic crystal periodic structure 100, TE polarization and TM polarization of deep ultraviolet light with a wavelength of 280 nm emitted from the quantum well layer 5 propagate through the medium while being elliptically polarized. The degree of polarization is 0.29. The photonic crystal periodic structure 100 has a photonic band gap, and is formed as two structures, which include the transparent p-AlGaN contact layer 8 and the air, having different refractive indices in a bottom face portion. Provided that the average refractive index of the two structures is nav (nav is a function of the period a and the radius R of each circular void) and the period is a, when the photonic crystal periodic structure satisfies the Bragg scattering condition indicated by the following Formula (1), TE polarization that has become incident on the photonic crystal periodic structure is reflected, while TM polarization is passed through the photonic crystal periodic structure.

$$m\lambda/n_{av}=2a \tag{1}$$

Then, using R/a, which is the ratio of the radius R of each circular void to the period a, the design wavelength λ, and dielectric constants $\varepsilon_1$ and $\varepsilon_2$ of the two structures corresponding to the respective refractive indices $n_1$ and $n_2$, photonic band structures for TE polarization and TM polarization are analyzed using the plane wave expansion method. Specifically, the dielectric constants $\varepsilon_1$ and $\varepsilon_2$ are input to the Maxwell's wave equation indicated by the following Formulae (2) and (3) to compute eigen values.

[Math. 1]

TE polarization (2)

$$\sum_{G'} \varepsilon^{-1}(G-G')(k+G)*(k+G')H(G') = \omega^2/c^2 H(G)$$

[Math. 2]

TM polarization (3)

$$\sum_{G'} \varepsilon^{-1}(G-G')|k+G||k+G'|E'(G') = \omega^2/c^2 E'(G)$$

Herein, $E'=|k+G|E(G)$, $\varepsilon$ denotes the relative dielectric constant, G denotes the reciprocal lattice vector, k denotes the wave number, $\omega$ denotes the frequency, c denotes the light velocity, and E denotes the electric field.

Figure 13:
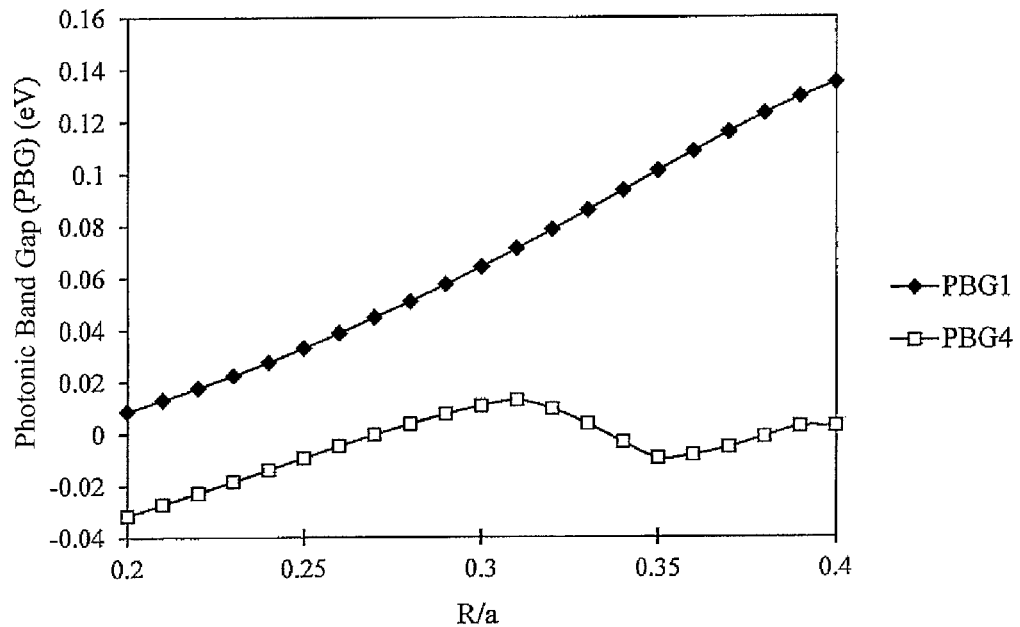
FIG. 13 is a graph illustrating the relationship between a photonic band gap for TE light and R/a of hole-photonic crystals.

R/a is a variable, and a photonic band structure for TE polarization is determined with R/a changed in increments of 0.01 in the range of $0.20 \leq R/a \leq 0.40$. Then, assuming that a photonic band gap between a first photonic band ($1^{st}$ PB) and a second photonic band ($2_{nd}$ PB) is PBG 1 and a photonic band gap between a seventh photonic band ($7^{th}$ PB) and an eighth photonic band ($8_{th}$ PB) is PBG 4, the relationship between each PBG and R/a is determined. The results are shown in FIG. 13.

Figure 14:
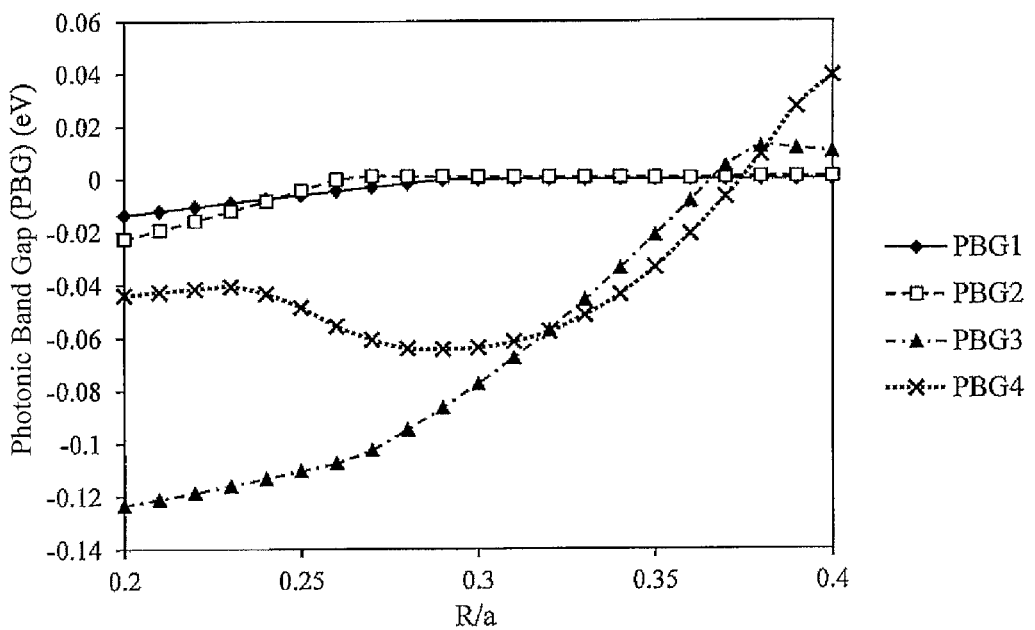
FIG. 14 is a graph illustrating the relationship between a photonic band gap for TM light and R/a of hole-photonic crystals.

Similarly, a photonic band structure for TM polarization is determined, and assuming that a PBG between a $1_{st}$ PB and a $2_{nd}$ PB is PBG 1, a PBG between a $3_{rd}$ PB and a $4_{th}$ PB is PBG 2, a PBG between a $5_{th}$ PB and a $6_{th}$ PB is a PBG 3; and a PBG between a $7_{th}$ PB and an $8_{th}$ PB is PBG 4, the relationship between each PBG and R/a is determined. The results are shown in FIG. 14.

The state density (ρ) of photonic crystals indicates how many photons can exist at which frequency. In a uniform medium, the state density increases monotonously with respect to the frequency. However, in photonic crystals, $\rho(\omega)=0$ in the frequency region of a photonic band gap. This is due to the reason that the state density changes sharply around the photonic band gap and that the group velocity of shark peaks in the other frequency regions is zero. A representative point of symmetry at which the group velocity becomes zero is a point M where two waves change the propagation direction of light due to Bragg diffraction so as to form stationary waves. The abrupt rate of change of the state density is substantially proportional to the size of the photonic band gap.

Herein, the relationship between the size of a photonic band gap and the reflection/transmission effect, and the rate of change of the light extraction efficiency (LEE) of the deep ultraviolet LED are analyzed using the FDTD method so as to obtain the diameter d, the period a, and the depth h of the photonic crystals with which the rate of change of LEE becomes maximum.

Figure 15:
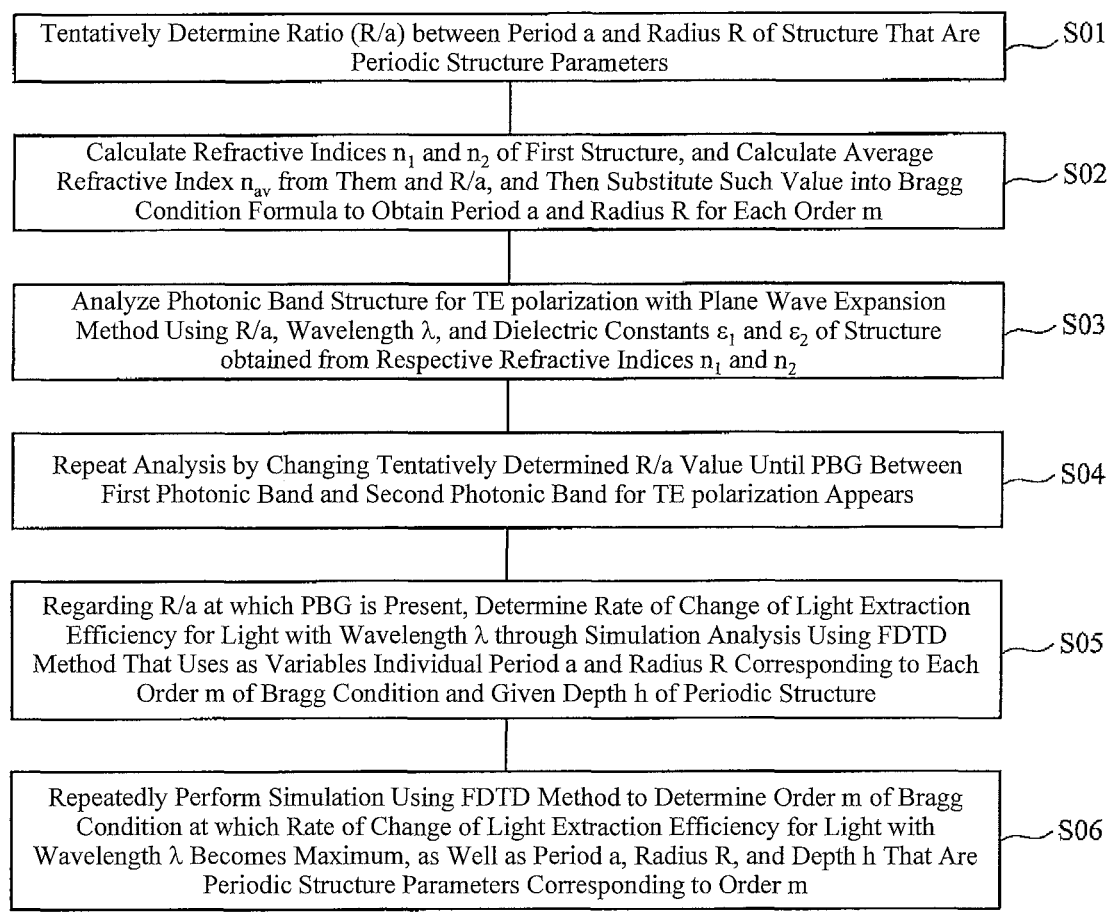
FIG. 15 is a flowchart illustrating an exemplary computation method for designing photonic crystals regarding a method for designing a deep ultraviolet LED having reflecting photonic crystals and a lens bonded to the LED.

FIG. 15 illustrates a more detailed process flow.
(Step S01)
The ratio (R/a) between the period a and the radius R of the structure, which are the periodic structure parameters, is tentatively determined.
(Step S02)
The refractive indices $n_1$ and $n_2$ of a first structure are computed, and the average refractive index $n_{av}$ is computed from them and R/a, and then, the average refractive index $n_{av}$ is substituted into the formula of the Bragg condition so as to obtain the period a and the radius R for each order m.
(Step S03)
A photonic band structure for TE polarization is analyzed with the plane wave expansion method using R/a, the wavelength $\lambda$, and the dielectric constants $\varepsilon_1$ and $\varepsilon_2$ of the structure obtained from the respective refractive indices $n_1$ and $n_2$.
(Step S04)
The analysis is repeated by changing the tentatively determined R/a value until the PBG between the first photonic band and the second photonic band for TE polarization appears.
(Step S05)
Regarding R/a at which the PBG appears, the rate of change of the light extraction efficiency for light with the wavelength $\lambda$ is determined through simulation analysis using the FDTD method that uses as variables the individual period a and radius R corresponding to each order m of the Bragg condition and a given depth h of the periodic structure.
(Step S06)
Simulation using the FDTD method is repeatedly performed so as to determine the order m of the Bragg condition at which the rate of change of the light extraction efficiency for light with the wavelength $\lambda$ becomes maximum, as well as the period a, the radius R, and the depth h that are the periodic structure parameters corresponding to the order m.

It is acceptable as long as such values are determined by selecting the order m at which the values of the wavelength $\lambda$ and the period a are close in the Bragg scattering formula (Formula (1)). In addition, the depth h is desirably greater than or equal to the period a.

Next, this embodiment will be described more specifically.

First, for setting the photonic crystal parameters, the order m of the Bragg scattering formula (Formula (1): $m\lambda/n_{av}=2a$) is determined.

For example, $n_{av}$ when R/a=0.40 is computed using the following formula.

$$n_{av}=[n_2^2+(n_1^2-n_2^2)(2\pi/3^{0.5})(R/a)^2]^{0.5}=1.838 \quad (4)$$

Herein, $n_1=1.0$ and $n_2=2.583$.

Next, $\lambda=280$ nm, $n_{av}=1.838$, and m=1 are substituted into Formula (1) so that the period a=76 nm at m=1 is determined.

Next, a computation model in Table 3 was created through designing of photonic crystals by determining the diameter d and the period a for each R/a by changing R/a as a variable in increments of 0.05 in the range of $0.20 \leq R/a \leq 0.40$, so that analysis was conducted using the FDTD method. It should be noted that the order m=3, 4 was selected since the period of the photonic crystals is desirably close to the light emission wavelength.

TABLE 3

| Computation model for FDTD | | |
|---|---|---|
| Element Size: 6.02 μm□ | Solid Angle: 1.66 | Solid Angle: 3.85 |
| Radius of Sapphire Lens (Inscribed Circle) | 6.0 μm | 6.0 μm |
| Radius of Sapphire Lens (Circumscribed Circle) | 8.5 μm | 8.5 μm |
| Thickness of Sapphire Substrate | 5.0 μm | 1.0 μm |
| AlN Buffer Layer | 1.0 μm | 1.0 μm |
| n-AlGaN Buffer Layer | 500 nm | 500 nm |

TABLE 3-continued

Computation model for FDTD

| Element Size: 6.02 μm☐ | Solid Angle: 1.66 | Solid Angle: 3.85 |
|---|---|---|
| Barrier Layer | 20 nm | 20 nm |
| Well Layer | 20 nm | 20 nm |
| Barrier Layer | 20 nm | 20 nm |
| Electron Blocking Layer | 40 nm | 40 nm |
| Transparent p-AlGaN Contact Layer | 400 nm | 400 nm |
| R/a of Photonic Crystals | 0.2, 0.25, 0.3, 0.35, 0.4 | 0.2, 0.25, 0.3, 0.35, 0.4 |
| Ni Layer | 0 nm | 0 nm |
| Al Reflecting Electrode Layer | 220 nm | 220 nm |

Figure 16:
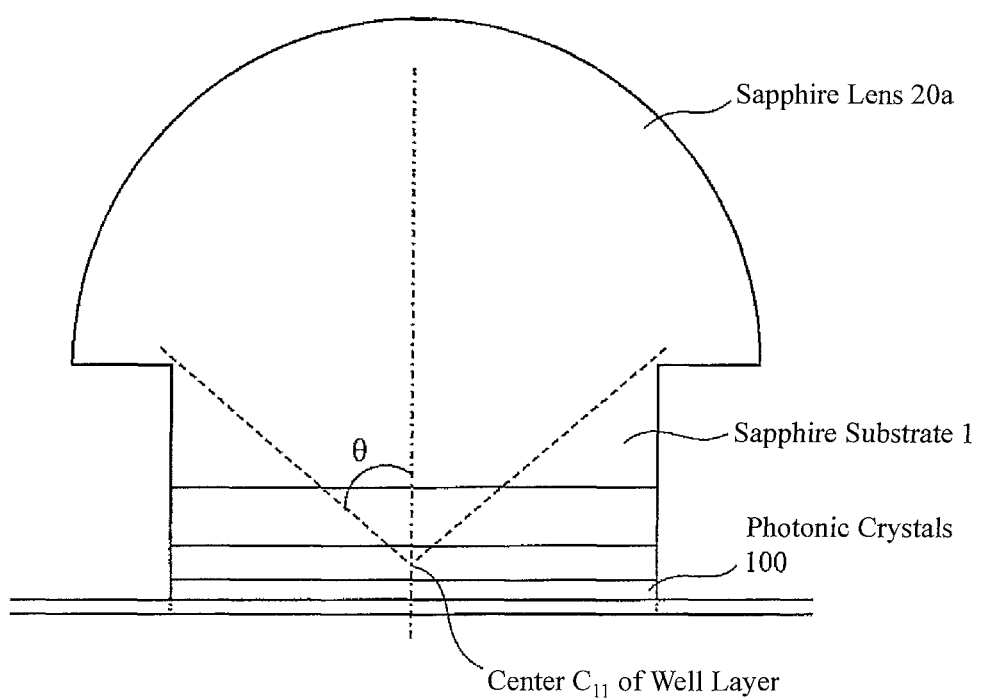
FIG. 16 is a view illustrating the definition of the solid angle in a computation model for the FDTD having photonic crystals and a bonded lens.

Herein, it is intended to optimize the light extraction efficiency with a photonic-crystal LED having a sapphire lens bonded thereto. Typically, the analysis region of the ray-tracing method is greater than or equal to submillimeters and the minimum film thickness is limited to 1 μm. However, the method has an advantage of being capable of computing the light extraction efficiency directly from the ratio of the number of light beams reaching the detector to the output of the light source in the LED structure. Meanwhile, the FDTD method directly computes a change in the electromagnetic field with time and thus cannot directly compute the light extraction efficiency. Therefore, the FDTD method computes the rate of change of the light extraction efficiency. The analysis region of the FDTD method is about subnanometers to several ten micrometers, though it greatly depends on the computational resources. Regarding the structure of a target LED, an element (several hundred micrometers) is mounted within a package (several millimeters). Therefore, for high-accuracy analysis of the light extraction efficiency, the analysis is preferably performed through comparison and interpolation between the two analysis methods. FIG. 16 illustrates a computation model of a photonic-crystal LED having a sapphire lens bonded thereto for the FDTD. The normal on the dotted line passes through the center $C_{11}$ of the quantum well layer. Provided that the angle of a portion surrounded by the normal and the tangent to an inscribed circle of the sapphire lens 20a bonded to the sapphire substrate 1, which is drawn from the center $C_{11}$ of the quantum well layer, is defined as θ, the solid angle (Sr) is determined by $Sr=2\pi(1-\cos \theta)$. When computation models of two analysis methods that differ in the size by two digits or more are compared, analysis for which the light propagation direction is taken into consideration can be performed based on the solid angle.

It should be noted that the center $C_{11}$ of the quantum well layer refers to the center of the inscribed circle C1 or the circumscribed circle C2 (FIG. 2B), and refers to the intermediate portion of the quantum well (active layer) 5 in the thickness direction.

In the computation model in Table 3, the solid angles are 1.66 and 3.85. When the substrate thickness is computed from the element size and the radius of the sapphire lens of each of the computation models used for the ray-tracing method in FIGS. 9 and 10 using the solid angles, the substrate thicknesses are found to be 160 μm and 60 μm when the solid angles are 1.66 and 3.85, respectively.

Figure 10:
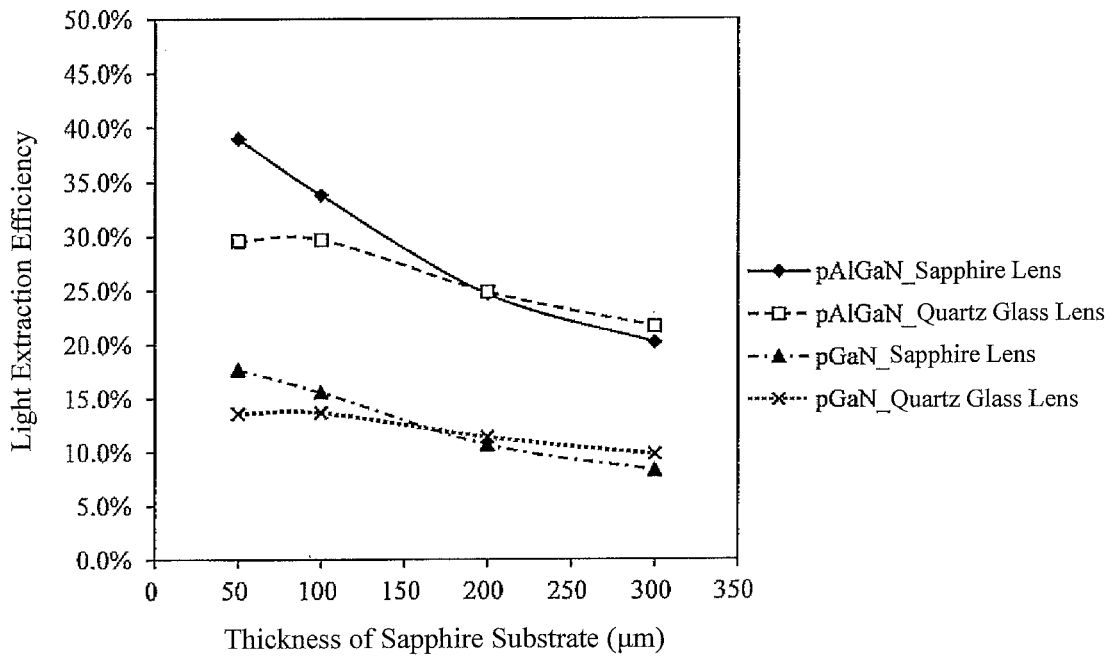
FIG. 10 are views illustrating the relationship between the refractive index of a bonded lens (a circumscribed circle) and the LEE as determined using the ray-tracing method.
Figure 17A:
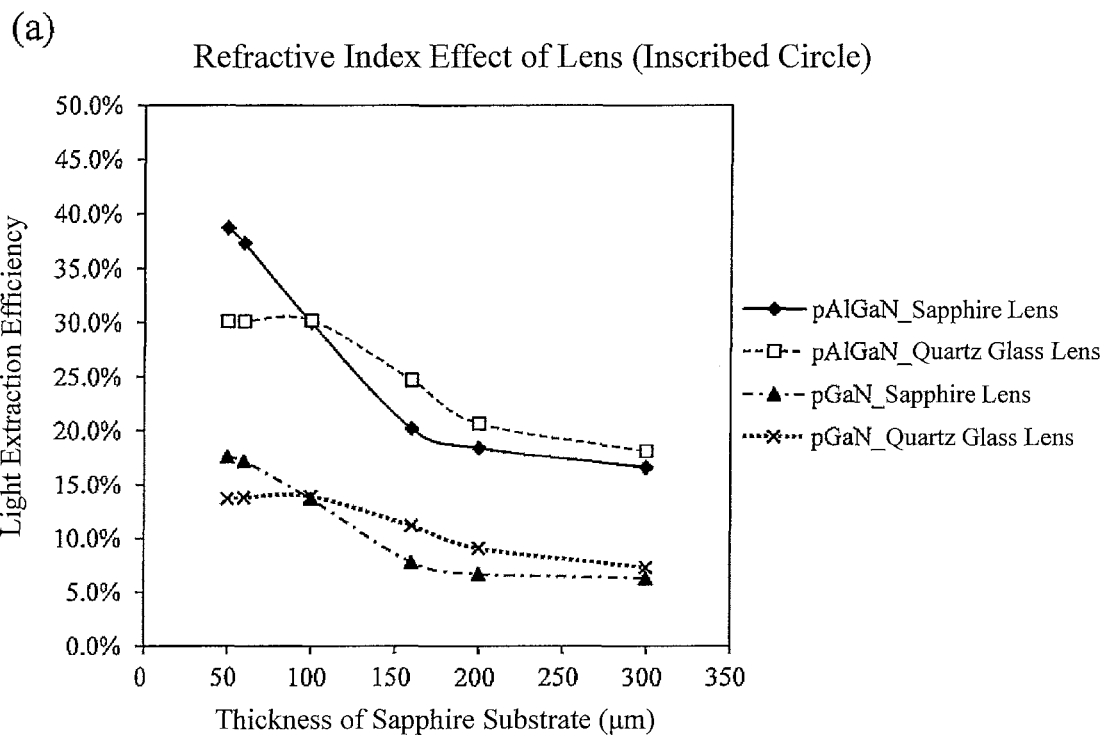
FIG. 17A are views obtained by adding substrate thicknesses corresponding to solid angles of 1.66 and 3.85 to the substrate thickness on the abscissa axis of FIG. 9.
Figure 17B:
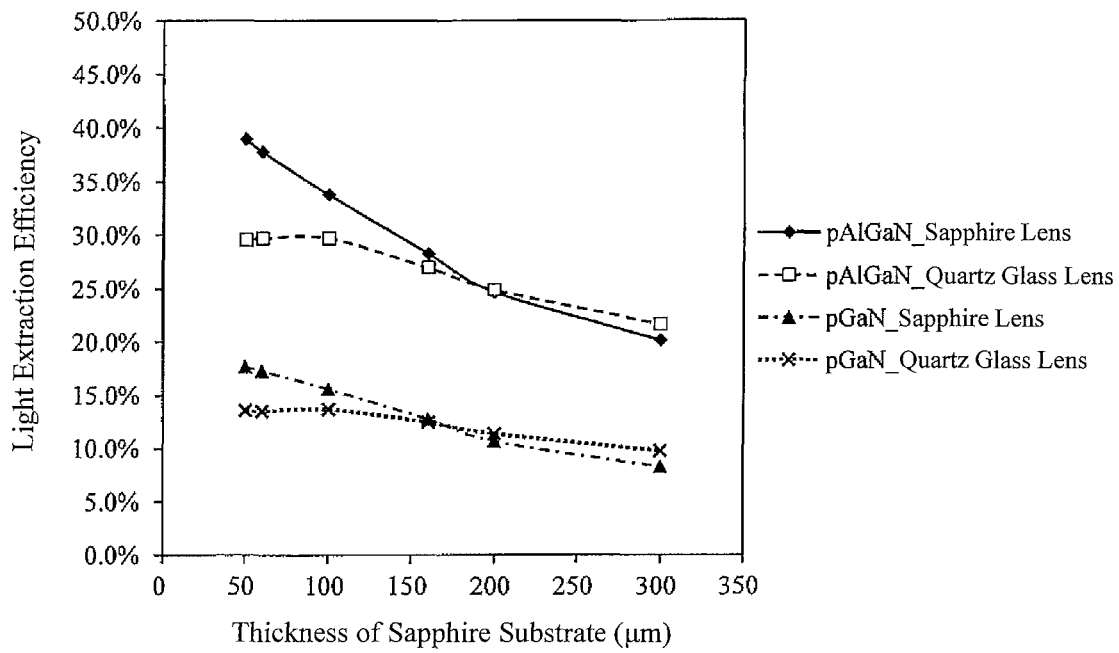
FIG. 17B are views obtained by adding substrate thicknesses corresponding to solid angles of 1.66 and 3.85 to the substrate thickness on the abscissa axis of FIG. 10.

Herein, determining the light extraction efficiency when the substrate thicknesses of the computation models used in FIGS. 9 and 10 are 60 μm and 160 μm for each of the LED including p-AlGaN and the sapphire lens, the LED including p-AlGaN and the quartz glass lens, the LED including p-GaN and the sapphire lens, and the LED including p-GaN and the quartz glass lens, using the ray-tracing method and adding them to FIGS. 9 and 10 can obtain FIGS. 17A and 17B. In addition, replacing the substrate thicknesses in FIGS. 17A and 17B with the solid angles can obtain the relationship between the light extraction efficiency and the solid angle in FIGS. 18A and 18B. From the drawings, it is found that the solid angle and the light extraction efficiency have a proportional relationship at a solid angle of up to 2.5 in each case. In particular, when a sapphire lens is bonded to an LED, the upper limit value of the solid angle is increased.

The solid angle of 1.66 is the point of inflection at which the light extraction efficiency increases rapidly in the computation model. The solid angle represents the surface area, and the surface area and the light extraction efficiency have a substantially proportional relationship. Therefore, since the surface area increases at and following the point of inflection of 1.66, the light extraction efficiency also increases correspondingly. That is, the solid angle represented by $Sr=2\pi(1-\cos \theta)$ is preferably greater than or equal to the solid angle corresponding to the point of inflection at which the light extraction efficiency dependent on the solid angle increases.

First, the computation results of the FDTD are considered. FIG. 19A (when the radius of the sapphire lens is the radius of an inscribed circle) and FIG. 19B (when the radius of the sapphire lens is the radius of a circumscribed circle) each illustrate a graph of the rate of change of the total output value (far field) at each R/a of Table 3. Further, FIG. 20A (when the radius of the sapphire lens is the radius of an inscribed circle) and FIG. 20B (when the radius of the sapphire lens is the radius of a circumscribed circle) each illustrate a radiation pattern of the total output value (far field) at each R/a.

From the aforementioned results, the tendency of the LED having the sapphire lens bonded thereto and having photonic crystals in its transparent p-AlGaN contact layer in which the radius of the lens is greater than or equal to the radius of an inscribed circle and is about equal to the radius of a circumscribed circle is as follows.

1) When the order m=3, the rate of change of the light extraction efficiency becomes maximum at an R/a of 0.35 for each solid angle. When m=4, the rate of change of the light extraction efficiency decreases as R/a is greater for each solid angle.

2) Regarding the relationship between the solid angle and the rate of change of the light extraction efficiency, the rate of change of the light extraction efficiency is higher as the solid angle is smaller at each order.

3) Regarding the angular distribution, the distribution of light is concentrated in a portion of less than or equal to 10° with respect to the axial direction as the solid angle is smaller.

From the aforementioned tendency, the optimal photonic crystals have, when the radius of the sapphire lens is the radius of an inscribed circle, the maximum rate of change of the light extraction efficiency at the order m=3 and R/a=0.35, and specifically, the rates of change of the light extraction efficiency are 44% and 42% at the solid angles of 1.66 and 3.85, respectively. Meanwhile, when the radius of the sapphire lens is the radius of a circumscribed circle, the maximum rate of change of the light extraction efficiency is 51% at the order m=3 and R/a=0.35 for each solid angle. Substituting such values into the relationship between the light extraction efficiency and the solid angle in each of FIG. 18A and FIG. 18B can determine the light extraction efficiency at the solid angles of 1.66 and 3.85 as follows.

(When the Radius of the Sapphire Lens is the Radius of an Inscribed Circle)

The solid angle of 1.66: 20.2%×1.44=29.1%

The solid angle of 3.85: 37.3%×1.42=53.0%

(When the Radius of the Sapphire Lens is the Radius of a Circumscribed Circle)

The solid angle of 1.66: 28.3%×1.51=42.7%

The solid angle of 3.85: 37.8%×1.51=57.1%

Figure 21A:
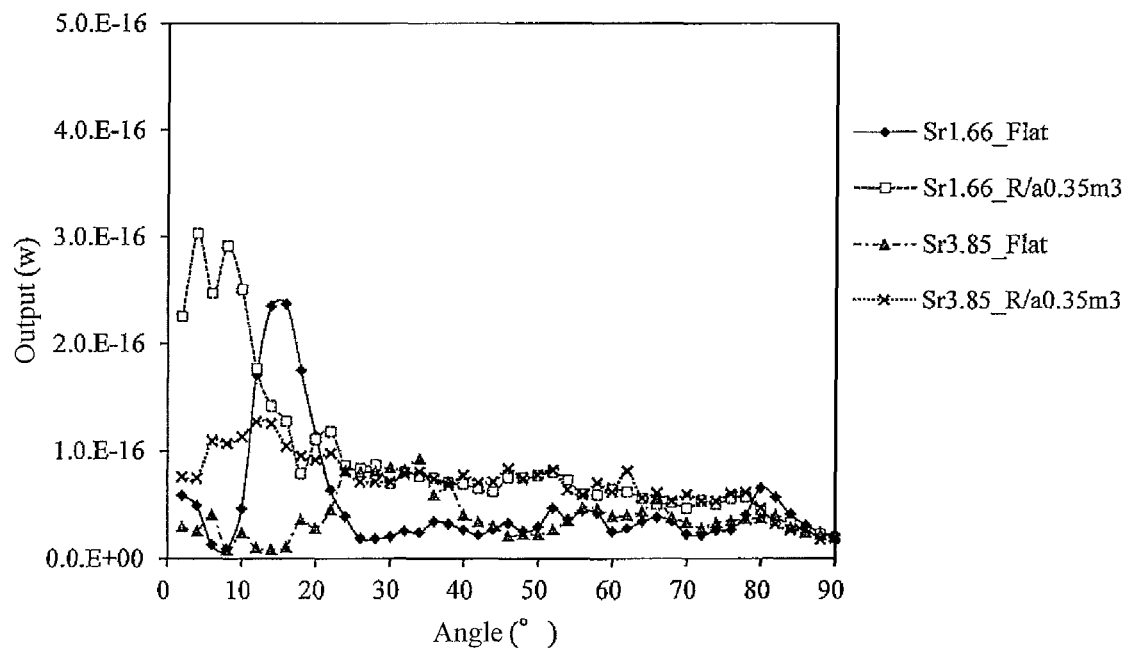
FIG. 21A are views illustrating the rate of change of the light extraction efficiency of an LED having a quartz glass lens bonded thereto (an inscribed circle) and having photonic crystals in its transparent p-AlGaN contact layer, and a radiation pattern.
Figure 21B:
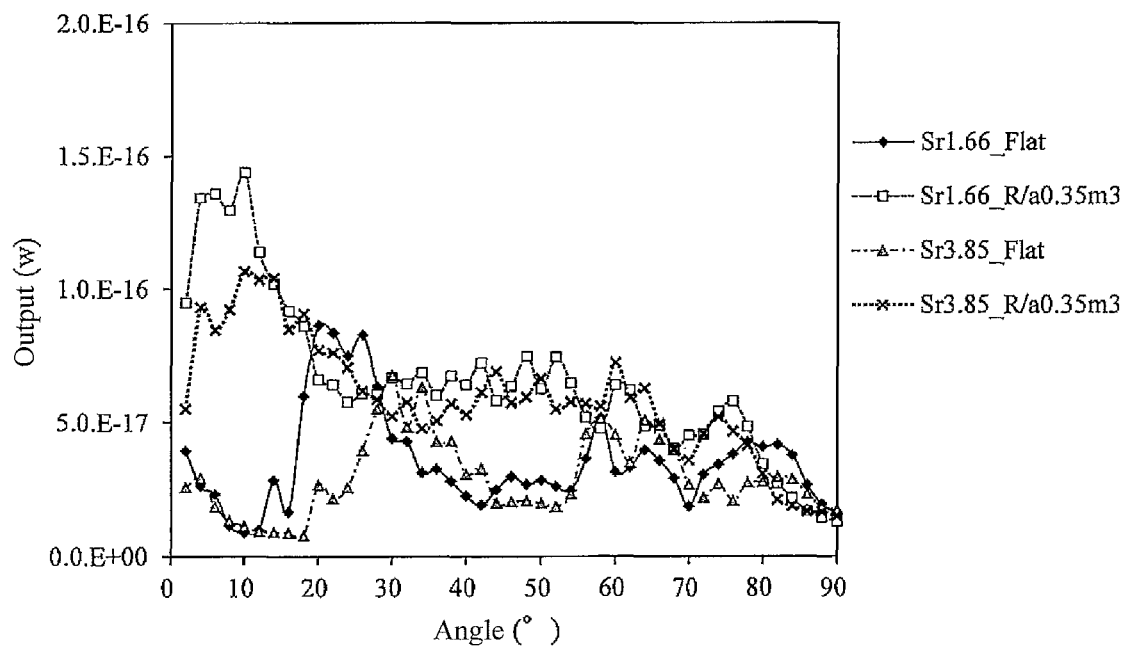
FIG. 21B are views illustrating the rate of change of the light extraction efficiency of an LED having a quartz glass lens bonded thereto (a circumscribed circle) and having photonic crystals in its transparent p-AlGaN contact layer, and a radiation pattern.

Next, the light extraction efficiency of a photonic-crystal LED having a quartz lens bonded thereto is determined. From FIGS. 18A and 18B, it is found that the relationship between the light extraction efficiency and the solid angle is similar to that of a photonic-crystal LED having a sapphire lens bonded thereto. Therefore, a computation model for the order m=3 and R/a=0.35 was created and analysis was conducted using the FDTD method. This computation model corresponds to the structure of the deep ultraviolet LED in FIG. 11A. The analysis results are shown in FIG. 21A (when the radius of the quartz glass lens is the radius of an inscribed circle) and FIG. 21B (when the radius of the quartz glass lens is the radius of a circumscribed circle).

(When the Radius of the Quartz Glass Lens is the Radius of an Inscribed Circle)

The rate of change of the light extraction efficiency at the solid angle of 1.66, R/a=0.35, and m=3 is 52%.

The rate of change of the light extraction efficiency at the solid angle of 3.85 R/a=0.35, and m=3 is 49%.

(When the Radius of the Quartz Glass Lens is the Radius of a Circumscribed Circle)

The rate of change of the light extraction efficiency at the solid angle of 1.66, R/a=0.35, and m=3 is 56%.

The rate of change of the light extraction efficiency at the solid angle of 3.85, R/a=0.35, and m=3 is 61%.

Figure 18A:
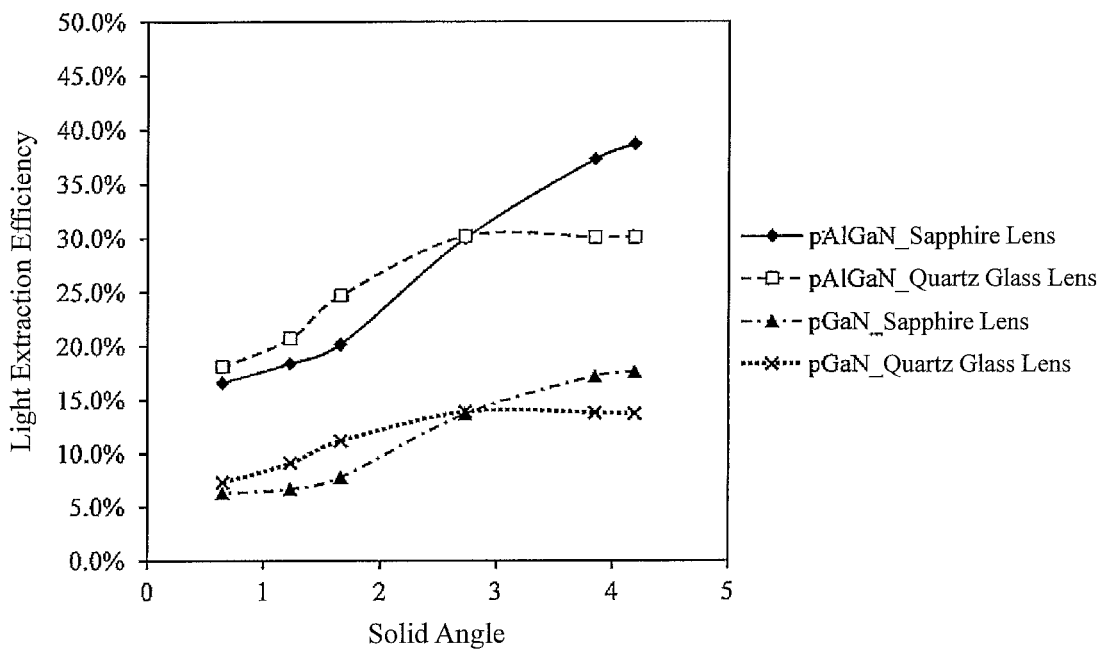
FIG. 18A are views obtained by changing the substrate thickness on the abscissa axis of FIG. 17A to the solid angle.
Figure 18B:
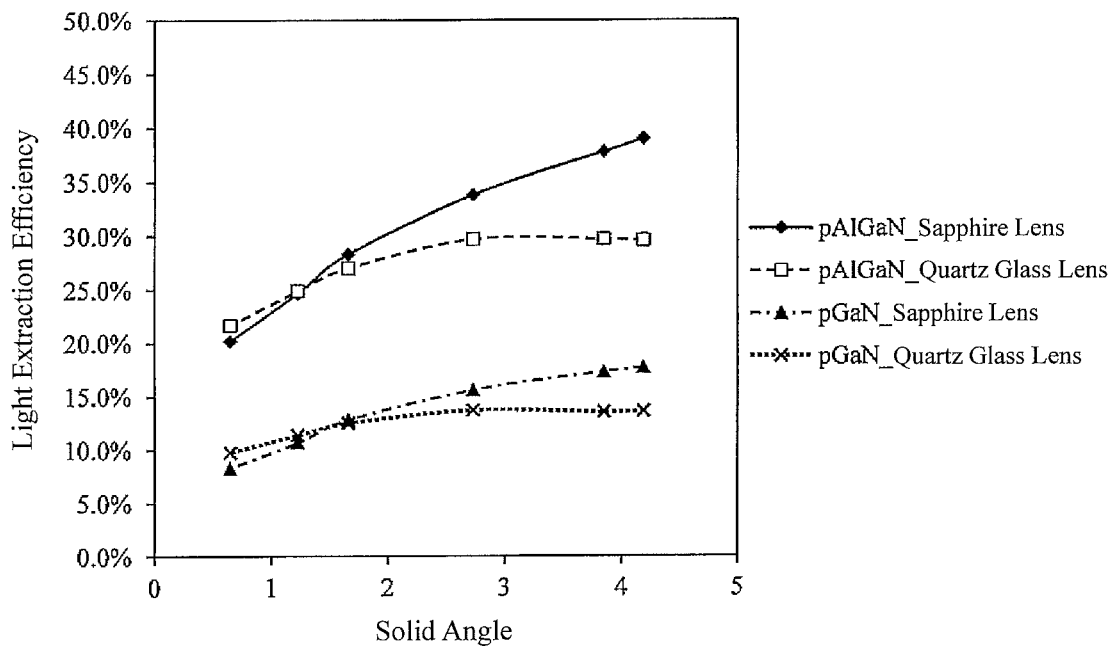
FIG. 18B are views obtained by changing the substrate thickness on the abscissa axis of FIG. 17B to the solid angle.

Herein, substituting the results into the relationship between the light extraction efficiency and the solid angle in each of FIGS. 18A and 18B can obtain the following.

(When the Radius of the Quartz Glass Lens is the Radius of an Inscribed Circle)

The solid angle of 1.66: 24.7%×1.52=37.5%

The solid angle of 3.85: 30.1%×1.49=44.8%

(When the Radius of the Quartz Glass Lens is the Radius of a Circumscribed Circle)

The solid angle of 1.66: 27.0%×1.56=42.1%

The solid angle of 3.85: 29.7%×1.61=47.8%

Fourth Embodiment

Figure 22:
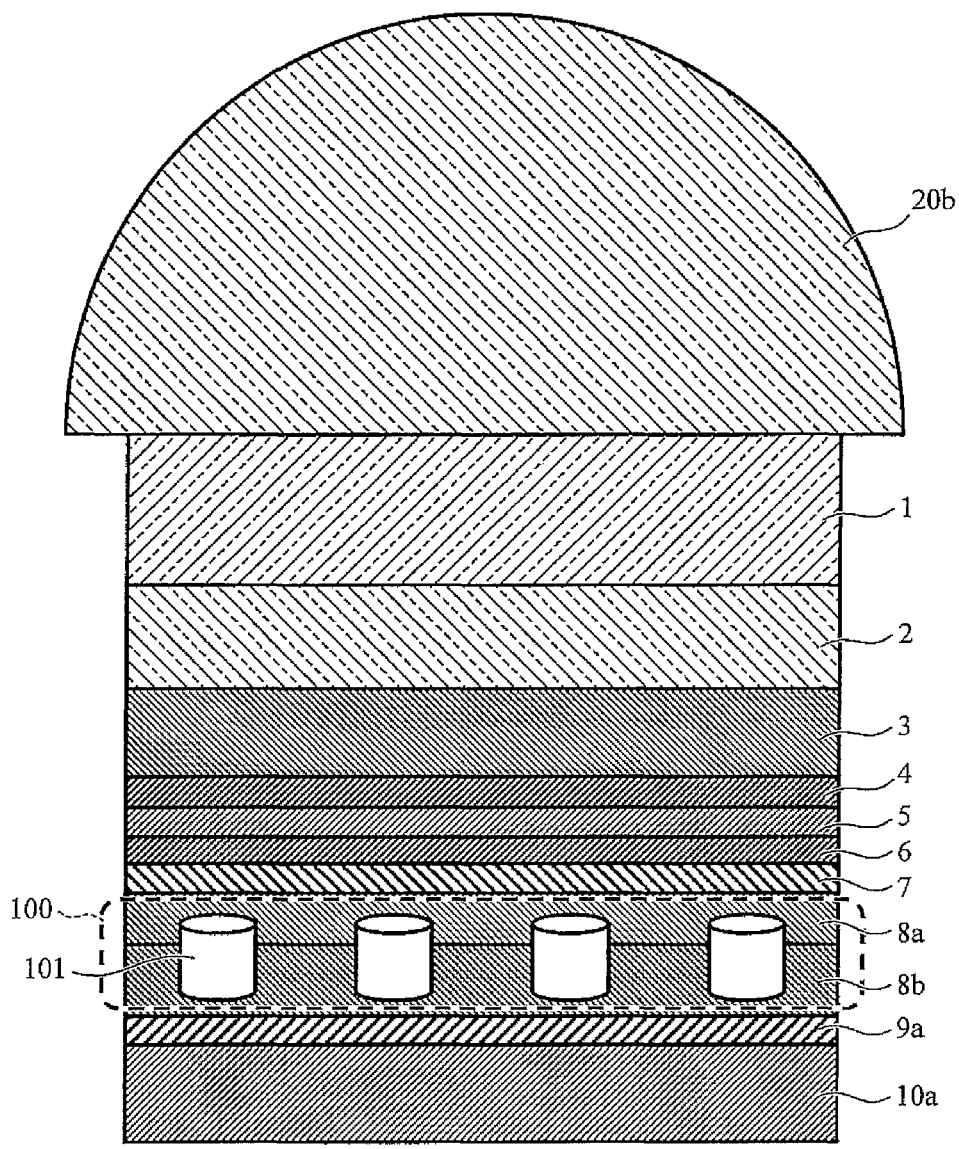
FIG. 22 is a view illustrating the structure of a deep ultraviolet LED obtained by bonding a quartz glass lens to an LED having a reflecting photonic crystal periodic structure in its p-GaN contact layer.

FIG. 22 illustrates the structure of an AlGaN-based deep ultraviolet LED with a design wavelength λ of 280 nm as an example of a deep ultraviolet LED in accordance with the fourth embodiment of the present invention. As illustrated in FIG. 22, the AlGaN-based deep ultraviolet LED in accordance with this embodiment includes a quartz glass lens 20b, a sapphire substrate 1, an AlN buffer layer 2, an n-AlGaN layer 3, a barrier layer 4, a quantum well layer 5, a barrier layer 6, an electron blocking layer 7, a p-AlGaN layer 8a, a p-GaN contact layer 8b, a Ni layer 9a, an Au reflecting electrode 10a, a photonic crystal periodic structure 100, and photonic crystals (holes) 101.

Figure 23:
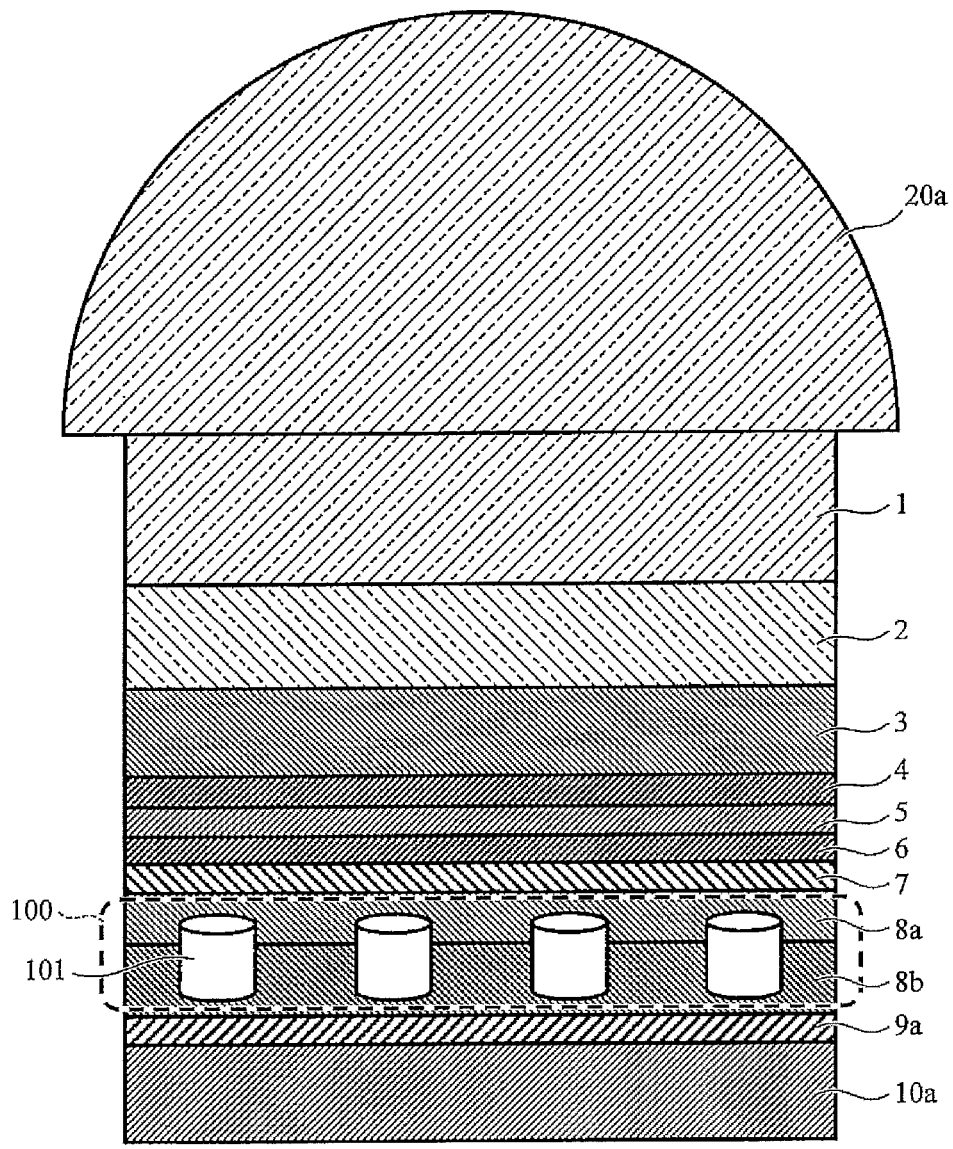
FIG. 23 is a view illustrating the structure of a deep ultraviolet LED obtained by replacing the quartz glass lens in FIG. 22 with a sapphire lens.

In addition, a deep ultraviolet LED illustrated in FIG. 23 includes a sapphire lens 20a, a sapphire substrate 1, an AlN buffer layer 2, an n-AlGaN layer 3, a barrier layer 4, a quantum well layer 5, a barrier layer 6, an electron blocking layer 7, a p-AlGaN layer 8a, a p-GaN contact layer 8b, a Ni layer 9, an Au reflecting electrode 10a, a photonic crystal periodic structure 100, and photonic crystals (holes) 101.

The deep ultraviolet LED is characterized by having the Au reflecting electrode 10a, the Ni layer 9a, the p-GaN contact layer 8b, and the p-AlGaN layer 8a, which is transparent to light with the wavelength λ, that are arranged in this order from a side opposite to the sapphire substrate 1, having the photonic crystal periodic structure 100 with a photonic band gap (PBG) provided in the range of the thickness direction including at least the interface between the p-GaN contact layer 8b and the p-AlGaN layer 8a such that the photonic crystal periodic structure 100 does not extend beyond the p-AlGaN layer 8a in the direction of the sapphire substrate 1, and also having bonded to the rear surface of the sapphire substrate 1 the hemispherical quartz glass lens 20b (FIG. 22) or sapphire lens 20a (FIG. 23) that is transparent to light with the wavelength λ and has a radius of greater than or equal to the radius of an inscribed circle of the sapphire substrate 1 and about equal to the radius of a circumscribed circle thereof.

The photonic crystal periodic structure 100 may be a structure that is provided in a region of from the p-AlGaN layer 8a and penetrates the p-GaN contact layer 8b and the Ni layer 9 but does not reach the interface between the Au reflecting electrode 10a and the air.

That is, the structure may be the photonic crystal periodic structure 100 provided in the range of the thickness direction including at least the interface between the p-GaN contact layer 8b and the p-AlGaN layer 8a.

According to such a structure, low contact resistance can be maintained with the p-GaN contact layer. In addition, with the reflecting photonic crystal periodic structure having the PBG, light with the wavelength λ can be efficiently reflected through multiple reflections. Therefore, absorption of light by the Ni layer 9 and the p-GaN contact layer 8b can be suppressed.

Further, the most part of light reflected by the photonic crystal periodic structure 100 becomes incident on the front surface of the sapphire substrate 1, and is emitted to the air from the transparent lens 20a or 20b bonded to the rear surface of the sapphire substrate 1. Since the lens is a hemispherical lens, the light is emitted in the direction of the normal to the lens surface even when there is a distribution in the angle of incidence of light on the sapphire substrate 1. Therefore, total internal reflection can be minimized and high LEE can be obtained.

In addition, the LEE enhancement effect of the LED can be increased with the synergistic effect of the hemispherical lens and the reflecting photonic crystal periodic structure.

Guidelines for computing and designing the reflecting photonic crystal periodic structure mounted on the present structure follow the method described in the third embodiment.

It should be noted that the percentage of the photonic crystals in the depth direction is preferably about 50% in the p-AlGaN layer and about 50% in the p-GaN contact layer. Further preferably, the percentage of the photonic crystals in the p-AlGaN layer is higher such that, for example, the percentage of the photonic crystals is about 75% in the p-AlGaN layer and 25% in the p-GaN contact layer. A computation model was created on the basis of the aforementioned guidelines for designing the photonic crystal periodic structure, and the rate of change of the light extraction efficiency was analyzed using the FDTD method (Table 4). FIG. 24 A (when the radius of the sapphire lens is the radius of an inscribed circle) and FIG. 24B (when the radius of the sapphire lens is the radius of a circumscribed circle) each illustrate a graph of the rate of change of the total output value (far field) at each R/a of Table 4. Further, FIG. 25A (when the radius of the sapphire lens is the radius of an inscribed circle) and FIG. 25B (when the radius of the sapphire lens is the radius of a circumscribed circle) each illustrate a radiation pattern of the total output value (far field) at each R/a.

TABLE 4

| Computation model for FDTD | | |
|---|---|---|
| Element Size: 6.02 μm□ | Solid Angle: 1.66 | Solid Angle: 3.85 |
| Radius of Sapphire Lens (Inscribed Circle) | 6.0 μm | 6.0 μm |
| Radius of Sapphire Lens (Circumscribed Circle) | 8.5 μm | 8.5 μm |
| Thickness of Sapphire Substrate | 5.0 μm | 1.0 μm |
| AlN Buffer Layer | 1.0 μm | 1.0 μm |
| n-AlGaN Buffer Layer | 500 nm | 500 nm |
| Barrier Layer | 20 nm | 20 nm |
| Well Layer | 20 nm | 20 nm |
| Barrier Layer | 20 nm | 20 nm |
| Electron Blocking Layer | 40 nm | 40 nm |
| p-AlGaN Layer | 250 nm | 250 nm |
| p-GaN Contact Layer | 150 nm | 150 nm |
| R/a of Photonic Crystals | 0.2, 0.25, 0.3, 0.35, 0.4 | 0.2, 0.25, 0.3, 0.35, 0.4 |
| Ni Layer | 20 nm | 20 nm |
| Al Reflecting Electrode Layer | 200 nm | 200 nm |

From the aforementioned results, the tendency of the LED having the sapphire lens bonded thereto and having photonic crystals in its p-GaN contact layer in which the radius of the lens is greater than or equal to the radius of an inscribed circle and is about equal to the radius of a circumscribed circle is as follows.

1) The rate of change of the light extraction efficiency increases as R/a is greater for each order and each solid angle. Therefore, since the size of the photonic band gap (PBG) is proportional to R/a in FIG. 13, the size of the PBG is proportional to the rate of change of the light extraction efficiency.

2) Regarding the relationship between the solid angle and the rate of change of the light extraction efficiency, the rate of change of the light extraction efficiency is higher as the solid angle is smaller for each order.

3) Regarding the angular distribution, the distribution of light is concentrated in a portion of less than or equal to 10° with respect to the axial direction as the solid angle is smaller.

From the aforementioned tendency, the optimal photonic crystals have, when the radius of the sapphire lens is the radius of an inscribed circle, the maximum rate of change of the light extraction efficiency at the order m=3 and R/a=0.40, and specifically, the rates of change of the light extraction efficiency are 109% and 78% at the solid angles of 1.66 and 3.85, respectively. Meanwhile, when the radius of the sapphire lens is the radius of a circumscribed circle, the rates of change of the light extraction efficiency are 97% and 34% at the solid angles of 1.66 and 3.85, respectively, at the order m=3 and R/a=0.40. Substituting such values into the relationship between the light extraction efficiency and the solid angle in each of FIG. 18 can determine the light extraction efficiency at the solid angles of 1.66 and 3.85 as follows.

(When the Radius of the Sapphire Lens is the Radius of an Inscribed Circle)
The solid angle of 1.66: 7.8%×2.09=16.3%
The solid angle of 3.85: 17.2%×1.78-30.6%
(When the Radius of the Sapphire Lens is the Radius of a Circumscribed Circle)
The solid angle of 1.66: 12.8%×1.97=25.2%
The solid angle of 3.85: 17.3%×1.34=23.2%

Figure 26A:
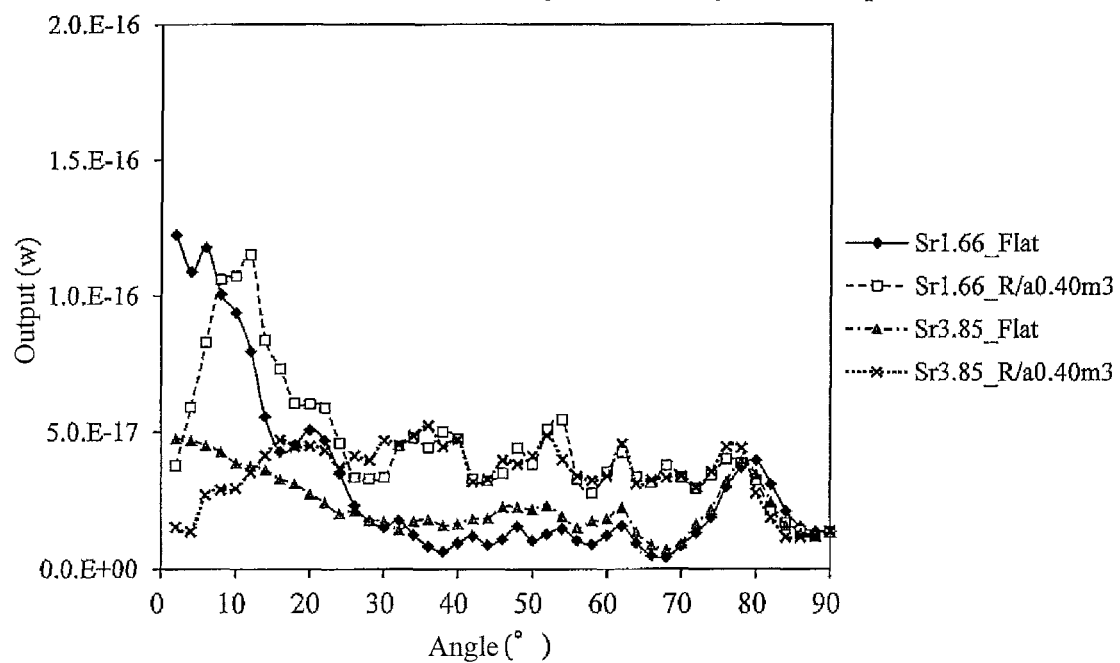
FIG. 26A are views illustrating the rate of change of the light extraction efficiency of an LED having a quartz glass lens bonded thereto (an inscribed circle) and having photonic crystals in its p-GaN contact layer, and a radiation pattern.
Figure 26B:
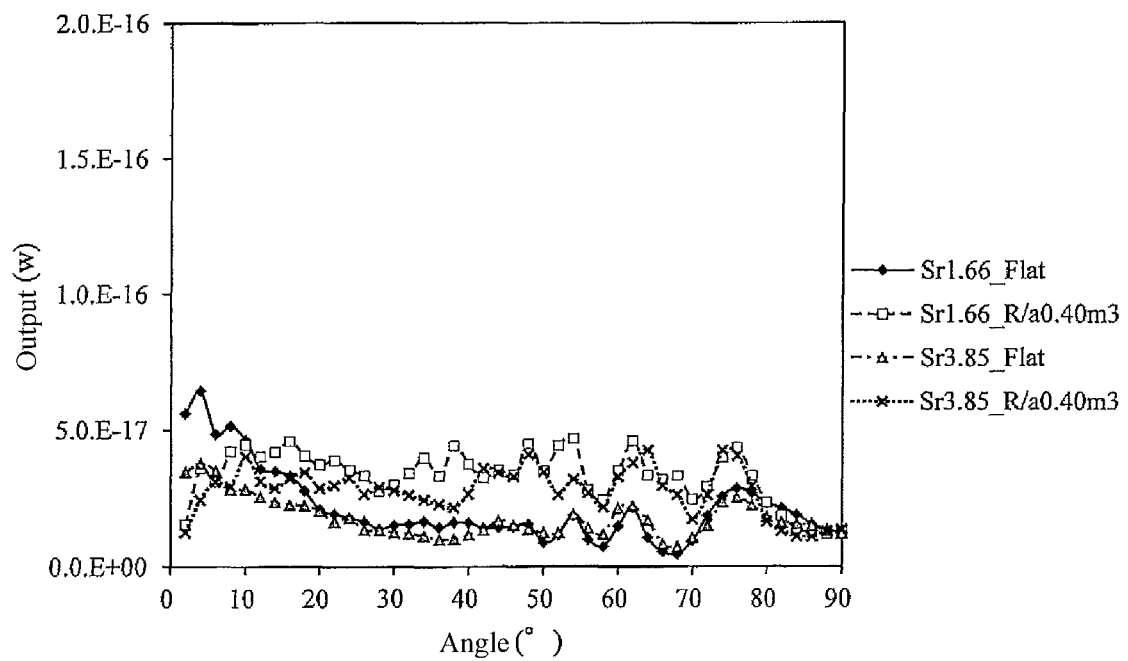
FIG. 26B are views illustrating the rate of change of the light extraction efficiency of an LED having a quartz glass lens bonded thereto (a circumscribed circle) and having photonic crystals in its p-GaN contact layer, and a radiation pattern.

Next, the light extraction efficiency of the photonic-crystal LED having the quartz lens bonded thereto is determined. From FIGS. 18A and 18B, it is found that the relationship between the light extraction efficiency and the solid angle is similar to that of a photonic-crystal LED having a sapphire lens bonded thereto. Therefore, a computation model for the order m=3 and R/a=0.40 was created and analysis was conducted using the FDTD method. The computation model corresponds to the structure of the deep ultraviolet LED in FIG. 22. The analysis results are shown in FIG. 26A (when the radius of the quartz lens is the radius of an inscribed circle) and FIG. 26B (when the radius of the quartz lens is the radius of a circumscribed circle).

(When the Radius of the Quartz Glass Lens is the Radius of an Inscribed Circle)
The rate of change of the light extraction efficiency at the solid angle of 1.66, R/a=0.40, and m=3 is 87%.
The rate of change of the light extraction efficiency at the solid angle of 3.85, R/a=0.40, and m=3 is 75%.
(When the Radius of the Quartz Glass Lens is the Radius of a Circumscribed Circle)
The rate of change of the light extraction efficiency at the solid angle of 1.66, R/a=0.40, and m=3 is 89%.
The rate of change of the light extraction efficiency at the solid angle of 3.85, R/a=0.40, and m=3 is 83%.

Herein, substituting the results into the relationship between the light extraction efficiency and the solid angle in each of FIGS. 18A and 18B can obtain the following.
(When the Radius of the Quartz Glass Lens is the Radius of an Inscribed Circle)
The solid angle of 1.66: 11.2%×1.87=20.9%
The solid angle of 3.85: 13.8%×1.75=24.2%
(When the Radius of the Quartz Glass Lens is the Radius of a Circumscribed Circle)
The solid angle of 1.66: 12.5%×1.89=23.6%
The solid angle of 3.85: 13.5%×1.83=24.7%

Fifth Embodiment

Figure 27B:
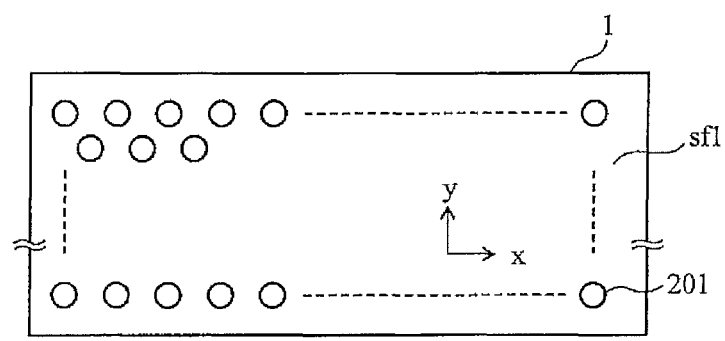
FIG. 27B is a plan view illustrating an exemplary arrangement of the PSS periodic structure of FIG. 27A.

FIG. 27A, FIG. 27B (a plan view of a surface sf1; hereinafter the same), FIG. 27C, and FIG. 27D each illustrate the structure of an AlGaN-based deep ultraviolet LED with a design wavelength λ of 280 nm as an example of a deep ultraviolet LED in accordance with the fifth embodiment of the present invention. As illustrated in FIGS. 27A and 27B, the AlGaN-based deep ultraviolet LED in accordance with this embodiment includes a quartz glass lens 20b, a sapphire substrate 1, a PSS-derived AlN connected-pillar periodic structure 200, a PSS 201, AlN connected pillars 202, an n-AlGaN layer 3, a barrier layer 4, a quantum well layer 5, a barrier layer 6, an electron blocking layer 7, a transparent p-AlGaN contact layer 8, an ultrathin Ni layer 9, an Al reflecting electrode layer 10, a photonic crystal periodic structure 100, and photonic crystals (holes) 101.

Figure 27D:
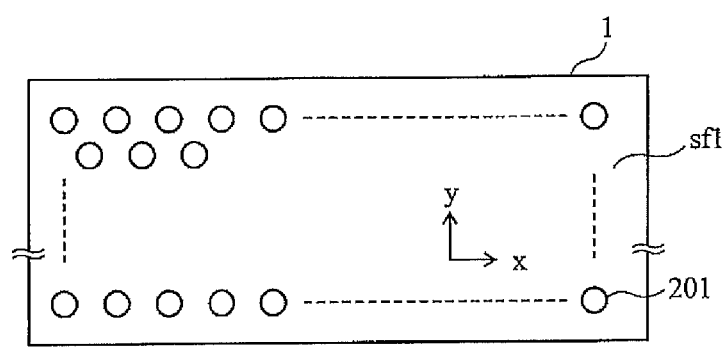
FIG. 27D is a plan view illustrating an exemplary arrangement of the PSS periodic structure of FIG. 27C.
Figure 27E:
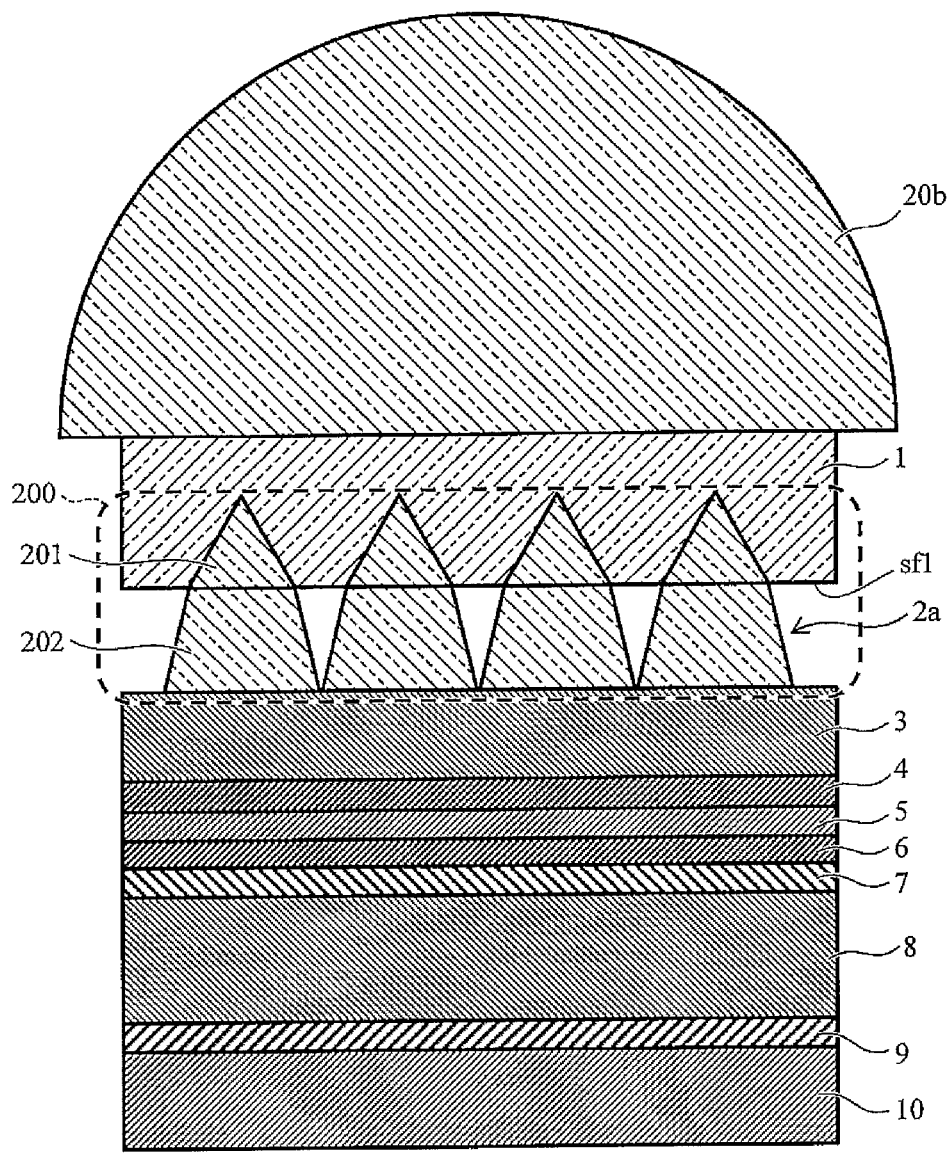
FIG. 27E is a view illustrating the structure of a deep ultraviolet LED obtained by bonding a quartz glass lens to an LED with AlN connected pillars.
Figure 27F:
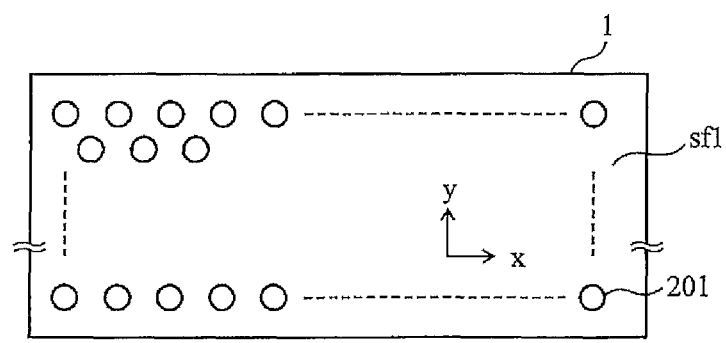
FIG. 27F is a plan view illustrating an exemplary arrangement of the PSS periodic structure of FIG. 27E.
Figure 27G:
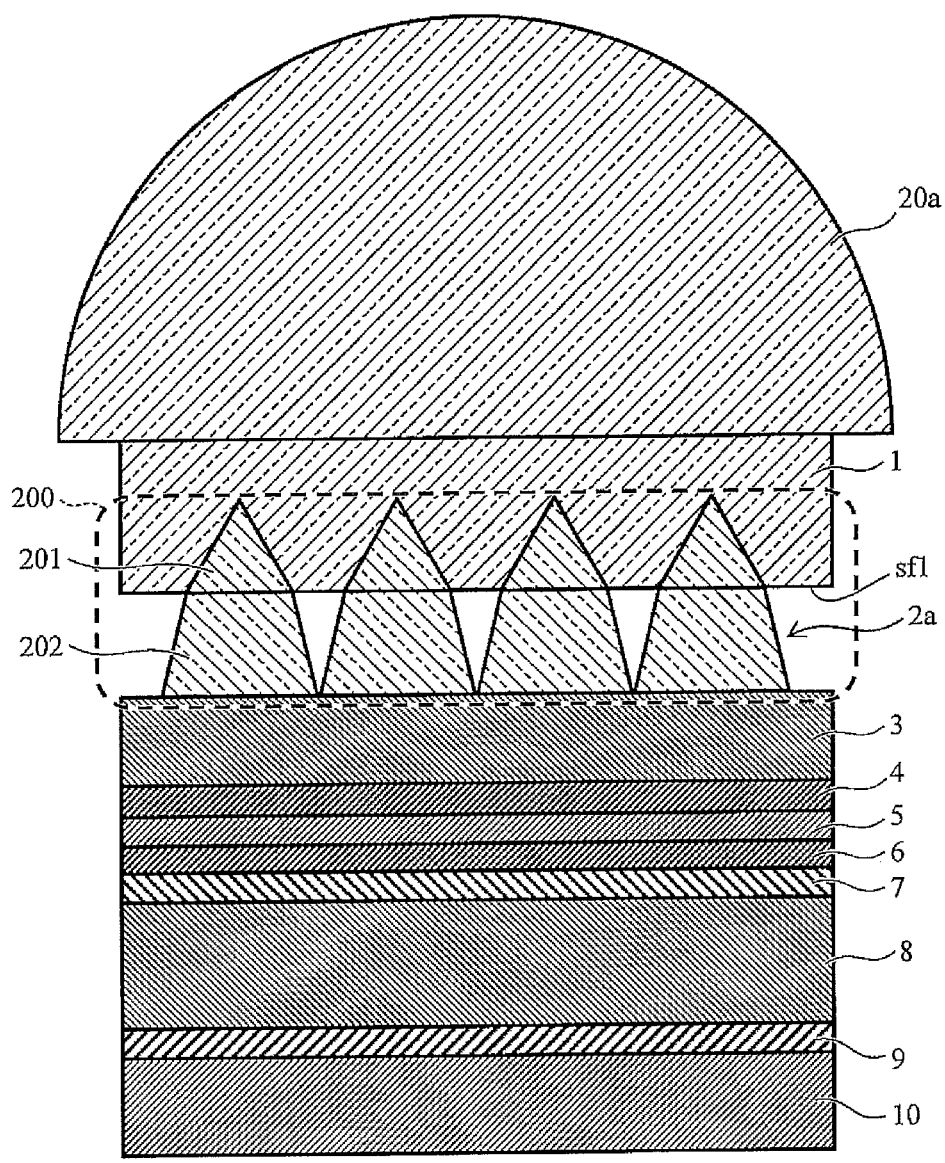
FIG. 27G is a view illustrating the structure of a deep ultraviolet LED obtained by replacing the quartz glass lens of FIG. 27E with a sapphire lens.
Figure 27H:
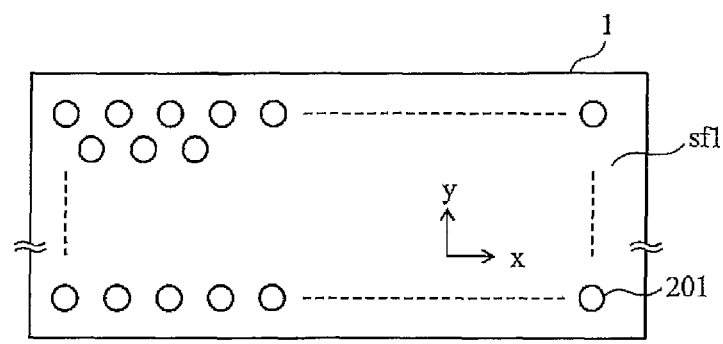
FIG. 27H is a plan view illustrating an exemplary arrangement of the PSS periodic structure of FIG. 27G.
Figure 27J:
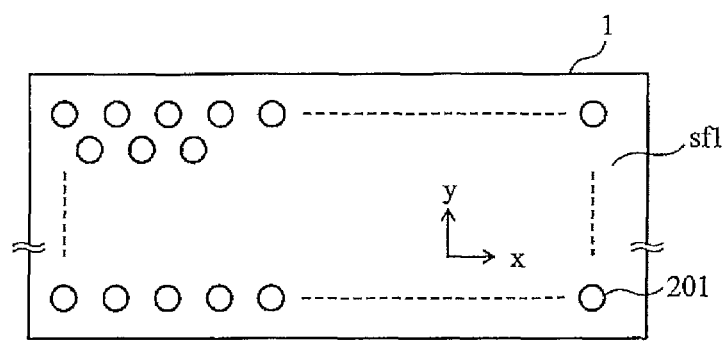
FIG. 27J is a plan view illustrating an exemplary arrangement of the PSS periodic structure of FIG. 27I.
Figure 27L:
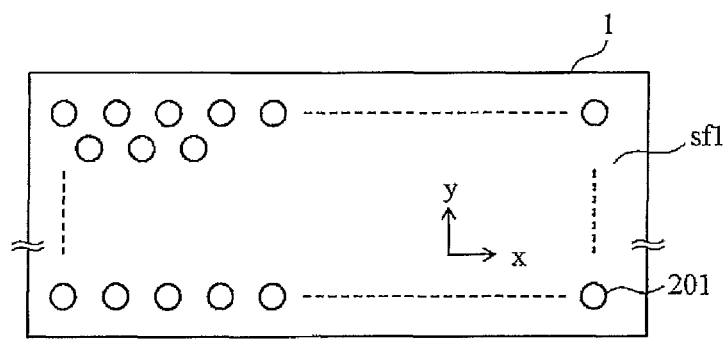
FIG. 27L is a plan view illustrating an exemplary arrangement of the PSS periodic structure of FIG. 27K.
Figure 27M:
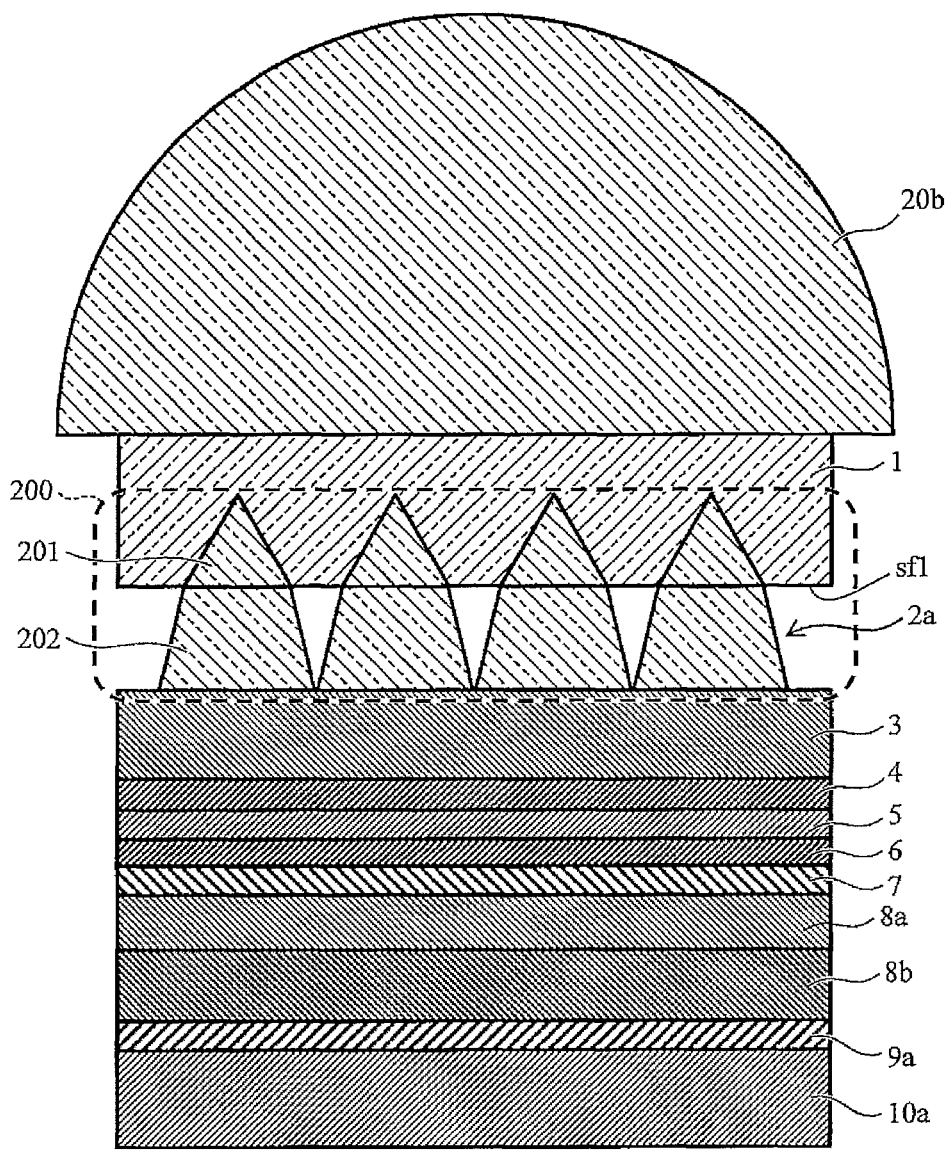
FIG. 27M is a view illustrating the structure of a deep ultraviolet LED obtained by replacing the transparent p-AlGaN contact layer, the ultrathin Ni layer, and the Al reflecting electrode layer of FIG. 27E with a p-AlGaN layer, a p-GaN contact layer, a Ni layer, and an Au reflecting electrode.
Figure 27N:
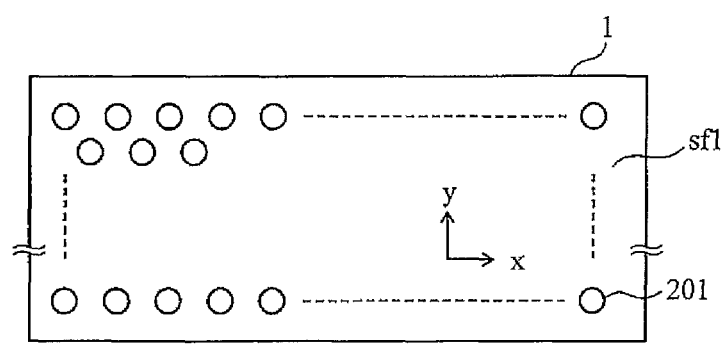
FIG. 27N is a plan view illustrating an exemplary arrangement of the PSS periodic structure of FIG. 27M.
Figure 27O:
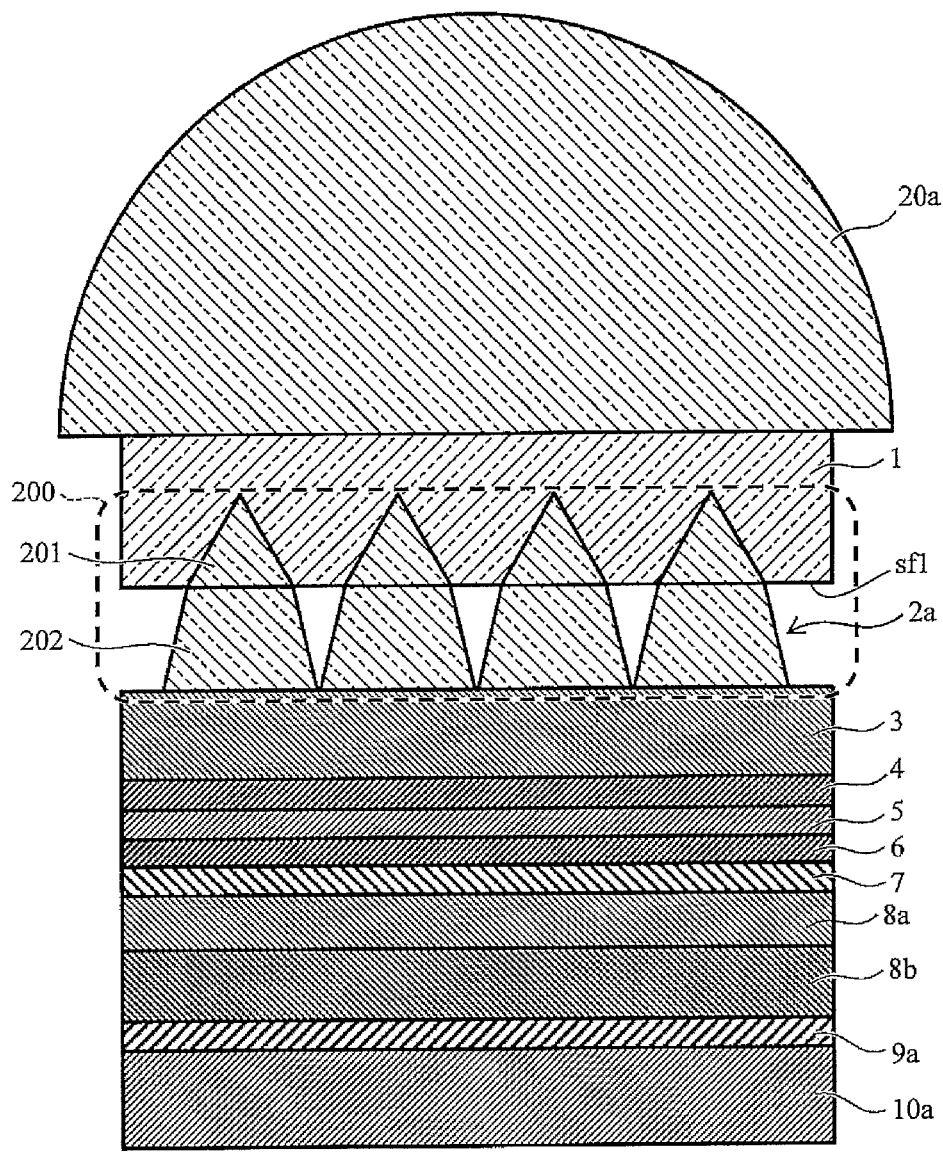
FIG. 27O is a view illustrating the structure of a deep ultraviolet LED obtained by replacing the transparent p-AlGaN contact layer, the ultrathin Ni layer, and the Al reflecting electrode layer of FIG. 27G with a p-AlGaN layer, a p-GaN contact layer, a Ni layer, and an Au reflecting electrode.
Figure 27P:
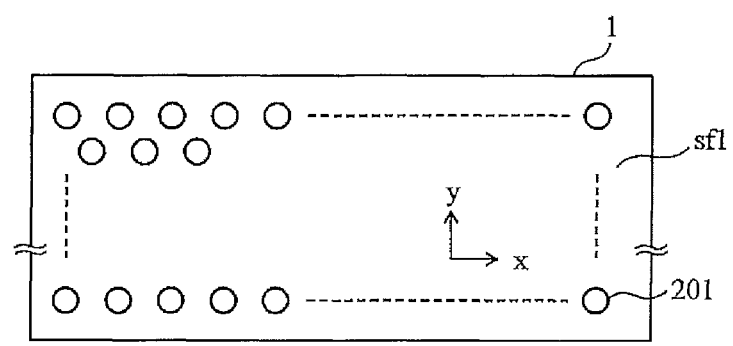
FIG. 27P is a plan view illustrating an exemplary arrangement of the PSS periodic structure of FIG. 27O.

In addition, the deep ultraviolet LED illustrated in FIGS. 27C and 27D includes a sapphire lens 20a, a sapphire substrate 1, a PSS-derived AlN connected-pillar periodic structure 200, a PSS 201, AlN connected pillars 202, an n-AlGaN layer 3, a barrier layer 4, a quantum well layer 5, a barrier layer 6, an electron blocking layer 7, a transparent p-AlGaN contact layer 8, an ultrathin Ni layer 9, an Al reflecting electrode layer 10, a photonic crystal periodic structure 100, and photonic crystals (holes) 101.

Each of such deep ultraviolet LEDs is characterized by having the Al reflecting electrode layer 10, the ultrathin Ni layer (with a thickness of about 1 nm) 9, and the transparent p-AlGaN contact layer 8, which is transparent to light with the wavelength λ, that are arranged in this order, and having the photonic crystal periodic structure 100 with a photonic band gap (PBG) provided at least in the thickness direction of the transparent p-AlGaN contact layer 8 or in the range of the thickness direction in a region of from the transparent p-AlGaN contact layer 8 and including the interface between the ultrathin Ni layer 9 and the Al reflecting electrode layer 10, and also having PSSs each having a triangular conical shape formed on the front surface of the sapphire substrate 1 through wet etching, and AlN connected pillars each having a truncated square pyramid shape or a truncated hexagonal pyramid shape formed on the PSSs through epitaxial growth, and further having bonded to the rear surface of the sapphire substrate 1 the hemispherical quartz glass lens 20b (FIGS. 27A and 27B) or sapphire lens 20a (FIGS. 27C and 27D) that is transparent to light with the wavelength λ and has a radius of greater than or equal to the radius of an inscribed circle of the sapphire substrate 1 and about equal to the radius of a circumscribed circle thereof.

The photonic crystal periodic structure 100 is a structure that does not reach the interface between the transparent p-AlGaN contact layer 8 and the electron blocking layer 7. This is because unless a portion with a thickness of about 30 to 50 nm is left for the photonic crystal periodic structure 100, the electron blocking layer 7 may become damaged due to dry etching.

As a modified example of this embodiment seen from a perspective of the actual device production process, it is also possible to provide a structure in which the photonic crystals reach the inside of the Al reflecting electrode layer 10 by penetrating the ultrathin Ni layer 9 but does not reach the interface between the Al reflecting electrode layer 10 and the air, as illustrated in FIG. 11C.

With the reflecting photonic crystal periodic structure 100 having the PBG, light with the wavelength can be efficiently reflected through multiple reflections. The PSS-derived connected-pillar periodic structure 200 has a PSS (Patterned Sapphire Substrate) periodic structure (triangular conical shapes or conical holes) 201 with a period of about 1 μm to several μm, for example, on the front surface of the sapphire substrate 1. Such a recess structure can be formed by processing the front surface of the sapphire substrate 1 through wet etching using a mask pattern of $SiO_2$ that has been formed on the front surface of the sapphire substrate 1 using photoresist or the like. It should be noted that the "triangular cone" as referred to in this specification means the shape of a triangular pyramid with a circular bottom face as illustrated in FIGS. 27A to 27H.

Next, for the recess structure, an AlN film is formed to a thickness of about several μm through epitaxial growth in the PSS-derived connected-pillar periodic structure 200 using MOCVD or the like. Then, the recess structure is filled with the AlN film, and AlN connected pillars 220 each having a truncated square pyramid shape or a truncated hexagonal pyramid shape are selectively formed thereon in the thickness direction. Finally, coalescence occurs in the upper portion and a flat epitaxial film is obtained.

According to such a structure formed, deep ultraviolet light emitted from the quantum well layer 5 propagates through the AlN connected pillars 220 each having a truncated square pyramid shape or a truncated hexagonal pyramid shape as waveguides, and then becomes incident on the sapphire substrate 1. Therefore, total internal reflection at the interface between the sapphire substrate 1 and the PSS periodic structure 220 is suppressed, and thus the light extraction efficiency is improved.

Even when a slight amount of light has passed through the transparent p-AlGaN contact layer 8, since the amount of light absorbed by the ultrathin Ni layer 9 is small and the Al reflecting electrode layer 10 has reflectivity as high as 90% with respect to light, higher LEE can be achieved in comparison with when an Al reflecting electrode layer is used alone without the photonic crystal periodic structure 100 provided.

Further, the most part of light reflected by the reflecting photonic crystal periodic structure 100 becomes incident on the front surface of the sapphire substrate 1 and is then emitted to the air from the transparent lens 20a or 20b bonded to the rear surface of the sapphire substrate 1. Since the lens 20a or 20b is a hemispherical lens, the light is emitted in the direction of the normal to the lens surface even when there is a distribution in the angle of incidence of light on the sapphire substrate 1. Therefore, total internal reflection can be minimized and high LEE can be obtained.

In addition, the LEE enhancement effect can be increased with the synergistic effect of the hemispherical lens, and the photonic crystal periodic structure, the transparent p-AlGaN contact layer, the ultrathin Ni layer, and the Al reflecting electrode layer.

A computation model having the photonic crystals and the PSS-derived AlN connected pillars was created, and the rate of change of the light extraction efficiency was analyzed using the FDTD method (Table 5). The analysis results are shown in FIG. 28A (when the radius of the lens is the radius of an inscribed circle) and FIG. 28B (when the radius of the lens is the radius of a circumscribed circle).

TABLE 5

| Computation model for FDTD | | |
|---|---|---|
| Element Size: 6.02 μm□ | Solid Angle: 3.85 | Solid Angle: 3.85 |
| Type of Lens (Inscribed Circle, Circumscribed Circle) | Sapphire | Quartz Glass |
| Thickness of Sapphire Substrate | 1.0 μm | 1.0 μm |
| AlN connected pillars | 1.0 μm | 1.0 μm |
| n-AlGaN Buffer Layer | 500 nm | 500 nm |
| Barrier Layer | 20 nm | 20 nm |
| Well Layer | 20 nm | 20 nm |
| Barrier Layer | 20 nm | 20 nm |
| Electron Blocking Layer | 40 nm | 40 nm |
| P-AlGaN Contact Layer | 400 nm | 400 nm |
| Photonic Crystals (R/a and order: m) | R/a: 0.35 and order: 3 | R/a: 0.35 and order: 3 |
| Ni Layer | 0 nm | 0 nm |
| Al Reflecting Electrode Layer | 220 nm | 220 nm |

From the results of the radiation patterns, it is found that in the LED having photonic crystals in its transparent p-AlGaN contact layer, having the AlN connected pillars, and having the lens bonded thereto in which the radius of the lens is greater than or equal to the radius of an inscribed circle and is about equal to the radius of a circumscribed circle, the distribution of light in a portion of less than or equal to 10°, in particular, less than or equal to 2° with respect to the axial direction is improved.

(When the Radius of the Sapphire Lens is the Radius of an Inscribed Circle)

The rate of change of the light extraction efficiency of the LED having photonic crystals in its transparent p-AlGaN contact layer, having the AlN connected pillars, and having the sapphire lens bonded thereto was found to be −9%. Therefore, substituting the value into the value of the light extraction efficiency of the LED with a solid angle of 3.85 computed in the third embodiment, which has photonic crystals in its transparent p-AlGaN contact layer and also has a sapphire lens bonded thereto, can obtain 53.0%×0.91-48.2%.

(When the Radius of the Sapphire Lens is the Radius of a Circumscribed Circle)

The rate of change of the light extraction efficiency of the LED having photonic crystals in its transparent p-AlGaN contact layer, having the AlN connected pillars, and having the sapphire lens bonded thereto was found to be −10%. Therefore, substituting the value into the value of the light extraction efficiency of the LED with a solid angle of 3.85 computed in the third embodiment, which has photonic crystals in its transparent p-AlGaN contact layer and has a sapphire lens bonded thereto, can obtain 57.1%×0.9=51.4%.

(When the Radius of the Quartz Glass Lens is the Radius of an Inscribed Circle)

The rate of change of the light extraction efficiency of the LED having photonic crystals in its transparent p-AlGaN contact layer, having the AlN connected pillars, and having the quartz glass lens bonded thereto was found to be −4%. Therefore, substituting the value into the value of the light extraction efficiency of the LED with a solid angle of 3.85, which has photonic crystals in its transparent p-AlGaN contact layer and also has a quartz glass lens bonded thereto, as above can obtain 44.8%×0.96=43.0%.

(When the Radius of the Quartz Glass Lens is the Radius of a Circumscribed Circle)

The rate of change of the light extraction efficiency of the LED having photonic crystals in its transparent p-AlGaN contact layer, having the AlN connected pillars, and having the quartz glass lens bonded thereto was found to be −6%. Therefore, substituting the value into the value of the light extraction efficiency of the LED with a solid angle of 3.85, which has photonic crystals in its transparent p-AlGaN contact layer and also has a quartz glass lens bonded thereto, as above can obtain 47.8%×0.94=44.9%.

Sixth Embodiment

FIGS. 27E and 27F and FIGS. 27G and 27H are views corresponding to FIGS. 27A and 27B and FIGS. 27C and 27D exemplarily illustrated in the fifth embodiment, respectively, and each illustrate an example in which a lens and AlN connected pillars are provided but a photonic crystal periodic structure is not formed.

Figure 29A:
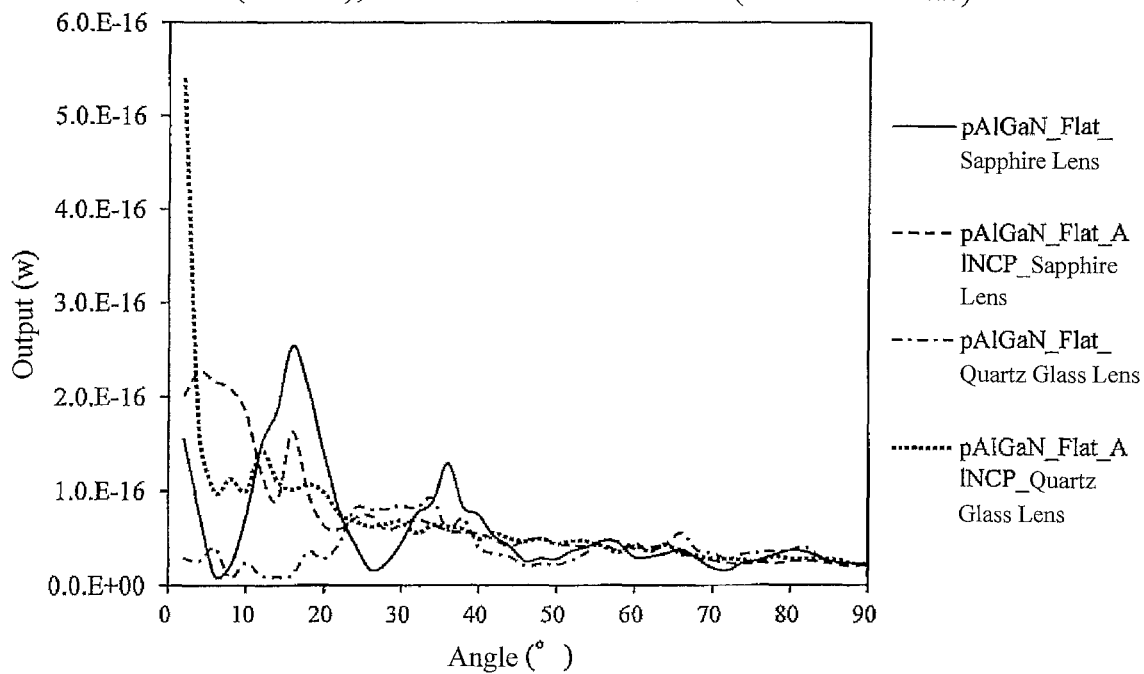
FIG. 29A are views illustrating the rate of change of the light extraction efficiency of an LED having a transparent p-AlGaN contact layer, AlN connected pillars, and a lens bonded thereto (an inscribed circle) as determined using the FDTD method, and a radiation pattern.

A computation model (see Table 6) was created on the basis of the views and analysis was conducted using the FDTD method. The analysis results are shown in FIG. 29A (when the radius of the lens is the radius of an inscribed circle) and FIG. 29B (when the radius of the lens is the radius of a circumscribed circle).

TABLE 6

| Computation model for FDTD | | |
|---|---|---|
| Element Size: 6.02 µm☐ | Solid Angle: 3.85 | Solid Angle: 3.85 |
| Type of Lens (Inscribed Circle, Circumscribed Circle) | Sapphire | Quartz Glass |
| Thickness of Sapphire Substrate | 1.0 µm | 1.0 µm |
| AlN connected pillars | 1.0 µm | 1.0 µm |
| n-AlGaN Buffer Layer | 500 nm | 500 nm |
| Barrier Layer | 20 nm | 20 nm |
| Well Layer | 20 nm | 20 nm |
| Barrier Layer | 20 nm | 20 nm |
| Electron Blocking Layer | 40 nm | 40 nm |
| p-AlGaN Contact Layer | 400 nm | 400 nm |
| Ni Layer | 0 nm | 0 nm |
| Al Reflecting Electrode Layer | 220 nm | 220 nm |

In the LED having the transparent p-AlGaN contact layer, the AlN connected pillars, and the lens bonded thereto in which the radius of the lens is greater than or equal to the radius of an inscribed circle and is about equal to the radius of a circumscribed circle, the distribution of light in a portion of less than or equal to 10°, in particular, less than or equal to 2° with respect to the axial direction is improved.

(When the Radius of the Sapphire Lens is the Radius of an Inscribed Circle)

The rate of change of the light extraction efficiency of the LED having the transparent p-AlGaN contact layer, the AlN connected pillars, and the sapphire lens bonded thereto was found to be −4%. Therefore, substituting the value into the value of the light extraction efficiency of the LED with a solid angle of 3.85, which has the transparent p-AlGaN contact layer and the sapphire lens bonded thereto, in FIG. 18A can obtain 37.3%×0.96=35.8%.

(When the Radius of the Sapphire Lens is the Radius of a Circumscribed Circle)

The rate of change of the light extraction efficiency of the LED having the transparent p-AlGaN contact layer, the AlN connected pillars, and the sapphire lens bonded thereto was found to be −1%. Therefore, substituting the value into the value of the light extraction efficiency of the LED with a solid angle of 3.85, which has the transparent p-AlGaN contact layer and the sapphire lens joined thereto, in FIG. 18B can obtain 37.8%×0.99=37.4%.

(When the Radius of the Quartz Glass Lens is the Radius of an Inscribed Circle)

The rate of change of the light extraction efficiency of the LED having the transparent p-AlGaN contact layer, the AlN connected pillars, and the quartz glass lens bonded thereto was found to be 6%. Therefore, substituting the value into the value of the light extraction efficiency of the LED with a solid angle of 3.85, which has the transparent p-AlGaN contact layer and the quartz glass lens bonded thereto, as above can obtain 30.1%×1.06=31.9%.

(When the Radius of the Quartz Glass Lens is the Radius of a Circumscribed Circle)

The rate of change of the light extraction efficiency of the LED having the transparent p-AlGaN contact layer, the AlN connected pillars, and the quartz glass lens bonded thereto was found to be 11%. Therefore, substituting the value into the value of the light extraction efficiency of the LED with a solid angle of 3.85, which has the transparent p-AlGaN contact layer and the quartz glass lens bonded thereto, as above can obtain 29.7%×1.11=33.0%.

The results of the third to sixth embodiments are summarized as follows.

When the radius of the lens is greater than or equal to the radius of an inscribed circle of the rear surface of the substrate to which the lens is bonded and is about equal to the radius of a circumscribed circle thereof, the following rule is established.

1) Regarding the rate of change of the light extraction efficiency of an LED having photonic crystals in its transparent p-AlGaN contact layer and having a sapphire lens or a quartz glass lens bonded thereto, photonic crystals designed at the order m=3 and R/a=0.35 has a large value.

2) Regarding the rate of change of the light extraction efficiency of an LED having photonic crystals in its p-GaN contact layer and having a sapphire lens or a quartz glass lens bonded thereto, the size of the photonic band gap is in particular, less than or equal to 2° with respect to the axial direction regardless of the type of the lens, such as a sapphire lens or a quartz glass lens.

6) Performing comparison and interpolation of data with the same solid angle of the ray-tracing method as that of the FDTD method can obtain the light extraction efficiency for an analysis region expanded to subnanometers to several millimeters. Therefore, guidelines for optimizing the design of photonic crystals to maximize the light extraction efficiency can be provided in the range of from an LED element to a packaged structure.

The analysis results of the light extraction efficiency of the deep ultraviolet LEDs in accordance with the third to sixth embodiments are summarized in Table 7.

TABLE 7

Summary of light extraction efficiency

| Inscribed Circle | Solid Angle: 1.66 p-GaN Contact Layer | Solid Angle: 1.66 p-AlGaN Contact Layer | Solid Angle: 3.85 p-GaN Contact Layer | Solid Angle: 3.85 p-AlGaN Contact Layer |
|---|---|---|---|---|
| Sapphire Lens Photonic Crystals | 16.3% | 29.1% | 30.6% | 53.0% |
| Quartz Glass Lens Photonic Crystals | 20.9% | 37.5% | 24.2% | 44.8% |

| Inscribed Circle | Sapphire Lens AlN Connected Pillars | Quartz Lens AlN Connected Pillars | Sapphire Lens Photonic Crystals AlN Connected Pillars | Quartz Lens Photonic Crystals AlN Connected Pillars |
|---|---|---|---|---|
| Solid Angle: 3.85 p-AlGaN Contact Layer | 35.8% | 31.9% | 48.2% | 43.0% |

| Circumscribed Circle | Solid Angle: 1.66 p-GaN Contact Layer | Solid Angle: 1.66 p-AlGaN Contact Layer | Solid Angle: 3.85 p-GaN Contact Layer | Solid Angle: 3.85 p-AlGaN Contact Layer |
|---|---|---|---|---|
| Sapphire Lens Photonic Crystals | 25.2% | 42.7% | 23.2% | 57.1% |
| Quartz Glass Lens Photonic Crystals | 23.6% | 42.1% | 24.7% | 47.8% |

| Circumscribed Circle | Sapphire Lens AlN Connected Pillars | Quartz Lens AlN Connected Pillars | Sapphire Lens Photonic Crystals AlN Connected Pillars | Quartz Lens Photonic Crystals AlN Connected Pillars |
|---|---|---|---|---|
| Solid Angle: 3.85 p-AlGaN Contact Layer | 37.4% | 33.0% | 51.4% | 44.9% | proportional to R/a, and the magnitude of R/a is proportional to the rate of change of the light extraction efficiency.

3) Regarding the angular distribution of an LED having a sapphire lens bonded thereto, the distribution of light is concentrated in a portion of less than or equal to 10° with respect to the axial direction as the solid angle is smaller for each of the LED having the transparent p-AlGaN contact layer and the LED having the p-GaN contact layer.

4) Regarding the angular distribution of an LED having a quartz glass lens bonded thereto, the distribution of light is not concentrated in a portion of less than or equal to 10° with respect to the axial direction regardless of the type of the contact layer, such as the transparent p-AlGaN contact layer or the p-GaN contact layer, or the magnitude of the solid angle.

5) Regarding the AlN connected pillars, the distribution of light is concentrated in a portion of less than or equal to 10°, Forming reflecting photonic crystals in the transparent p-AlGaN contact layer and combining the LED with a sapphire lens and further adjusting the thickness of the sapphire substrate so as to increase the solid angle can obtain a light extraction efficiency of 60% at maximum.

In addition, using the method in accordance with this embodiment can provide guidelines for optimizing the design of photonic crystals to maximize the light extraction efficiency in the range of from an LED element to a packaged structure.

Seventh Embodiment

FIGS. 27I and 27J and FIGS. 27K and 27L are views corresponding to FIGS. 27A and 27B and FIGS. 27C and 27D exemplarily illustrated in the fifth embodiment, respectively, and each illustrate an example in which the transparent p-AlGaN contact layer, the ultrathin Ni layer, and the Al reflecting electrode layer are replaced with a p-AlGaN layer, a p-GaN contact layer, a Ni layer, and an Au reflecting electrode.

Eighth Embodiment

FIGS. 27M and 27N and FIGS. 27O and 27P are views corresponding to FIGS. 27E and 27F and FIGS. 27G and 27H exemplarily illustrated in the sixth embodiment, respectively, and each illustrate an example in which the transparent p-AlGaN contact layer, the ultrathin Ni layer, and the Al reflecting electrode layer are replaced with a p-AlGaN layer, a p-GaN contact layer, a Ni layer, and an Au reflecting electrode.

Ninth Embodiment

Regarding a method for designing a deep ultraviolet LED having reflecting photonic crystals and a lens bonded thereto, a method for computing the design of a photonic-crystal LED having a transparent p-AlGaN contact layer is as follows, for example.

That is, the photonic crystal periodic structure has a photonic band gap, and is formed as two structures, which include the transparent p-AlGaN contact layer and the air, having different refractive indices in a bottom face portion. Provided that the average refractive index of the two structures is $n_{av}$ ($n_{av}$ is a function of the period a and the radius R of each circular void) and the period is a, when the photonic crystal periodic structure satisfies the Bragg scattering condition indicated by the following Formula (1), TE polarization that has become incident on the photonic crystal periodic structure is reflected, while TM polarization is passed through the photonic crystal periodic structure.

$$m\lambda/n_{av}=2a \qquad (1)$$

Then, using R/a, which is the ratio of the radius R of each circular void to the period a, the design wavelength $\lambda$, and dielectric constants $\varepsilon_1$ and $\varepsilon_2$ of the two structures corresponding to the respective refractive indices $n_1$ and $n_2$, photonic band structures for TE polarization and TM polarization are analyzed using the plane wave expansion method. Specifically, the dielectric constants $\varepsilon_1$ and $\varepsilon_2$ are input to the Maxwell's wave equation indicated by the following Formulae (2) and (3) to compute eigen values.

[Math. 3]

TE polarization $$\sum_{G'} \varepsilon^{-1}(G-G')(k+G)*(k+G')H(G') = \omega^2/c^2 H(G) \qquad (2)$$

[Math. 4]

TM polarization $$\sum_{G'} \varepsilon^{-1}(G-G')|k+G||k+G'|E'(G') = \omega^2/c^2 E'(G) \qquad (3)$$

Herein, E'=|k+G|E(G), E denotes the relative dielectric constant, G denotes the reciprocal lattice vector, k denotes the wave number, $\omega$ denotes the frequency, c denotes the light velocity, and E denotes the electric field.

R/a is a variable, and a photonic band structure for TE polarization is determined with R/a changed in increments of 0.01 in the range of 0.20≤R/a≤0.40. Then, assuming that a photonic band gap between a first photonic band ($1_{st}$ PB) and a second photonic band ($2_{nd}$ PB) is PBG 1 and a photonic band gap between a seventh photonic band ($7_{th}$ PB) and an eighth photonic band ($8_{th}$ PB) is PBG 4, the relationship between each PBG and R/a is determined. FIG. 13 shows the results.

Similarly, a photonic band structure for TM polarization is determined, and assuming that a PBG between a $1_{st}$ PB and a $2_{nd}$ PB is PBG 1, a PBG between a $3_{rd}$ PB and a $4_{th}$ PB is PBG 2, a PBG between a $5_{th}$ PB and a $6_{th}$ PB is a PBG 3; and a PBG between a $7_{th}$ PB and an $8_{th}$ PB is PBG 4, the relationship between each PBG and R/a is determined. FIG. 14 shows the results.

The state density ($\rho$) of the photonic crystal periodic structure indicates how many photons can exist at which frequency. In a uniform medium, the state density increases monotonously with respect to the frequency. However, in photonic crystals, $\rho(\omega)=0$ in the frequency region of a photonic band gap. This is due to the reason that the state density changes sharply around the photonic band gap and that the group velocity of shark peaks in the other frequency regions is zero. A representative point of symmetry at which the group velocity becomes zero is a point M where two waves change the propagation direction of light due to Bragg diffraction so as to form stationary waves. The abrupt rate of change of the state density is substantially proportional to the size of the photonic band gap.

Herein, the relationship between the size of a photonic band gap and the reflection/transmission effect, and the rate of change of the light extraction efficiency (LEE) of the deep ultraviolet LED are analyzed using the FDTD method so as to obtain the diameter d, the period a, and the depth h of the photonic crystals with which the rate of change of LEE becomes maximum.

FIG. 15 illustrates a more detailed computation process flow.

(Step S01)

The ratio (R/a) between the period a and the radius R of the structure, which are the periodic structure parameters of the photonic crystal periodic structure, is tentatively determined.

(Step S02)

The refractive indices $n_1$ and $n_2$ of a first structure, which is obtained by forming a structure with a low refractive index within a medium with a high refractive index, for example, a structure having holes 101 formed therein, are computed, and the average refractive index $n_{av}$ is computed from them and R/a, and then, the average refractive index flay is substituted into the formula of the Bragg condition so as to obtain the period a and the radius R for each order m.

(Step S03)

A photonic band structure for TE polarization is analyzed with the plane wave expansion method using R/a, the wavelength $\lambda$, and the dielectric constants $\varepsilon_1$ and $\varepsilon_2$ of the structure obtained from the respective refractive indices $n_1$ and $n_2$.

(Step S04)

The analysis is repeated by changing the tentatively determined R/a value until a PBG between the first photonic band and the second photonic band for TE polarization appears.

(Step S05)

Regarding R/a at which the PBG appears, the rate of change of the light extraction efficiency for light with the wavelength $\lambda$ is determined through simulation analysis using the FDTD method that uses as variables the individual period a and radius R corresponding to each order m of the Bragg condition and a given depth h of the periodic structure.

(Step S06)

Simulation using the FDTD method is repeatedly performed so as to determine the order m of the Bragg condition at which the rate of change of the light extraction efficiency for light with the wavelength λ becomes maximum, as well as the period a, the radius R, and the depth h that are the periodic structure parameters corresponding to the order m.

It is acceptable as long as the values of such periodic structure parameters are determined by selecting the order m at which the values of the wavelength λ and the period a are close in the Bragg scattering formula (Formula (1)). In addition, the depth h is desirably greater than or equal to the period a. Performing comparison and interpolation of data with the same solid angle of the ray-tracing method as that of the FDTD method can obtain the light extraction efficiency for an analysis region expanded to subnanometers to several millimeters. Therefore, guidelines for optimizing the design of photonic crystals to maximize the light extraction efficiency can be provided in the range of from an LED element to a packaged structure.

It should be noted that the method for computing the design of a photonic-crystal LED having a p-GaN contact layer is similar to the method for computing the design of a photonic-crystal LED having a transparent p-AlGaN contact layer, but differs in the following point.

That is, the percentage of the photonic crystals in the depth direction is preferably about 50% in the p-AlGaN layer and about 50% in the p-GaN contact layer. Further preferably, the percentage of the photonic crystals in the p-AlGaN layer is higher such that, for example, the percentage of the photonic crystals is about 75% in the p-AlGaN layer and 25% in the p-GaN contact layer.

Accordingly, a photonic-crystal LED having a p-GaN contact layer can be designed.

The photonic band gap of the photonic crystal periodic structure preferably opens for TE polarized components.

Preferably, the depth h of the photonic crystal periodic structure is greater than or equal to ⅔a the length of the period a, and further preferably, the depth h is greater than or equal to the period a.

In addition, the depth h is preferably greater than or equal to the thickness of the p-AlGaN layer and less than or equal to the total thickness of the p-GaN contact layer and the p-AlGaN layer. Further, in addition to the p-AlGaN layer, another p-AlGaN layer with a higher Al content may be provided on the substrate side.

Tenth Embodiment

As a method for producing a deep ultraviolet LED, there is provided a method including, as illustrated in FIG. 22, for example, a step of preparing a stacked structure with a design wavelength λ, including a reflecting electrode layer 10a, a metal layer 9a, a p-GaN contact layer 8b, and a p-AlGaN layer 8a that are arranged in this order from a side opposite to the substrate 1; a step of preparing a mold for forming a photonic crystal periodic structure to be provided in the range of the thickness direction including at least the interface between the p-GaN contact layer 8b and the p-AlGaN layer 8a; a step of forming a resist layer on the stacked structure and imprinting the structure of the mold thereto; and a step of sequentially etching the stacked structure using the resist layer as a mask so as to form the photonic crystal periodic structure.

Alternatively, there is provided a method for producing a deep ultraviolet LED including, as illustrated in FIG. 11C, for example, a step of preparing a stacked structure with a design wavelength λ, including an Al reflecting electrode layer 10, an ultrathin Ni layer 9, and a transparent p-AlGaN contact layer 8 that are arranged in this order from a side opposite to the substrate 1; a step of preparing a mold for forming a photonic crystal periodic structure to be provided at least in the thickness direction of the transparent p-AlGaN contact layer 8 or in the range of the thickness direction in a region of from the transparent p-AlGaN contact layer 8 and including the interface between the ultrathin Ni layer 9 and the Al reflecting electrode layer 10; a step of forming a resist layer on the stacked structure and imprinting the structure of the mold thereto; and a step of sequentially etching the stacked structure using the resist layer as a mask so as to form the photonic crystal periodic structure.

In addition, there is also provided a method for producing a deep ultraviolet LED that further includes, after the step of forming one of the photonic crystal periodic structures described above, a step of bonding a hemispherical lens, which is transparent to light with the wavelength λ and has a radius of about equal to the radius of a circumscribed circle of the LED element, to the rear surface of the sapphire substrate of the LED element. The material of the lens is desirably a material with a refractive index that is greater than the average value of the refractive index of the sapphire substrate and the refractive index of the air. Any material, such as sapphire, spinel, quartz glass, AlN, or sealing resin, can be used as long as such material satisfies the aforementioned conditions. The bonding method may be any method, such as surface activated bonding (SAB), atomic diffusion bonding (ADB), bonding performed after the surface is modified with atmospheric-pressure plasma or ozone gas, bonding performed with an adhesive that is transparent to light with the design wavelength λ, or bonding that can suppress scattering and absorption of light at the bonded interface.

Through the aforementioned steps, an LED element structure can be provided that has a photonic crystal periodic structure and also has, bonded to the rear surface of a sapphire substrate thereof, a hemispherical lens that is transparent to light with the wavelength λ and has a radius of greater than or equal to the radius of an inscribed circle of the element and about equal to the radius of a circumscribed circle thereof.

Eleventh Embodiment

Hereinafter, the eleventh embodiment of the present invention will be described in detail.

The eleventh embodiment of the present invention shows that the photonic crystal periodic structure and the microstructure such as the PSS periodic structure described in each of the aforementioned embodiments can be formed using an imprinting technique based on a nanoimprint lithography method.

According to the first to tenth embodiments, a large-area periodic structure is preferably imprinted onto the surface of an object to be processed at once.

Hereinafter, a production method that uses a technique of imprinting a photonic crystal periodic structure and a PSS periodic structure using a nanoimprint lithography method will be described in more detail.

Nanoimprinting is an excellent technique of imprinting a large-area photonic crystal pattern of a mold onto organic resist, which has been applied to a substrate through spin coating, at once. If a resin film mold is used, imprinting is possible even when the substrate is warped to a degree of about several hundred microns. However, since priority is placed on the fluidity for organic resist for nanoimprinting, the etch selectivity of the resist with respect to a material on which a pattern is to be formed may not be always sufficient. Further, the pattern size of the mold does not coincide with the size of a pattern-formed portion after etching. In order to solve such problems, a process using bi-layer resist is performed as follows.

1) An imprinting technique using a bi-layer resist method is used in which a structure to be processed is first coated with lower-layer resist having high etch selectivity with respect to the structure, and then, the lower-layer resist is coated with upper-layer resist having fluidity and oxygen resistance.

2) It is also possible to use a mold for imprinting and use a resin film for the mold. More specifically, the surface of a substrate on which a periodic structure is to be formed is spin-coated with organic lower-layer resist having high etch selectivity with respect to the substrate, for example. Next, the surface of the lower-layer resist is spin-coated with silicon-containing upper-layer resist having fluidity and oxygen resistance performance, for example.

3) Next, a periodic structure is imprinted onto the surface of the upper-layer resist using a nanoimprint lithography method with the use of a mold.

4) Next, the upper-layer resist having the periodic structure imprinted thereto is exposed to oxygen plasma so that oxygen resistance is imparted thereto and the residual film of the upper-layer resist remaining after the nanoimprinting is removed.

5) Next, the organic lower-layer resist is etched with oxygen plasma using the upper-layer resist with oxygen resistance as a mask so that a mask for dry-etching the substrate is formed.

6) Finally, the substrate is dry-etched with ICP plasma using the mask as an etching mask.

The steps in 1) to 6) above are the imprinting technique that uses the bi-layer resist method for the substrate.

It should be noted that when such a process technology is used, it is possible to obtain, on an imprinted object (on a sapphire substrate, for example), an etch depth of about 1.5 times the depth of the periodic structure on the mold by changing the thickness of the lower-layer resist.

Further, if the upper-layer resist having a pattern imprinted thereto and having oxygen resistance is used as an etching mask, and each condition of oxygen plasma treatment is changed during oxygen plasma etching of the organic lower-layer resist so as to change the oxygen plasma condition in forming a mask of the upper-layer resist for the lower-layer resist, for example, it becomes possible to adjust the size of a pattern to be imprinted by about 30% the diameter of the periodic structure on the mold.

When such a method is used, it is possible to reproduce a fine periodic structure on an object to be processed accurately, correctly, and in a controllable state using the nanoimprint lithography method.

Hereinafter, examples of more specific steps will be described in detail with reference to the drawings. In order to obtain high light extraction efficiency, it is necessary to form a pattern on the order of nm as computed.

FIG. 30 are views illustrating exemplary steps of producing a periodic structure in accordance with this embodiment.

In a method for producing a photonic crystal periodic structure and the like in a deep ultraviolet LED in accordance with this embodiment, an imprinting technique based on a nanoimprint lithography method using bi-layer resist, which has both the features of fluidity and etch selectivity, is used. Using the technique, a photonic crystal periodic structure with a fine pattern on the order of nm, for example, was imprinted to a sapphire substrate. Hereinafter, description will be made with reference to FIG. 30.

First, as illustrated in FIG. 30, a mold for correctly reproducing a periodic structure optimized in each embodiment onto a sapphire substrate is created. For the mold, a resin mold can also be used as illustrated in FIG. 30(b) so that it can follow warp of a substrate 81.

Next, organic lower-layer resist 83 with high etch selectivity is formed on the sapphire substrate 81 to a thickness of g through spin coating. It should be noted that the thickness g is selectively determined in accordance with the etch selectivity of the lower-layer resist 83 with respect to the sapphire substrate 81. After that, silicon-containing upper-layer resist 85 with fluidity and oxygen resistance performance is formed on the surface of the lower-layer resist 83 to a predetermined thickness through spin coating (FIG. 30(a)).

Next, patterns of the mold 87 and 89 are imprinted to the upper-layer resist 85 using a nanoimprinting system (FIG. 30(b)).

Next, the upper-layer resist 85, which has the patterns 87 and 89 of the mold imprinted thereto, is exposed to oxygen plasma so that oxygen resistance is imparted thereto and the residual film of the upper-layer resist remaining after the nanoimprinting is removed (FIG. 30(c)). Accordingly, an upper-layer resist pattern 85a is formed.

Next, the organic lower-layer resist 83 is etched with oxygen plasma using the upper-layer resist pattern 85a with oxygen resistance as a mask so that a pattern mask 85b for dry-etching the sapphire substrate 81 is formed (FIG. 30(d)). It should be noted that the diameter $d_1$ of the pattern mask on the sapphire substrate 81 side illustrated in FIG. 30(e) can be finely adjusted within the range of about 30% of $d_1$ if the oxygen plasma condition is adjusted.

Next, the sapphire substrate 81 is dry-etched with ICP plasma via the pattern mask so that a periodic structure 81a optimized in accordance with each embodiment of the present invention can be formed on the sapphire substrate 81 (FIG. 30(e)).

If the periodic structure is a pillar structure, the shape after the etching becomes a trapezoidal shape that roughly satisfies $d_1 < d_2$ as illustrated in FIG. 30(f), and the angle of each sidewall depends on the etch selectivity of the organic lower-layer resist. It should be noted that if the thickness g of the organic lower-layer resist is changed, the depth of the photonic crystal periodic structure that is formed on the sapphire substrate 81a after dry etching can be easily made about 1.5 times the depth of the mold.

In addition, if the diameter $d_1$ is changed during formation of the pattern mask instead of creating a new mold again, the diameter of the periodic structure can be easily changed by about 30%. Therefore, the time for producing the mold can be saved, which in turn contributes to reducing the cost therefor or advantageously reducing the cost for producing a semiconductor light emitting element.

Figure 31:
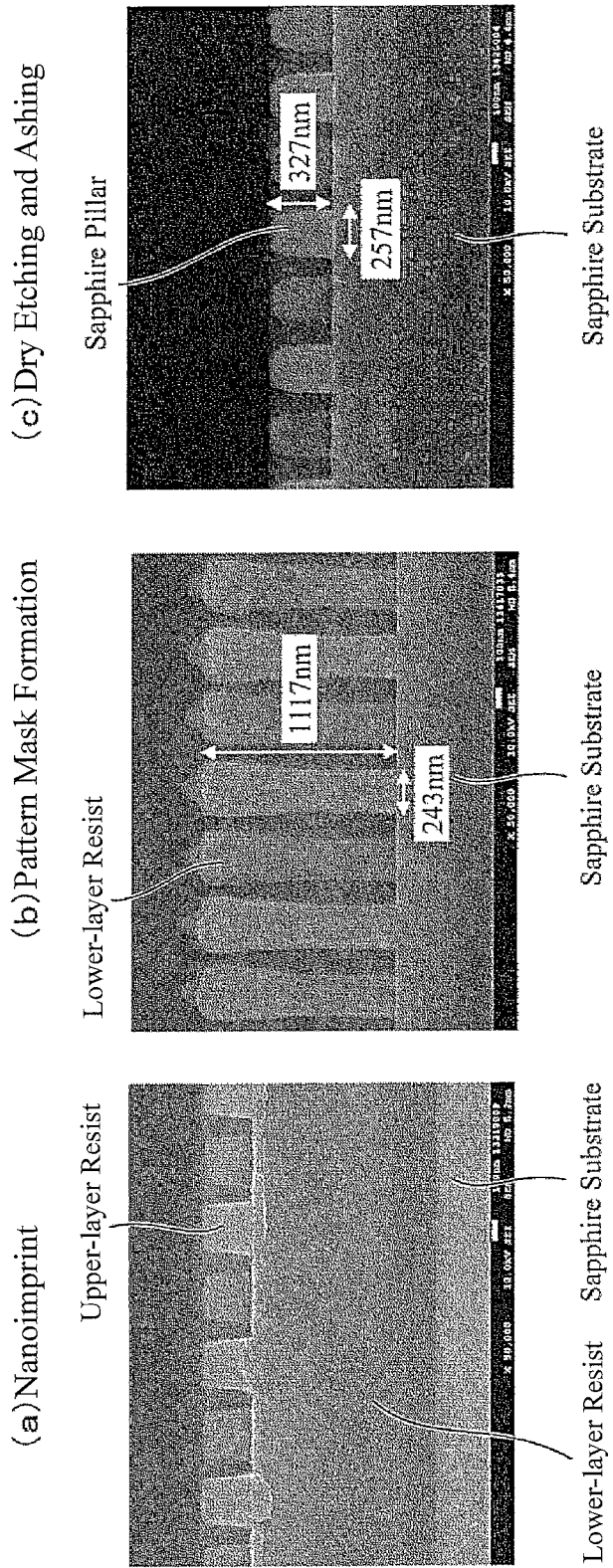
FIG. 31 are actual SEM photographs when the steps of FIG. 30 are performed.

FIGS. 31(a) to 31(c) illustrate the actual SEM photographs (nanoimprint-process phC pillar cross-sectional SEM) as "nanoimprint," "pattern mask formation," and "dry etching/ashing" taken when the steps in FIGS. 30(b), 30(e), and 30(f) were performed, respectively. In this manner, a fine periodic structure can be produced.

According to each of the aforementioned embodiments, the LEE of a deep ultraviolet LED can be further enhanced, and thus, higher WPE can be achieved.

Twelfth Embodiment

Figure 32A:
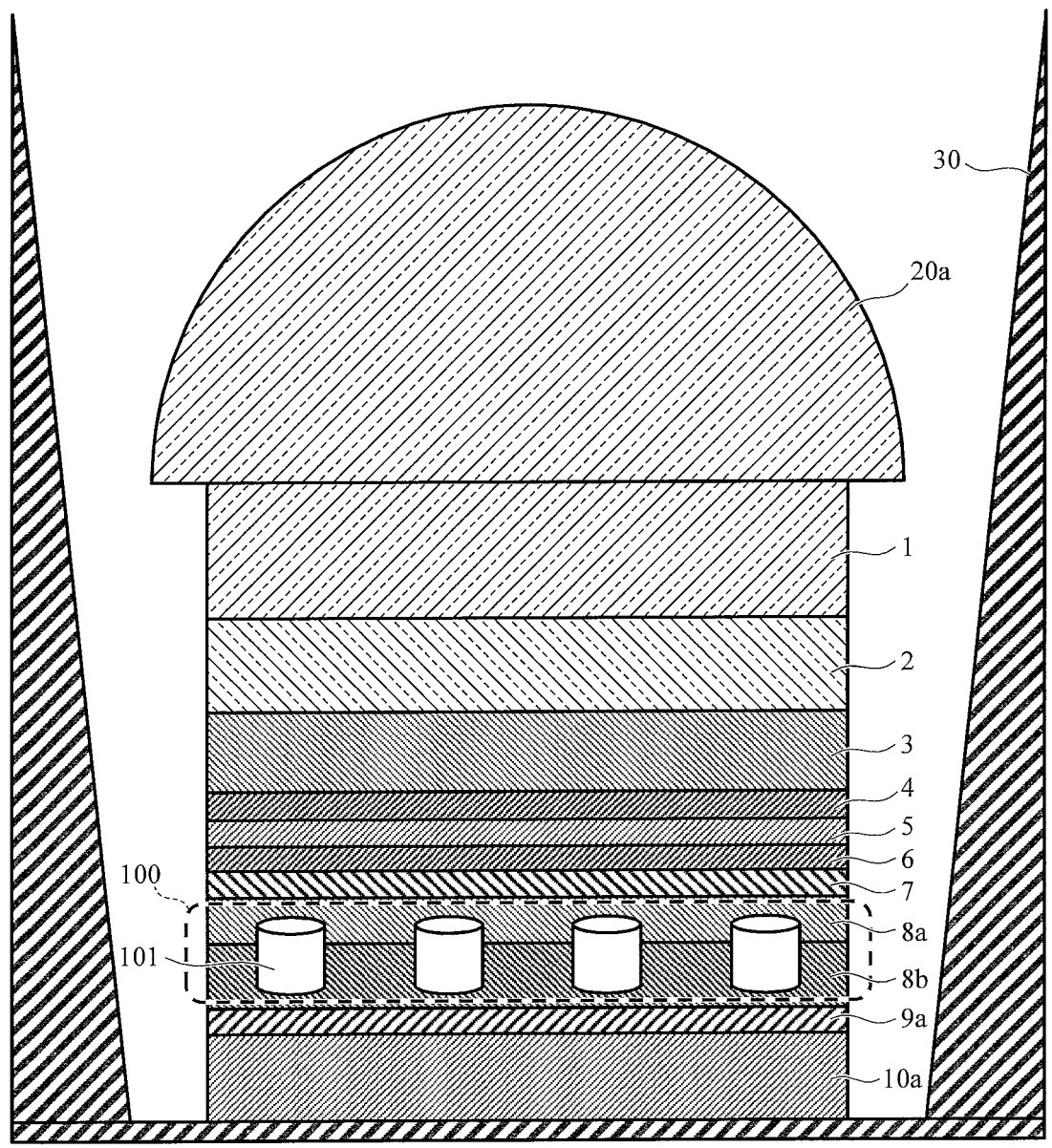
FIG. 32A is a cross-sectional view illustrating an exemplary configuration of a deep ultraviolet LED with an integrated photonic effect in accordance with the twelfth embodiment of the present invention.

FIG. 32A illustrates the structure of a deep ultraviolet LED with an integrated photonic effect as an example of a deep ultraviolet LED in accordance with the twelfth embodiment of the present invention. As illustrated in FIG. 32A, the AlGaN-based deep ultraviolet LED in accordance with this embodiment includes a sapphire lens 20a, a sapphire substrate 1, an AlN buffer layer 2, an n-AlGaN layer 3, a barrier layer 4, a quantum well layer 5, a barrier layer 6, a multi-quantum barrier layer (an electron blocking layer) 7, a p-AlGaN layer 8a, a p-GaN contact layer 8b, an Ni layer 9a, an Au reflecting electrode 10a, a photonic crystal periodic structure 100, and photonic crystals (voids, holes) 101.

The deep ultraviolet LED is characterized by having the Au reflecting electrode 10a, the Ni layer 9a, the p-GaN contact layer 8b, and the p-AlGaN layer 8a, which is transparent to light with the design wavelength λ, that are arranged in this order from a side opposite to the sapphire substrate 1, and having the photonic crystal periodic structure 100 with a photonic band gap (PBG) provided in the range of the thickness direction including at least the interface between the p-GaN contact layer 8b and the p-AlGaN layer 8a such that the photonic crystal periodic structure 100 does not extend beyond the p-AlGaN layer 8a in the direction of the sapphire substrate 1, and also having bonded to the rear surface of the sapphire substrate the hemispherical sapphire lens 20a that is transparent to light with the wavelength and has a radius of about equal to the radius of a circumscribed circle of the sapphire substrate 1. That is, the refractive indices of the substrate and the lens are the same. In addition, this structure is an LED structure mounted on a surface-mounted package.

Figure 32B:
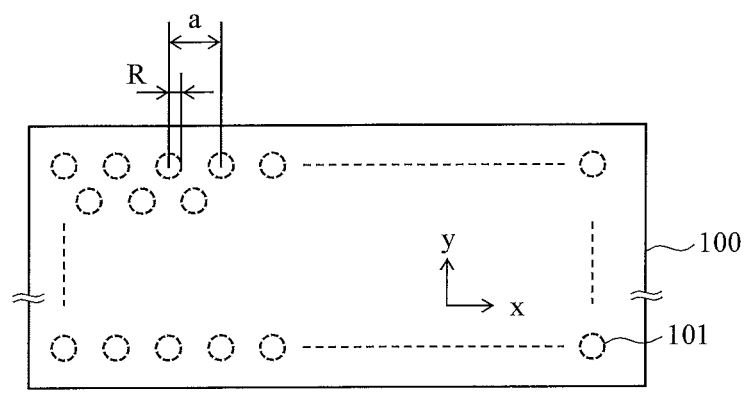
FIG. 32B is a plan view of the photonic crystal periodic structure illustrated in FIG. 32A.

As illustrated as an xy plan view in FIG. 32B, the reflecting photonic crystal periodic structure 100 has a hole structure in which voids 101 each having an cylindrical shape, for example, having a lower refractive index than those of the p-AlGaN layer and the p-GaN contact layer, such as the air, and having a circular cross-section with a radius R are formed in a triangular lattice pattern with a period of a along the x-direction and the y-direction. The voids 101 are structures that do not reach the interface with the multi-quantum barrier layer 7 due to dry etching, and the distance G of from end faces of the voids 101 in the direction of the substrate to the quantum well layer 5 is in the range of 50 to 70 nm. Further, the depth h of the reflecting photonic crystal periodic structure 100 is in the range of 40 to 60 nm.

In the aforementioned structure, TE polarization and TM polarization of deep ultraviolet light with the wavelength λ, emitted from the quantum well layer 5 are radiated in all directions and propagate through the medium while being elliptically polarized. The photonic crystal periodic structure 100 provided around the quantum well layer 5 is formed as two structures, which include the p-AlGaN layer 8a and the air, having different refractive indices on an end face. Provided that the ratio of the radius R of each void to the period a is R/a=0.4, the filling factor f of the photonic crystals is computed by the following formula: $f=2\pi/3^{0.5} \times (R/a)^2 = 0.58$.

In addition, from the refractive index of the air: $n_1=1.0$, the refractive index of p-AlGaN: $n_2=2.583$, and f=0.58, the equivalent refractive index $n_{eff}$ is computed by the following formula: $n_{eff}=(n_2^2+(n_1-n_2)^2 \times f)^{0.5}=1.838$.

Figure 33A:
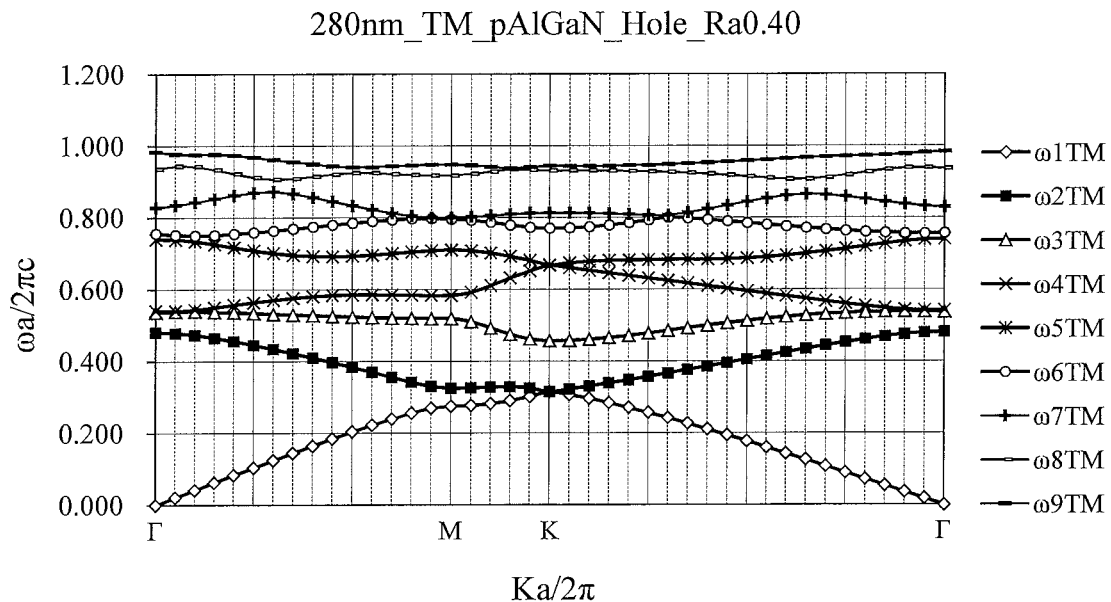
FIG. 33A is a view illustrating a photonic band structure for TM polarization.
Figure 33B:
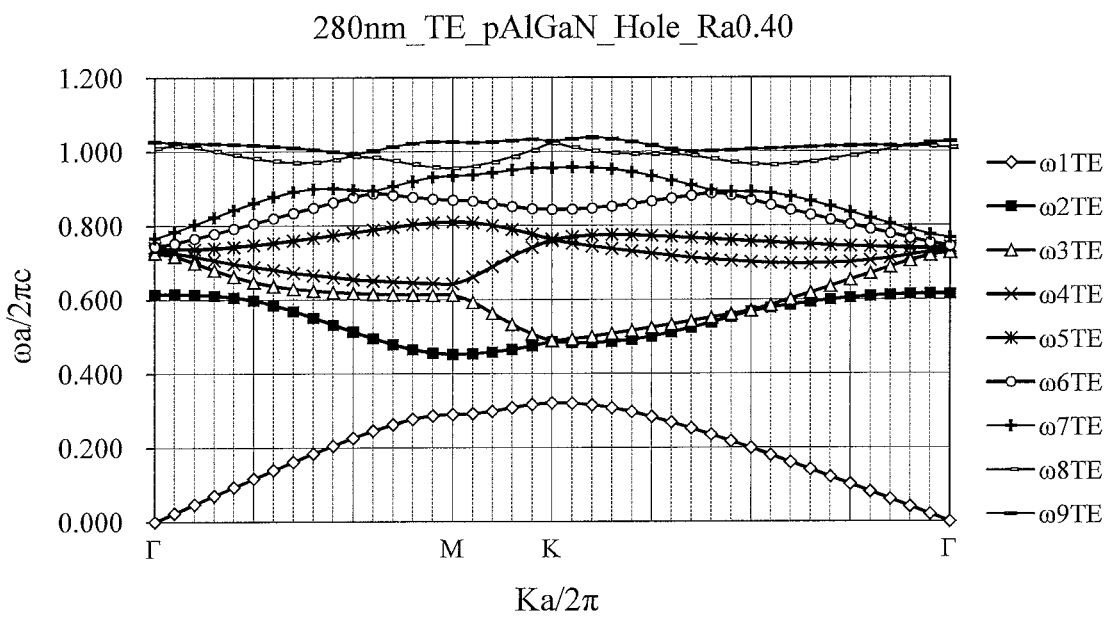
FIG. 33B is a view illustrating a photonic band structure for TE polarization.

Determining the photonic band structure for TM polarization and TE polarization of such a photonic crystal periodic structure using the plane wave expansion method can obtain FIGS. 33A and 33B.

As illustrated in FIG. 33A, a photonic band gap (PBG) for TM polarization was not observed, while as illustrated in FIG. 33B, a large PBG for TE polarization was observed between a first photonic band (ω1TE) and a second photonic band (ω2TE).

It should be noted that R/a=0.4 is a value adopted from the principle that "the magnitude of R/a, the size of a PBG, and the rate of change of the light extraction efficiency are all proportional with one another" invented by the inventors and described in the international application No. PCT/JP2015/071453.

Herein, provided that the light emission wavelength λ=280 nm, R/a=0.4, and the order m=4, the period a of the photonic crystals that satisfy the Bragg scattering condition ($m\lambda/n_{eff}=2a$, where $n_{eff}$ is the equivalent refractive index, a is the period, and m is the order) is computed as $a=1/2 \times m\lambda/n_{eff}=1/2 \times 4 \times 280/1.838=305$ nm. In addition, from R/a=0.4, the diameter (2R) of each photonic crystal becomes 244 nm.

In this embodiment, as the positions of end faces of the photonic crystals on the sapphire substrate side are set closer to the quantum well layer, it becomes unnecessary to set the depths of the photonic crystals to 305 nm that is equal to the period a (for example, a=305 nm). Therefore, a greater reflection effect can be obtained even when the depths of the photonic crystals are as small as about 60 nm. In addition, the possible range of the order m can be increased to 1≤m≤5. It should be noted that the smaller the order, the smaller the period a.

Herein, a computation model was actually created and the rate of change of the light extraction efficiency was analyzed using the FDTD method so as to verify the integrated photonic effect of the photonic crystal periodic structure and the bonded sapphire lens. As the depths of the photonic crystals (PhC Depths), three points including 40 nm, 50 nm, and 60 nm were set, and as the distance G of from the quantum well layer to end faces of the photonic crystals (Gap to Quantum Well), three points including 50 nm, 60 nm, and 70 nm were selected so that the value of the rate of change of the light extraction efficiency [LEE Enhancement (%)] was determined for a total of 9 points with the variable depth h and distance G.

Figure 34:
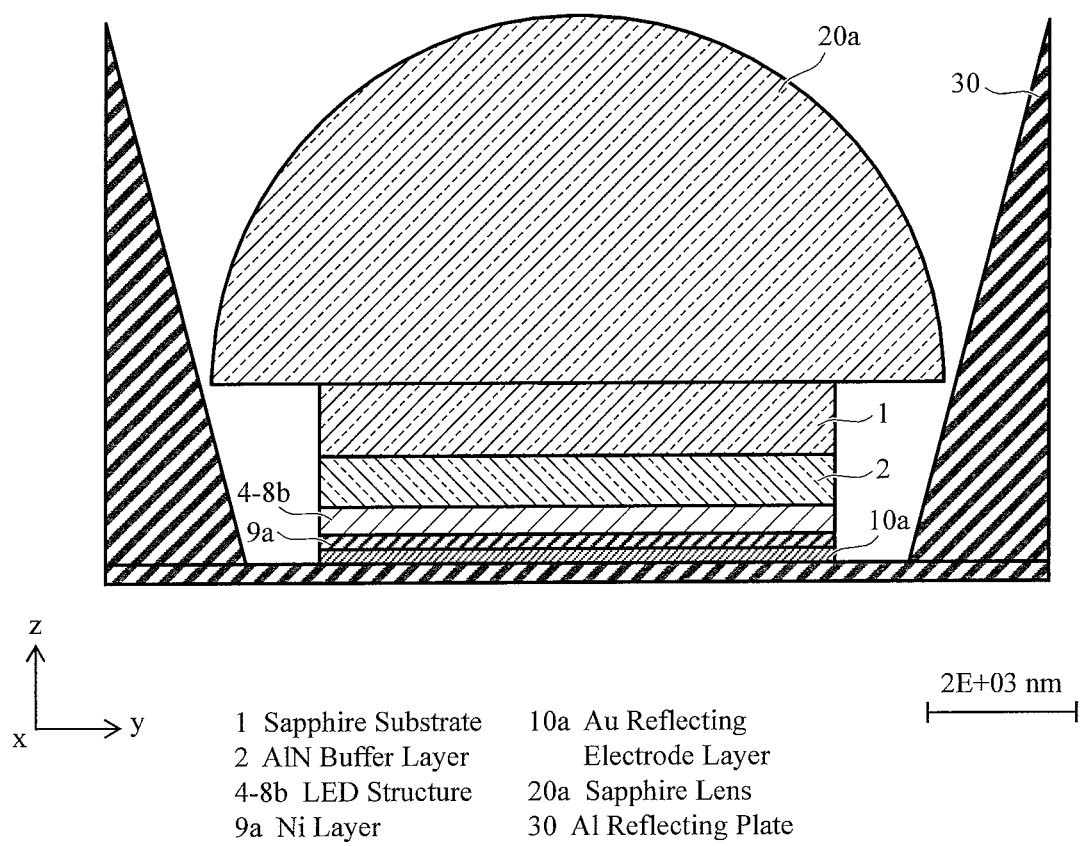
FIG. 34 is a cross-sectional view illustrating an FDTD computation model of an integrated photonic effect.
Figure 35:
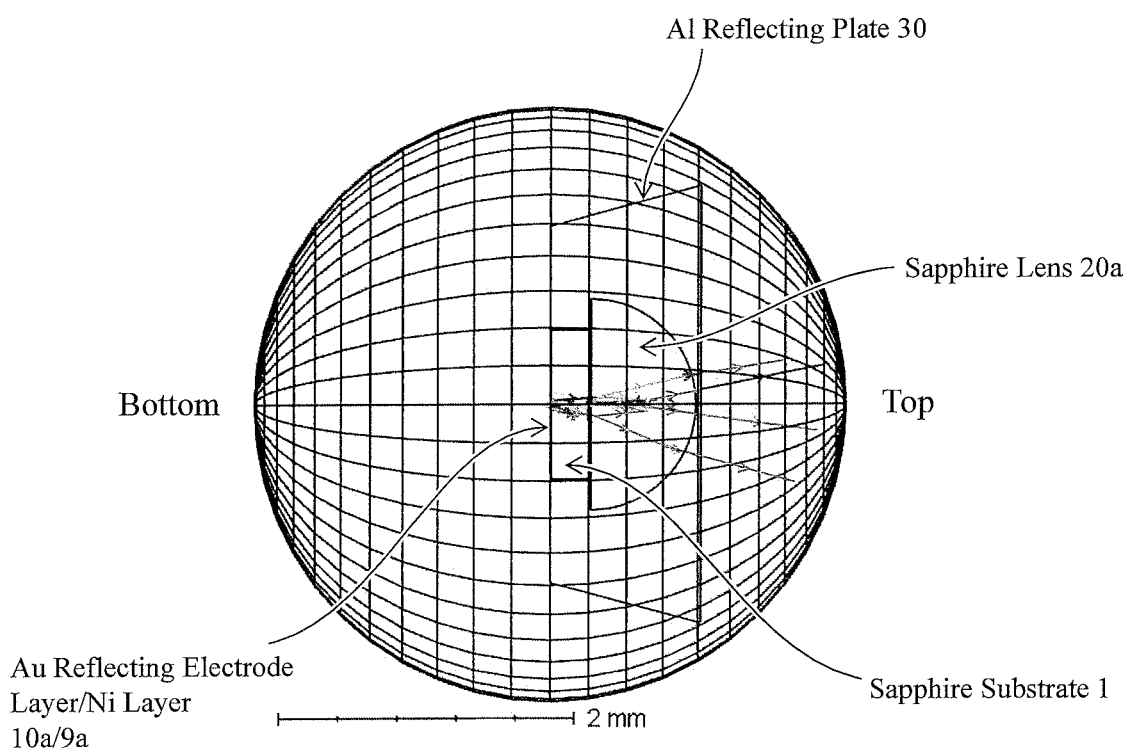
FIG. 35 is a view illustrating a computation model of a flat-structure LED for the ray-tracing method.

FIG. 34 illustrates an FDTD computation model of an integrated photonic effect, and Table 8 illustrates detailed parameters therefor. In addition, in order to determine the light extraction efficiency [LEE(%)], FIG. 35 illustrates a computation model of a flat-structure LED without photonic crystals for the ray-tracing method, and Table 9 illustrates detailed parameters therefor.

TABLE 8

| Element Size: 7.01 μm☐<br>Solid Angle: 3.27 | Thickness (nm) | Refractive Index | Extinction Coefficient |
|---|---|---|---|
| Al-Sidewall Reflecting Plate | — | 0.241 | 3.357 |
| Au Reflecting Electrode Layer | 200 | 1.678 | 1.873 |
| Ni Layer | 20 | 1.681 | 2.067 |
| p-GaN Contact Layer | 150 | 2.618 | 0.42 |
| p-AlGaN Layer | 30 | 2.583 | — |
| Multi-Quantum Barrier Layer Valley | 10 | 2.583 | — |
| Multi-Quantum Barrier Layer/Block | 10 | 2.434 | — |
| Multi-Quantum Barrier Layer Valley | 10 | 2.583 | — |
| Multi-Quantum Barrier Layer/Block | 10 | 2.434 | — |
| Barrier Layer | 10 | 2.583 | — |

TABLE 8-continued

| Element Size: 7.01 μm☐<br>Solid Angle: 3.27 | Thickness (nm) | Refractive Index | Extinction Coefficient |
|---|---|---|---|
| Quantum Well Layer | 10 | 2.777 | — |
| Barrier Layer | 10 | 2.583 | — |
| n-AlGaN Layer | 300 | 2.583 | — |
| AlN Buffer Layer | 600 | 2.316 | — |
| Sapphire Substrate | 1000 | 1.820 | — |
| Sapphire Lens | 4,960 | 1.820 | — |

TABLE 9

| Element Size: 1 mm☐<br>Solid Angle: 3.27 | Thickness | Refractive Index/Extinction Coefficient |
|---|---|---|
| Radius of Sapphire Lens (Circumscribed Circle) | 710 μm | 1.82/— |
| Sapphire Substrate | 270 μm | 1.82/— |
| AlN Buffer Layer | 4 μm | 2.316/— |
| AlGaN Layer | 1.6 μm | 2.777/— |
| p-GaN Contact Layer | 150 μm | 2.618/0.42 |
| Reflectivity of Au Reflecting Electrode Layer/Ni Layer: 30% | — | — |
| Reflectivity of Al-Sidewall Reflecting Plate: 90% | — | — |

TABLE 10

| Flat | | m4_G50 nm_h40 nm | | | m4_G50 nm_h50 nm | | | m4_G50 nm_h60 nm | | |
|---|---|---|---|---|---|---|---|---|---|---|
| Power(w) | LEE % | Power(w) | Enhanced | LEE % | Power(w) | Enhanced | LEE % | Power(w) | Enhanced | LEE % |
| 1.40E-16 | 12.7% | 2.31E-16 | 65% | 20.9% | 2.54E-16 | 82% | 23.1% | 2.72E-16 | 94% | 24.7% |

| Flat | | m4_G60 nm_h40 nm | | | m4_G60 nm_h50 nm | | | m4_G60 nm_h60 nm | | |
|---|---|---|---|---|---|---|---|---|---|---|
| Power(w) | LEE % | Power(w) | Enhanced | LEE % | Power(w) | Enhanced | LEE % | Power(w) | Enhanced | LEE % |
| 1.40E-16 | 12.7% | 2.72E-16 | 94% | 24.7% | 2.92E-16 | 109% | 26.5% | 3.05E-16 | 118% | 27.7% |

| Flat | | m4_G70 nm_h40 nm | | | m4_G70 nm_h50 nm | | | m4_G70 nm_h60 nm | | |
|---|---|---|---|---|---|---|---|---|---|---|
| Power(w) | LEE % | Power(w) | Enhanced | LEE % | Power(w) | Enhanced | LEE % | Power(w) | Enhanced | LEE % |
| 1.40E-16 | 12.7% | 2.54E-16 | 81% | 23.0% | 2.65E-16 | 89% | 24.0% | 2.7E-16 | 93% | 24.5% |

Figure 36A:
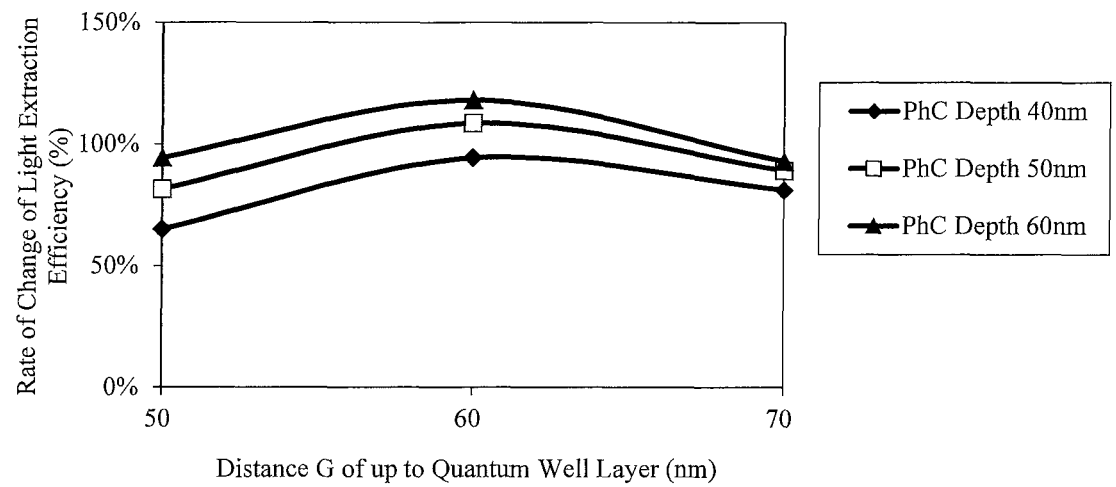
FIG. 36A is a graph illustrating the dependence of the integrated photonic effect (the rate of change of the light extraction efficiency) on the distance of up to a quantum well layer.
Figure 36B:
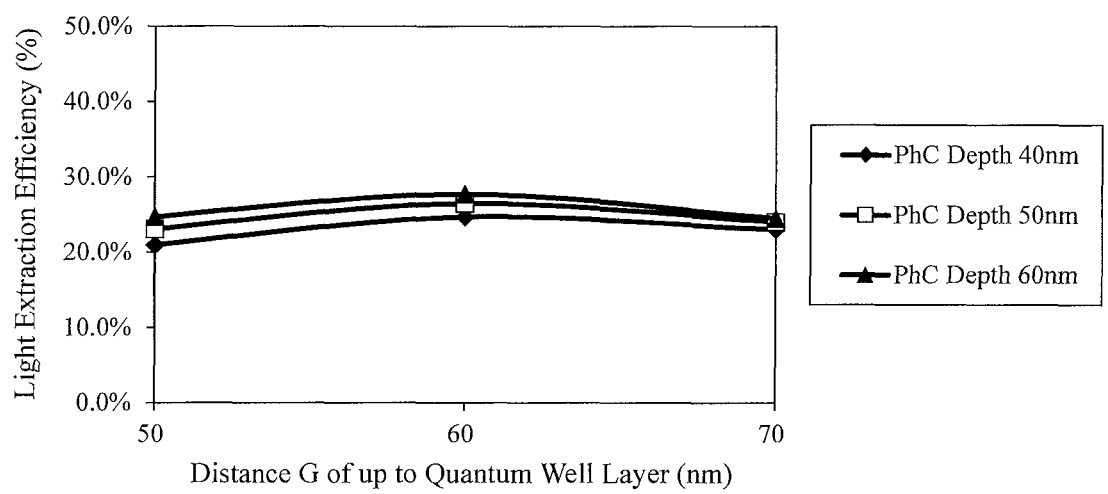
FIG. 36B is a graph illustrating the dependence of the integrated photonic effect (light extraction efficiency) on the distance of up to a quantum well layer.
Figure 36C:
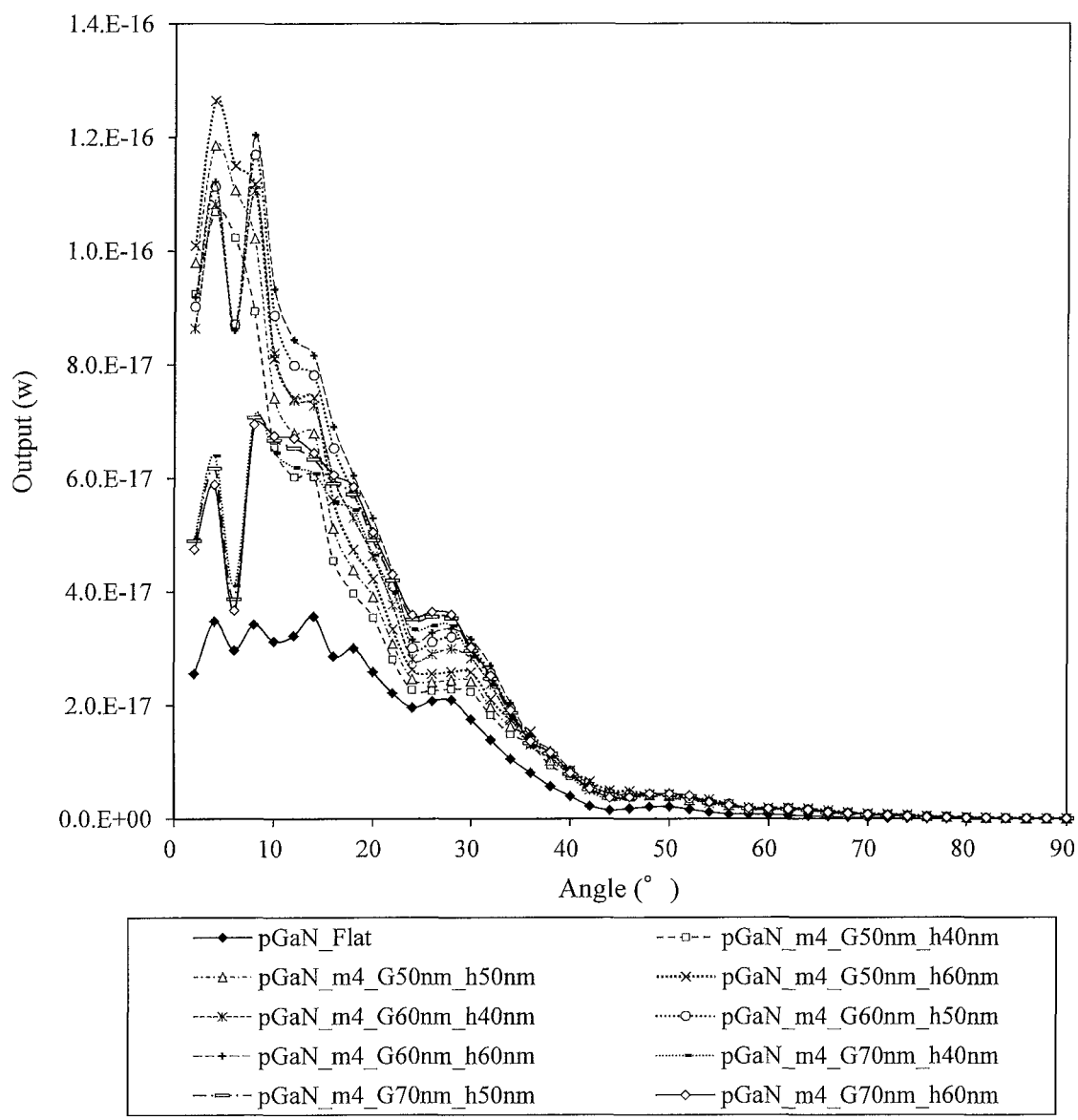
FIG. 36C is a graph illustrating the integrated photonic effect, which shows a radiation pattern.

Table 10 illustrates a list of the analysis results of the integrated photonic effect, FIG. 36A illustrates a graph of the LEE Enhancement (the rate of change of the light extraction efficiency) of the integrated photonic effect, FIG. 36B illustrates a graph of the LEE (light extraction efficiency), and FIG. 36C is a radiation pattern graph of the integrated photonic effect.

First of all, the light extraction efficiency obtained with the ray-tracing method was 12.7%.

It should be noted that the aforementioned results were obtained by computing the value of the light extraction efficiency of the ray-tracing method and the value of the rate of change of the light extraction efficiency of the FDTD method in Table 10 as follows as with the computation method described in the previous embodiment.

1) "Enhanced" (the rate of change) of the LED having photonic crystals at m4_G60 nm_h60 nm compared to that of the flat-structure LED: 118%.

2) The light extraction efficiency of the flat-structure LED determined using the ray-tracing method: 12.7%.

Therefore, the light extraction efficiency of the LED having photonic crystals at m4_G60 nm_h60 nm is determined as 12.7%×2.18 times=27.7%, and thus, a sufficient integrated photonic effect can be obtained.

In addition, as is obvious from the graphs of FIGS. 36A and 36B, it is understood that the p-AlGaN layer includes a point at which the maximum value of the light extraction efficiency as well as the maximum value of the rate of change thereof is obtained in a region in which the distance G of from end faces of the photonic crystals in the direction of the substrate to the quantum well layer is 50 to 70 nm and the depths h of the photonic crystals are 40 to 60 nm (G=60 nm in the present analysis conditions).

Further, it is also found from the radiation pattern graph in FIG. 36C that at the point (G=60 nm) where the maximum value is obtained, the axial strength of the photonic crystals with each of the depths is greater than that of the flat-structure LED.

The processes and control can be implemented through software processing by means of a CPU (Central Processing Unit) or a GPU (Graphics Processing Unit) or through hardware processing by means of an ASIC (Application Specific Integrated Circuit) or an FPGA (Field Programmable Gate Array).

In the aforementioned embodiments, the configurations and the like that are illustrated in the accompanying drawings are not limited thereto, and can be changed as appropriate within the range that the advantageous effects of the present invention can be exerted. Further, the configurations and the like can be changed as appropriate for implementation of the present invention within the spirit and scope of the present invention.

In addition, each component of the present invention can be freely selected or not selected, and an invention that includes the selected components is also included in the present invention.

Further, a process of each unit may be performed by recording a program foi implementing the functions described in the aforementioned embodiments on a computer-readable recording medium, causing a computer system to read the program recorded on the recording medium and execute it. It should be noted that the "computer system" as referred to herein includes an OS and hardware such as a peripheral device.

In addition, the "computer system" includes a website providing environment (or display environment) if the system uses a "WWW system."

In addition, the "computer-readable recording medium" refers to a storage device, such as a flexible disk, a magneto-optical disk, a portable medium like ROM or CD-ROM, and a hard disk incorporated in a computer system. Further, the "computer-readable recording medium" includes a medium that dynamically holds a program for a short period of time like a communication line used to transmit a program via a network like the Internet or a communication line like a telephone line, and a medium that holds a program for a given period of time like volatile memory in a computer system that serves as a sever or a client in the aforementioned case. Further, the program may be the one for implementing some of the aforementioned functions, or the one that can implement the aforementioned functions in combination with a program that is already recorded on the computer system. At least some of the functions may be implemented by hardware such as an integrated circuit.

All publications, patents, and patent applications cited in this specification are all incorporated by reference into this specification.

INDUSTRIAL APPLICABILITY

The present invention is applicable to deep ultraviolet LEDs.

REFERENCE SIGNS LIST a Period of photonic crystal periodic structure
R Radius of periodic structure
h Depth of periodic structure formed
1 Sapphire substrate
2, 2a AlN buffer layer
3 n-AlGaN layer
4 Barrier layer
5 Quantum well layer (active layer)
6 Barrier layer
7 Electron blocking layer
8 Transparent p-AlGaN contact layer
8a p-AlGaN layer
8b p-GaN contact layer
9 Ultrathin Ni layer
9a Ni layer
10 Al reflecting electrode layer
10a Au reflecting electrode layer
20a Sapphire lens
20b Quartz glass lens
100 Photonic crystal periodic structure
101 Structure of photonic crystals (circular voids (columnar structures (holes))
200 PSS-derived AlN connected-pillar periodic structure
201 PSS
202 AlN connected pillars

The invention claimed is:

1. A method for manufacturing a deep ultraviolet LED with a design wavelength $\lambda$ (200 to 350 nm), comprising:
preparing a stacked structure including a reflecting electrode layer, a metal layer, a p-GaN contact layer, a p-AlGaN layer, an electron blocking layer, a barrier layer, a quantum well layer, a second barrier layer, a n-AlGaN layer, an AlN buffer layer, and a sapphire substrate that are arranged in this order;
preparing a mold for forming a reflecting photonic crystal periodic structure, wherein
the photonic crystal periodic structure has a plurality of air holes and is adapted to be provided in a region of a thickness direction including at least an interface between the p-GaN contact layer and the p-AlGaN layer such that the photonic crystal periodic structure does not extend beyond the p-AlGaN layer toward the substrate,
the photonic crystal periodic structure consists of air and the p-GaN contact layer and the p-AlGaN layer,
the photonic crystal periodic structure has a photonic band gap,
the photonic band gap is open for transverse electric polarized components,
the wavelength $\lambda$, a period a of the photonic crystal periodic structure, and an average refractive index $n_{av}$ of two materials forming the photonic crystal periodic structure satisfy a Bragg condition of $m\lambda/n_{av}=2a$,
the average refractive index $n_{av}$ is obtained by two materials of the air and the p-AlGaN layer, having different refractive indices, on a bottom face of the photonic crystal structure,
an order m of the Bragg condition is in a range of 2<m<5, and
a depth h of the air holes is greater than or equal to ⅔ a length of the period a;
growing crystals of the stacked structure up to the p-GaN contact layer, and imprinting a structure of the mold thereto through nanoimprinting;
sequentially dry-etching the stacked structure using ICP plasma with the bi-layer resist layer as a mask, thereby forming the photonic crystal periodic structure;
preparing a quartz hemispherical lens that is transparent to light with the wavelength $\lambda$, with a radius that is greater than or equal to a radius of a circumscribed circle of the substrate; and
bonding the hemispherical lens to a rear surface of the sapphire substrate,
wherein:
a method of the bonding is selected the group consisting of surface activated bonding (SAB), atomic diffusion bonding (ADB), bonding performed after modifying a surface with atmospheric-pressure plasma or ozone gas, and bonding performed with an adhesive that is transparent to light with the design wavelength, so that scattering and absorption of light at a bonded interface are suppressed.

\* \* \* \* \*